US009153689B2

(12) United States Patent
Maly

(10) Patent No.: US 9,153,689 B2
(45) Date of Patent: Oct. 6, 2015

(54) INTEGRATED CIRCUIT DEVICE, SYSTEM, AND METHOD OF FABRICATION

(75) Inventor: Wojciech P. Maly, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 624 days.

(21) Appl. No.: 13/323,993

(22) Filed: Dec. 13, 2011

(65) Prior Publication Data

US 2012/0112325 A1 May 10, 2012

Related U.S. Application Data

(62) Division of application No. 12/300,753, filed as application No. PCT/US2007/011630 on May 15, 2007, now abandoned.

(60) Provisional application No. 60/800,570, filed on May 15, 2006.

(51) Int. Cl.
| | |
|---|---|
| H01L 29/06 | (2006.01) |
| H01L 29/78 | (2006.01) |
| H01L 27/12 | (2006.01) |
| H01L 29/66 | (2006.01) |
| H01L 29/788 | (2006.01) |

(52) U.S. Cl.
CPC ........ *H01L 29/7831* (2013.01); *H01L 27/1203* (2013.01); *H01L 29/0692* (2013.01); *H01L 29/66795* (2013.01); *H01L 29/66825* (2013.01); *H01L 29/785* (2013.01); *H01L 29/7881* (2013.01)

(58) Field of Classification Search
CPC .................................................. H01L 27/1203
USPC ........................................... 257/622, E29.022
See application file for complete search history.

(56) References Cited

U.S. PATENT DOCUMENTS

| | | | |
|---|---|---|---|
| 4,996,574 A * | 2/1991 | Shirasaki | ........................ 257/66 |
| 6,611,029 B1 | 8/2003 | Ahmed et al. | |
| 7,098,477 B2 | 8/2006 | Zhu et al. | |
| 2005/0145938 A1* | 7/2005 | Lin | ................ 257/347 |
| 2005/0224800 A1 | 10/2005 | Lindert et al. | |
| 2005/0253193 A1 | 11/2005 | Chen et al. | |
| 2006/0202266 A1* | 9/2006 | Radosavljevic et al. ...... 257/344 | |
| 2007/0029623 A1* | 2/2007 | Liu et al. ....................... 257/401 | |
| 2007/0114565 A1 | 5/2007 | Makaram | |

* cited by examiner

*Primary Examiner* — Vongsavanh Sengdara
(74) *Attorney, Agent, or Firm* — Fox Rothschild LLC; Dennis M. Carleton

(57) ABSTRACT

A semiconductor device (10), comprising a first semiconductor portion (32) having a first end (34), a second end (36), and a slit portion (30), wherein the width of the slit portion (30) is less than the width of at least one of the first end (34) and the second end (36); a second portion (38) that is a different material than the first semiconductor portion (32), a third portion (40) that is a different material than the first semiconductor portion (32), wherein the second (38) and third (40) portions are on opposite sides of the slit portion (30), and at least three terminals selected from a group consisting of a first terminal (12) connected to the first end (34), a second terminal (14) connected to the second end (36), a third terminal (16) connected to the second portion (38), and a fourth terminal (17) connected to the third portion (40).

14 Claims, 86 Drawing Sheets

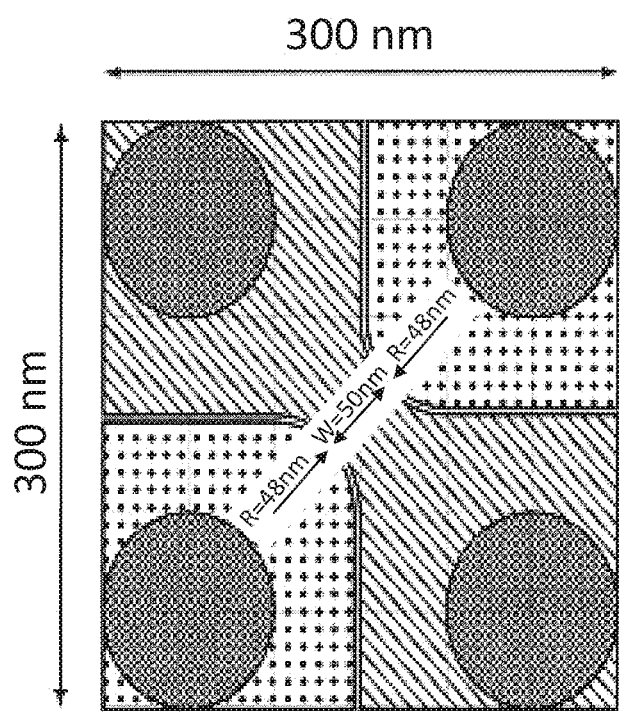
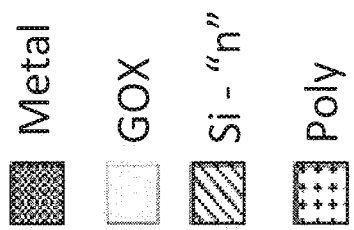
Fig. 10

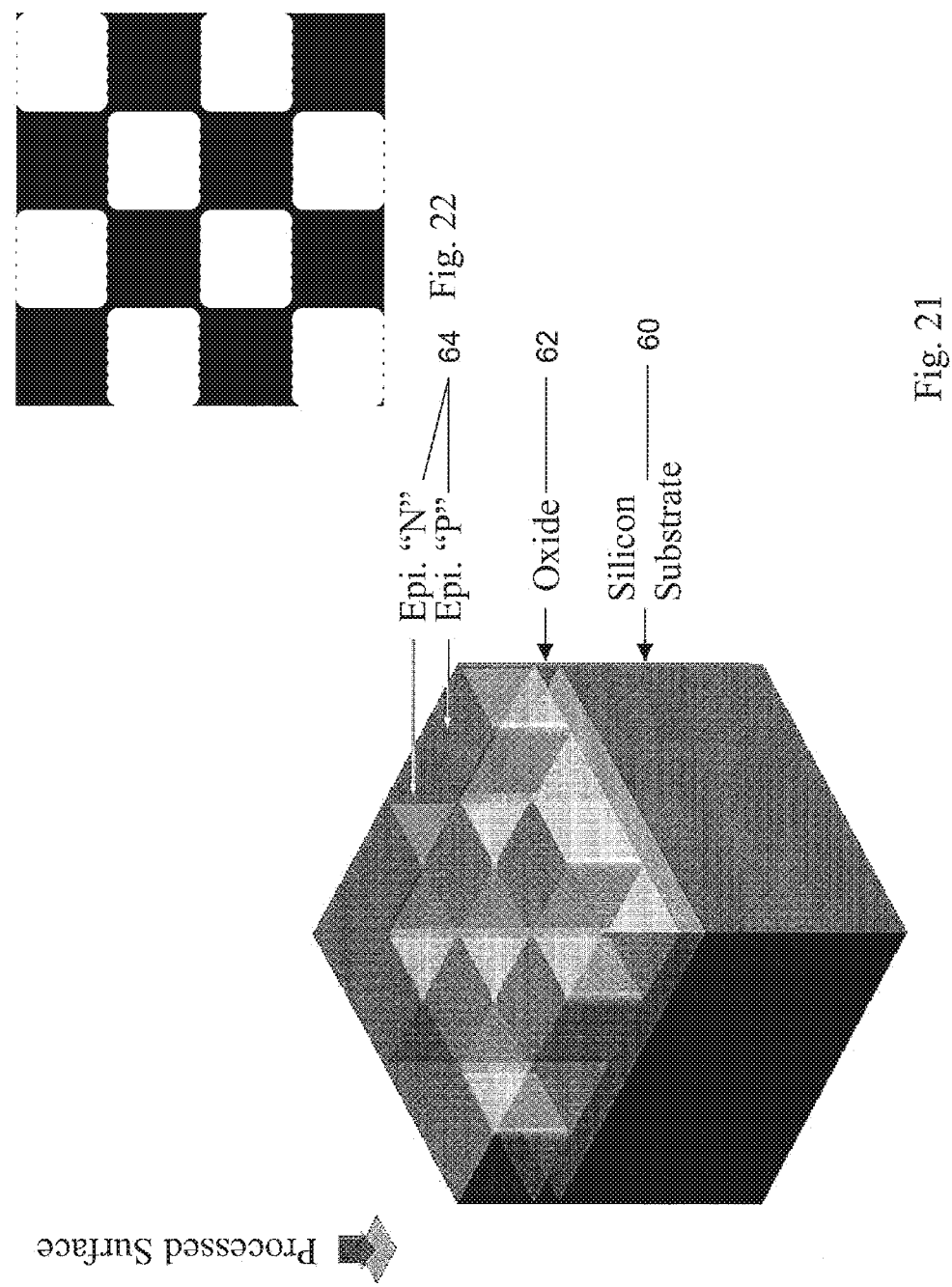

Poly —— 68
Epi. "N"
Epi. "P" —— 64
Oxide —— 62
Silicon Substrate —— 60

Processed Surface ➡

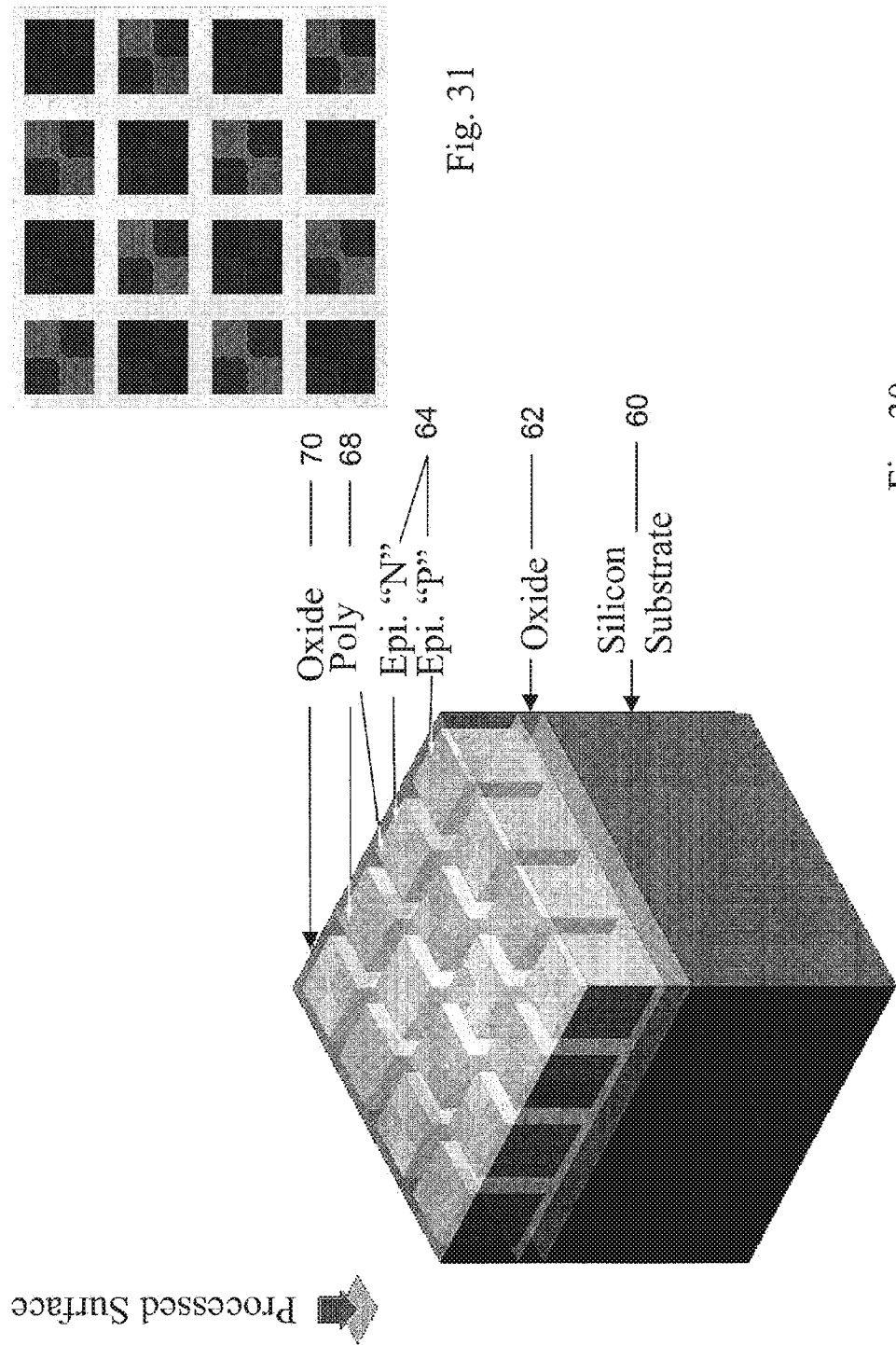

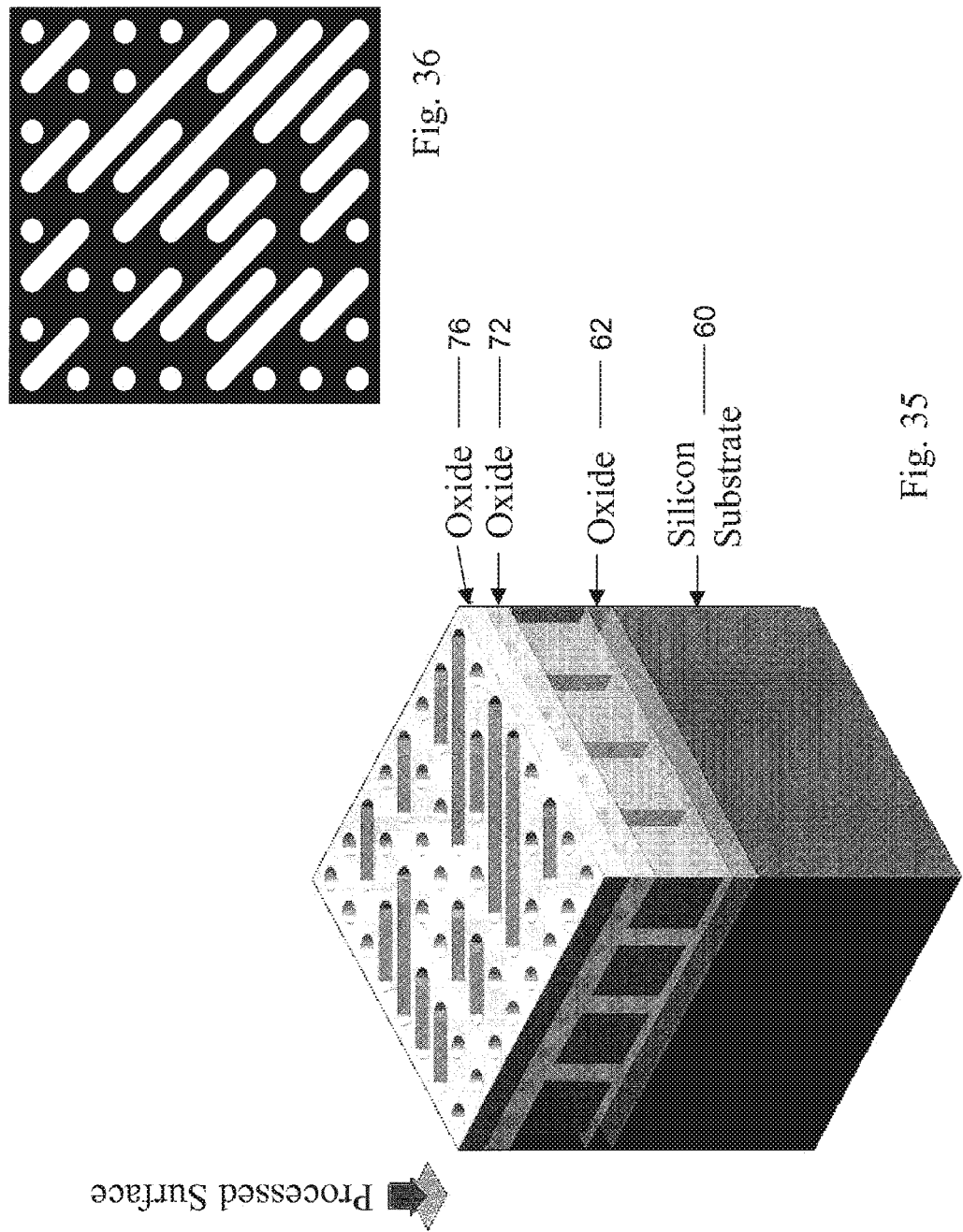

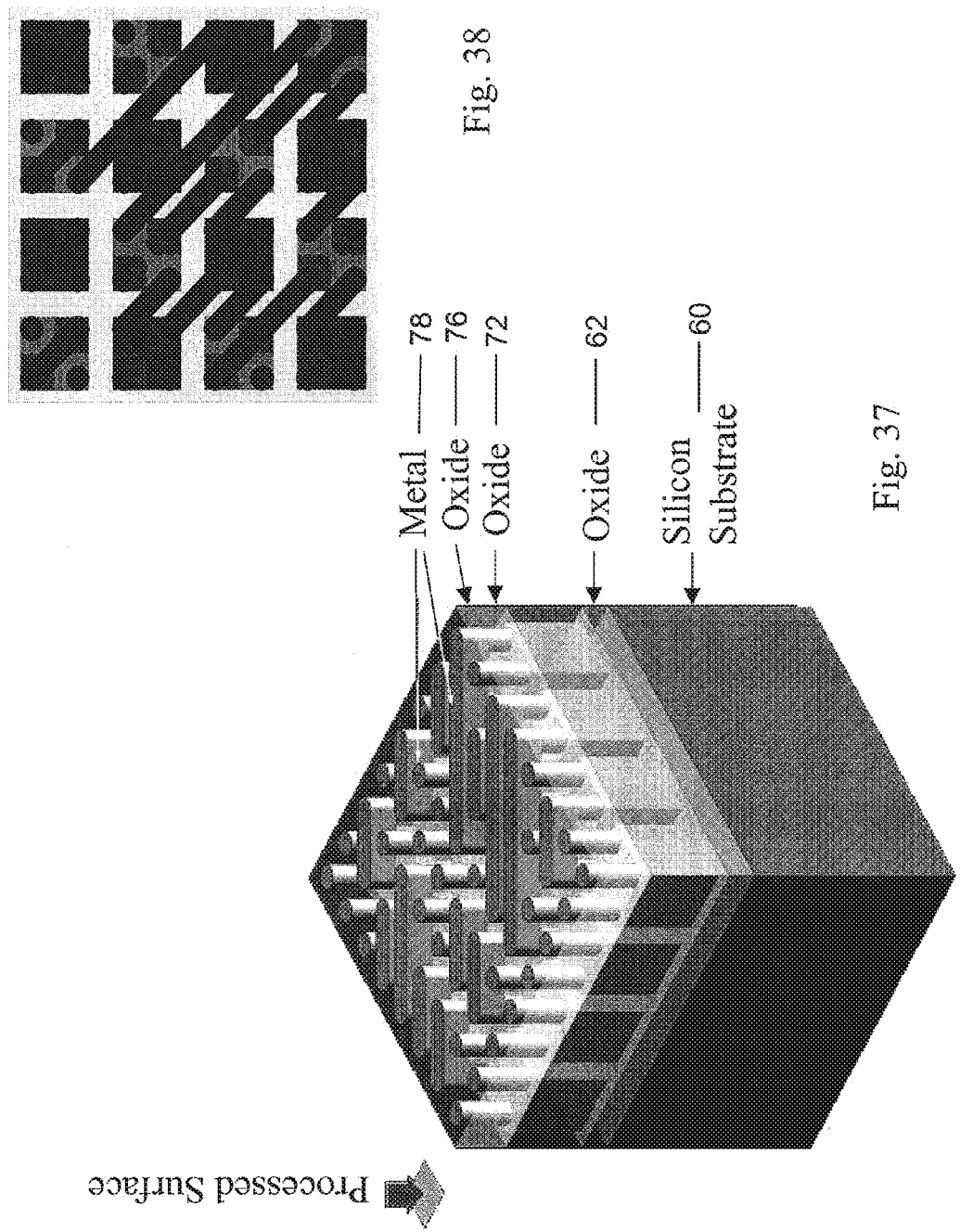

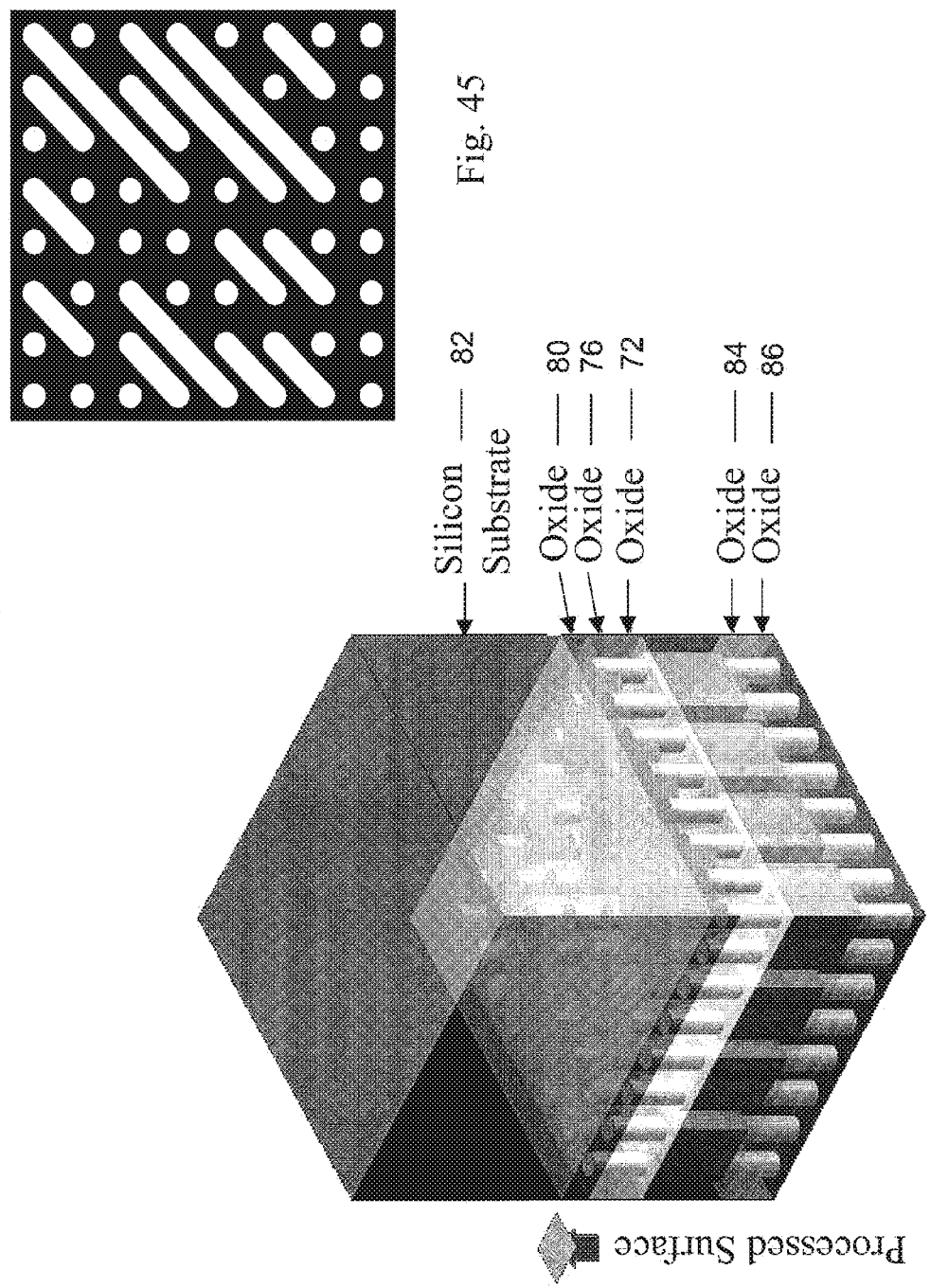

INTEGRATED CIRCUIT DEVICE, SYSTEM, AND METHOD OF FABRICATION

FIELD OF THE INVENTION

The present invention is directed generally to integrated circuits and, more specifically, to methods of fabricating integrated circuits, devices and systems for fabricating integrated circuits and other devices and systems, and devices and systems which are formed by, or which utilize, components or other parts which are formed by or in accordance with the present invention.

BACKGROUND OF THE INVENTION

The fabrication of integrated circuits is typically done by building successive layers on top of each other. These layers are built on or in an underlying substrate, such as single crystal silicon or an electrical insulator. When the substrate is an electrical insulator, such as sapphire, the fabrication techniques and resulting devices are often referred to as "silicon on insulator" or "semiconductor on insulator", which are collectively called "SOI".

Many process steps are typically involved in semiconductor fabrication including deposition, oxidation, planarization, etching, diffusion, implantation, and lithography. Lithography is used to form a desired pattern onto a surface. Conventional lithography typically uses a mask and photosensitive material known as "photoresist" to create the desired pattern. These fabrication techniques, however, have many variations and have applications in fields other than semiconductors. For example, lithography may be used in many different ways, such as with or without photoresist, with or without masks, and in fabricating technologies such as semiconductors, liquid crystal displays, micro-electromechanical systems, and others.

The continuous and significant advances in the semiconductor industry have been due, in part, to many technical advances, such as improved lenses, improved photoresist materials, improved chemical-mechanical polishing, and others. In the field of lithography, for example, advances have been made with the use of increasingly shorter wavelengths in the lithographic process. In general, shorter wavelengths provide better resolution but are more expensive to implement and they create other problems. Furthermore, physical limitations are presenting problems for the continued reduction in wavelengths in lithography.

Several solutions are being investigated for continued performance advances in semiconductor fabrication, such as electron projection lithography, immersion lithography, and extreme ultraviolet lithography. However, the proposed solutions require significant advances in technology, such as light sources, resist materials, masks, and process controls. Furthermore, the costs of lithography and other fabrication processes and tools have increased dramatically, and the research and development required for significant advances in various technologies will add to the costs.

There are also other problems with prior art integrated circuit technology. For example, the design processes, the lithographic masks, and the lithographic processes involved in prior art integrated circuit design and fabrication are complex and expensive. In addition, the utilization of integrated circuit area by active devices is relatively low. As a result, prior art integrated circuit designs and processes are expensive and result in inefficient utilization of resources.

A specific example of shortcomings in the prior art can be seen in conventional flash memory devices. Those devices suffer a significant voltage drop between the controlling gate and the bulk semiconductor region as a result of charge in the charge storage gate that represents the memory value. This problem is due to the stacking of a controlling gate and a charge storage gate in series with each other and above the bulk semiconductor region. In addition, conventional flash memory devices typically use an oxide-nitride-oxide ("ONO") layer between the controlling gate and the charge storage gate. The ONO layer is difficult to fabricate because it is between two polysilicon layers that form the controlling and charge storage gates. Finally, this structure of conventional flash memory devices also suffers from difficulties in the charging and discharging of the device. In particular, the voltage drop from the controlling gate through the stored charge is significant and requires higher controlling gate voltages to affect the channel in the bulk semiconductor region.

Accordingly, there is a need for improved integrated circuit designs and improved lithographic processes, particularly for processes which can offer high precision, cost savings, improved performance, and improved transistor density. Those and other advantages of the present invention will be described in more detail hereinbelow.

BRIEF SUMMARY OF THE INVENTION

It has been found that new methods, devices, and systems of fabrication are possible. These new methods, devices, and systems overcome many of the problems inherent in the prior art. For example, the present invention offers advantages over the prior art, such as compact size and the potential of repetitive pattern design.

According to one invention, a device includes a first semiconductor portion having a first end, a second end, and a slit portion between the first end and the second end, wherein the first end has a width, wherein the second end has a width, wherein the slit portion has a width, wherein the width of the slit portion is less than the width of at least one of the first end and the second end, and wherein the width of the first end, the second end, and the slit portion are measured in a direction transverse to an imaginary line between the first end and the second end. The device also includes a second portion, wherein the second portion is a different material than that of the first semiconductor portion. The device also includes a third portion, wherein the second and third portions are on opposite sides of the slit portion, and wherein the third portion is a different material than that of the first semiconductor portion. The device also includes at least three terminals selected from a group consisting of: a first terminal connected to the first end; a second terminal connected to the second end; a third terminal connected to the second portion; and a fourth terminal connected to the third portion. This invention may be used to form many different kinds of devices, such as field effect transistors, bipolar junction transistors, memory devices, resistors, and other devices.

According to another embodiment, the present invention includes a system, comprising a plurality of the semiconductor devices, wherein each semiconductor device includes a first semiconductor portion having a first end, a second end, and a slit portion between the first end and the second end, wherein the first end has a width, wherein the slit portion has a width, and wherein the width of the slit portion is less than the width of the first end. Each semiconductor device also includes a second portion, wherein the second portion is a different material than that of the first semiconductor portion. Each semiconductor device also includes a third portion, wherein the second and third portions are on opposite sides of the slit portion, and wherein the third portion is a different material than that of the first semiconductor portion. Each semiconductor device also includes at least three terminals selected from a group consisting of: a first terminal connected to the first end; a second terminal connected to the second end; a third terminal connected to the second portion; and a fourth terminal connected to the third portion. The system also includes an interconnect connecting at least one of the terminals of a first semiconductor device to at least one of the terminals of a second semiconductor device. The system is such that the first semiconductor device operates as a device selected from a group comprising a field effect transistor, a bipolar junction transistor, a memory device, and a resistor; and the second semiconductor device operates as a device selected from a group comprising a field effect transistor, a bipolar junction transistor, a memory device, and a resistor, wherein the second semiconductor device operate as a device different than that of the first semiconductor device.

In another embodiment the present invention is a semiconductor device including a gate, a bulk semiconductor region having a depth no greater than:

$$W_{MAX} = 2[(\epsilon_0 \epsilon_S (kT/q) \ln(N_a/n_i))/qN_a]^{1/2}, \text{ wherein:}$$

$\epsilon_0$ is the permittivity of free space=$8.85 \times 10^{-14}$ F/cm;
$\epsilon_S$ is the dielectric constant for the semiconductor;
k is Boltmann's constant=$1.38 \times 10^{-23}$ J/° K;
T is the temperature in Kelvin;
q is the electronic charge (magnitude)=$1.60 \times 10^{-19}$ C;
$N_a$ is the ionized acceptor density in the semiconductor; and
$n_i$ is the intrinsic concentration of the semiconductor in $cm^{-3}$, and including an electrical insulator between the gate and the bulk semiconductor region.

In another embodiment, the bulk semiconductor region has a depth of no greater than $2W_{MAX}$ and two gates are used, one on one side of the bulk semiconductor region and one on the opposite side of the bulk semiconductor region.

In another embodiment, the present invention is a semiconductor device including a bulk semiconductor region, a gate, an insulator between the bulk semiconductor region and the gate, a source terminal, a drain terminal, a current path formed in the bulk semiconductor region between the source terminal and the drain terminal when a voltage is applied at the gate, wherein the current path does not include a depletion region formed adjacent to the insulator and gate.

In another embodiment, the present invention includes a memory device including a bulk semiconductor region, a source terminal connected to the bulk semiconductor region, a drain terminal connected to the bulk semiconductor region, a gate adjacent to the bulk semiconductor regions and electrically insulated from the bulk semiconductor region, a charge storage node, and an insulator between the floating gate and the bulk semiconductor region.

In another embodiment, the present invention includes a semiconductor device including a bulk semiconductor region, a source terminal electrically connected to the bulk semiconductor region, a drain terminal electrically connected to the bulk semiconductor region, wherein the source terminal and the drain terminal are located at opposite ends of the bulk semiconductor region, a first gate adjacent to the bulk semiconductor regions and electrically insulated from the bulk semiconductor region, a second gate adjacent to the bulk semiconductor regions and electrically insulated from the bulk semiconductor region, wherein the first and second gates are located at opposite ends of the bulk semiconductor region.

In one embodiment, the present invention forms features in a regular, repeating pattern. These patterns may be formed, for example, with conventional fabrication techniques, such as by using a lithographic mask to form a pattern in a layer of photoresist and etching the exposed surface. The use of a regular, repeating pattern offers several advantages, including a relatively simple lithographic mask, the reduction or elimination of optical proximity correction ("OPC") during fabrication, and increased throughput.

The present invention may be used for a wide range of semiconductor devices, such as digital circuits, analog circuits, field effect transistors ("FET"), bipolar junction transistors ("BJT"), resistive elements, microprocessors, system-on-chip ("SOC") applications, and many more. In addition, the present invention may be used in fields other than semiconductors, such as with liquid crystal displays, micro-electromechanical systems, and others. Furthermore, although the present invention will be described in terms of SOI applications, it may also be applied to other applications, such as semiconductors using non-insulating substrates. Similarly, although the present invention will be described in terms of mask lithography, the present invention may also be used with maskless lithography. Those and other variations are possible and contemplated with the present invention.

In one embodiment of the present invention, a highly repetitive pattern and a subsequent pattern which intentionally modifies the repetitive pattern into a more useful form. The patterns may be formed, for example, with masks, with a maskless process, or with a combination of mask and maskless processes. The highly repetitive pattern may be formed, for example, with a high precision process and the modification pattern may be formed with a less precise process, while still providing high quality pattern edges at the performance-critical locations.

In another embodiment, the present invention includes a method that uses a plurality of different exposure energy sources to produce a pattern. Different exposure energy sources include, but are not limited to, light of different wavelengths, E-beam, x-ray, and other energy sources.

In another embodiment, the present invention includes one or more systems, devices, or components formed utilizing at least one of the methods described herein.

In another embodiment, the present invention includes devices and systems including one or more components utilizing at least one of the methods described herein.

In another embodiment, the present invention includes fabrication devices and systems for performing one or more of the methods described herein.

In another embodiment, the present invention includes methods of making the devices described herein.

Many variations are possible with the present invention. For example, although the present invention will generally be described in the context of SOI, teachings of the present invention are also applicable to other fields. For example, the present invention is also applicable to semiconductors formed on silicon or other semiconductor substrates. These and other teachings, variations, and advantages of the present invention will become apparent from the following detailed description of the invention.

BRIEF DESCRIPTION OF THE SEVERAL VIEWS OF THE DRAWING

Embodiments of the present invention will now be described, by way of example only, with reference to the accompanying drawings for the purpose of illustrating the embodiments, and not for purposes of limiting the invention, wherein:

FIGS. 4-16 illustrate various embodiments of the present invention;

FIGS. 20-47 illustrate an exemplary fabrication process according to the present invention;

DETAILED DESCRIPTION OF THE INVENTION

The present invention is suitable to many variation and embodiments. The invention will sometimes be described in terms of a silicon-oxide-silicon wafer. In other examples, the present invention will be described in terms of a silicon substrate that is not formed on top of an insulating layer. In other examples, the present invention will be described in terms which are independent of the particular substrate. These and other examples of the present invention are illustrative and not limiting, and the present invention is application to any and all such substrates as well as other applications. For example, although the present invention is generally described in the context of silicon semiconductors, the present invention may also be utilized with other semiconductors, such as gallium arsenide. Many variations are possible with the present invention, and elements and process steps from one example are applicable to other examples. For example, different types of SOI structures may be used, different process steps may be used, and different ordering of process steps may be used. Similarly, although the present invention will generally be described in terms of a transistor, the present invention may also be embodied in other devices, such as resistors, memory devices, liquid crystal displays, micro-electromechanical systems, and others. The present invention may also be practiced with e-beam processes and scanners. For example, the present invention may be practiced with circuit geometries including many rectangular and circular elements, and e-beam fabrication and lithographic scanners may be utilized to form these circuit geometries. Also, although the present invention will often be described in the context of a field effect transistor, the same or similar structure may be used with other devices, such as bi-polar junction transistors. As a result, the use of terms such as "source terminal" are illustrative, and the same or similar structure, in another application, may be a different type of terminal, such as a base terminal in a bi-polar transistor.

Figure 1A:
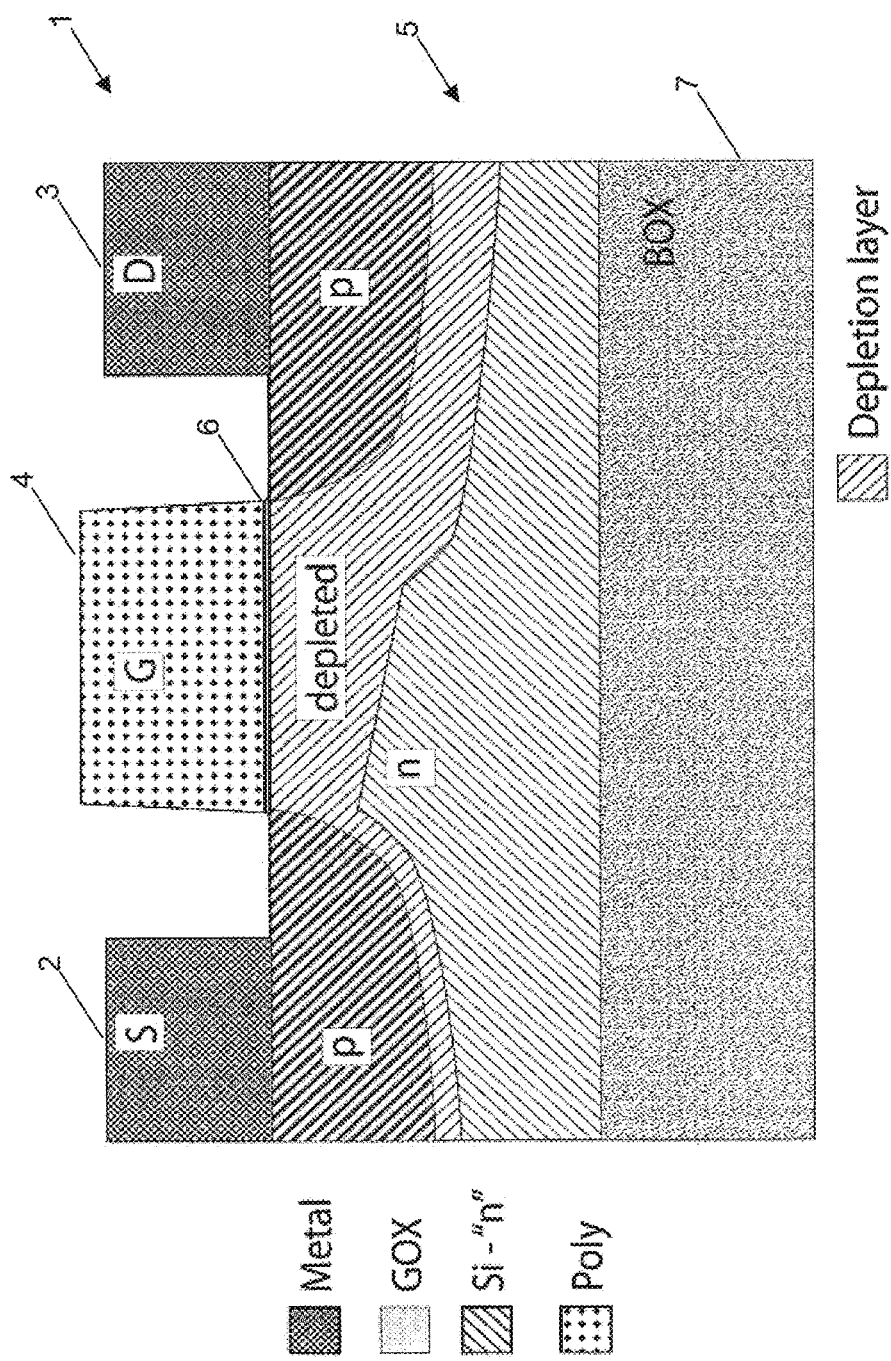
FIGS. 1a and 1b illustrate cross-sectional views of a prior art field effect transistors.

FIG. 1a illustrates a cross-sectional view of a prior art field effect transistor 1 having a source terminal 2, drain terminal 3, gate 4, bulk semiconductor region 5, and an insulator 6 between the gate 4 and the bulk semiconductor region 5. Additional doping of the bulk semiconductor region 5 results in p-n junctions at the source terminal 2 and drain 3 terminals. The bottom of the bulk semiconductor region 5 is defined by a buried oxide ("BOX") layer 7. The p-doped regions at the source terminal 2 and drain terminal 3 overlap the insulator 6. In the illustrated embodiment a voltage is applied at the gate 4 and at the drain terminal 3, resulting in a depletion region. The depletion region separates the source terminal 2 and drain terminal 3 from each other and from the bulk semiconductor region 5. Relatively little current flows through the depletion region. Many of the electrons from the depletion region accumulate at the insulator forming a path along the insulator through which current flows from the drain terminal 3 to the source terminal 2.

Figure 1B:
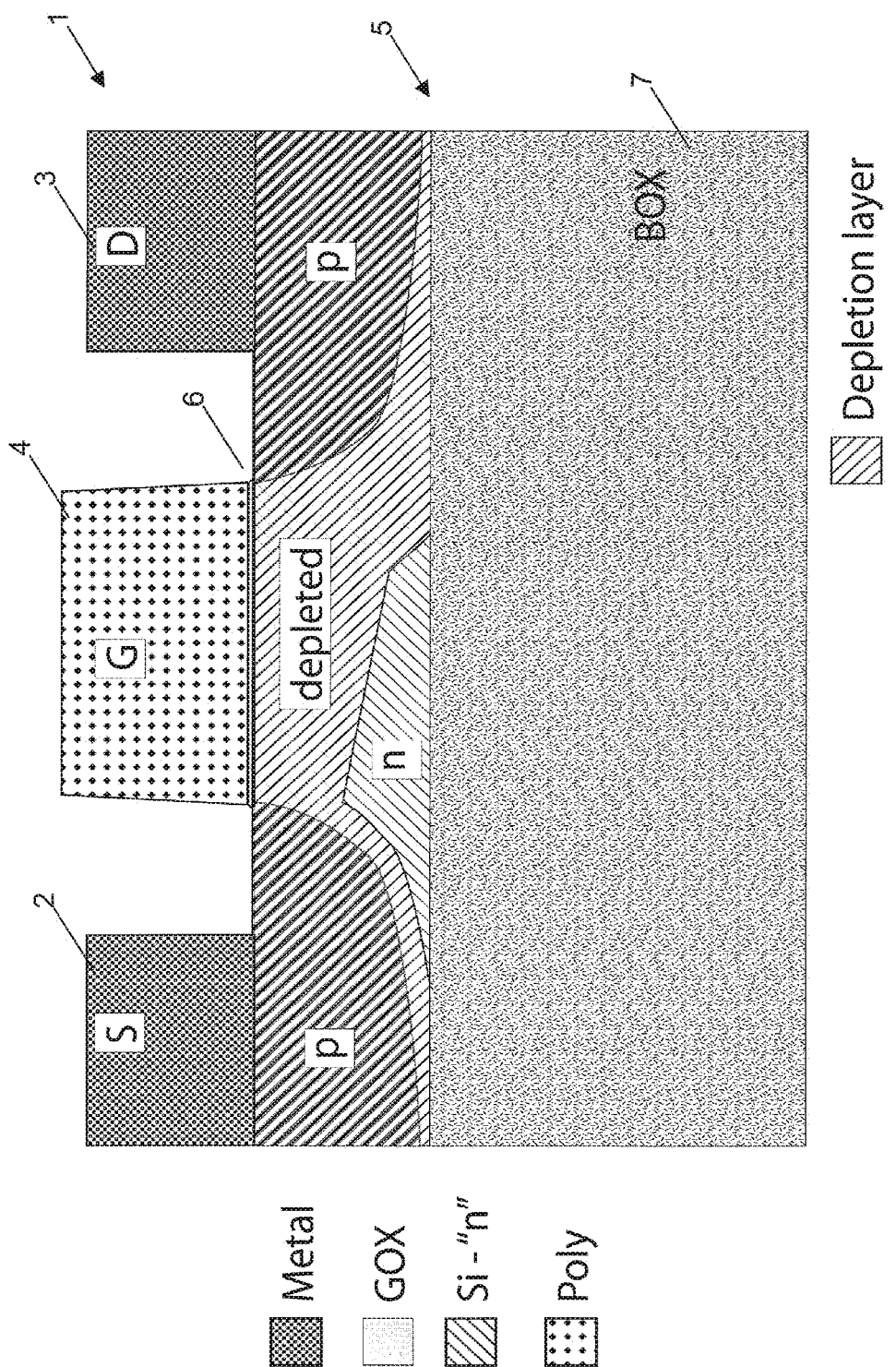

FIG. 1b illustrates a cross-sectional view of a fully depleted prior art SOI transistor 1 in which the depth of the bulk semiconductor region 5 is more shallow than that illustrated in FIG. 1a. The depletion region 8 in FIG. 1b separates the source terminal 2 and drain terminal 3 from each other and from a portion of the bulk semiconductor region 5, in a manner analogous to that illustrated in FIG. 1a.

Figure 2:
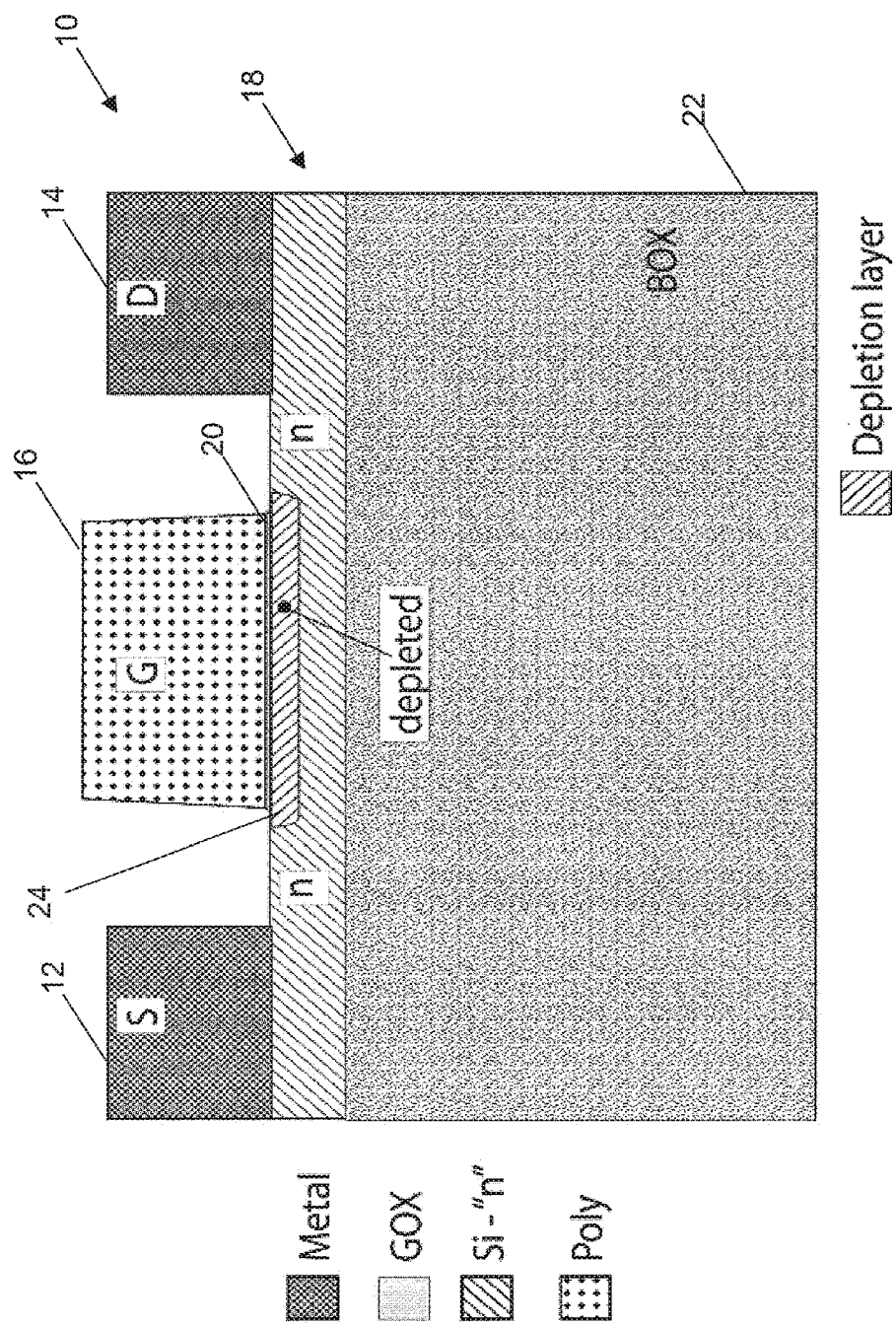
FIGS. 2 and 3 illustrate cross-sectional views of field effect transistors constructed according to the present invention.

FIG. 2 is a cross-sectional view of one embodiment of a device 10 according to the present invention including a source terminal 12, drain terminal 14, gate 16, bulk semiconductor region 18, and an insulator 20 between the gate 16 and the bulk 18 semiconductor region. The source 12 and drain 14 terminals may be connected directly to the bulk semiconductor region 18, or they may be connected via one or more intermediate layers or regions, such as to provide a more desirable electrical connection or to facilitate the fabrication process. In general, the source 12 and drain 14 terminals are any structure or means for providing an electrical connection to a desired location of the bulk semiconductor region 18, and such connection does not necessarily need to be in the form of a traditional terminal, but may take the form of any suitable electrical connection. In the illustrated embodiment the device 10 includes a buried oxide ("BOX") layer 22, although in other embodiments of the present invention the BOX layer 22 may be omitted.

For simplicity, "source terminal" and "drain terminal" will sometimes be simplified to "source" and "drain", although it is understood that such terms neither require nor preclude the use of terminals. Furthermore, the present invention will generally use the terms "terminal" and "contact" and the like in a broad sense and include, for example, surface contacts, punch through contacts, via contacts, etc. Similarly, the use of "source terminal" and "drain terminal" do not require the use of conventional terminal, and "terminals" may be substituted for other connections and vice versa. Also, although the present invention will often be described in the context of a field effect transistor, the same or similar structure may be used with other devices, such as bi-polar junction transistors. As a result, the use of terms such as "source terminal" are illustrative, and the same or similar structure, in another application, may be a different type of terminal, such as a base terminal in a bi-polar transistor.

There are no p-n junctions at the source 12 and drain 14 of the illustrated embodiment. In the illustrated embodiment a voltage is applied at the gate 16, resulting in a depletion region 24. The depletion region 24 does not separate the source 12 and drain 14 from the bulk semiconductor region 18. Most current flows between the drain 14 and source 12 through the bulk semiconductor region 18 and around the depletion region 30.

The voltage applied at the gate 16, as well as voltage applied at the source 12 and drain 14, will affect the size and shape of the depletion region 24. Because most of the current flows through the bulk semiconductor region 18 but not in the depletion region 24, the size and shape of the depletion region 24 will affect the operation of the device 10. In general, the larger the depletion region 24, the less current flows through the device 10. If the depletion region 24 becomes too large or completely separates the source 12 and the drain 14, then the current flow through the device 10 will stop. The present invention will often be described in terms of current being stopped, shut-off, or the like. These terms are relative and it is understood that semiconductor devices have leakage current in their "off" state, although this leakage current is much less than the current in the "on" state. Furthermore, an acceptable "off" state may be achieved even if a lesser flow of current is possible with a particular device. In conventional semiconductor contexts, turning off a device does not necessarily mean that current is completely stopped, and the same is true in the discussion of the present invention.

The dimensions of the bulk semiconductor region 18 are important to the operation of the device 10. For example, if the bulk semiconductor region 18 is too deep, it may not be possible to produce an adequate depletion region 24 to stop current flow without damaging the insulator 20 or other parts of the device 10. Many factors affect the size and shape of the depletion region 24. The following equation generally describes the maximum depth of a depletion region 24 in a p-type substrate for a device such as that illustrated in FIG. 2:

$$W_{MAX} = 2[(\epsilon_0 \epsilon_S (kT/q) \ln(N_a/n_i))qN_a]^{1/2} \quad \text{[Eqn. 1]}$$

wherein:

$\epsilon_0$ is the permittivity of free space=$8.85 \times 10^{-14}$ F/cm;

$\epsilon_S$ is the dielectric constant for the semiconductor;

k is Boltmann's constant=$1.38 \times 10^{-23}$ J/° K;

T is the temperature in Kelvin;

q is the electronic charge (magnitude)=$1.60 \times 10^{-19}$ C;

$N_a$ is the ionized acceptor density in the semiconductor; and $n_i$ is the intrinsic concentration of the semiconductor in cm$^{-3}$.

This assumes that the electric field from the gate 16 is confined to the oxide 20 and the semiconductor depletion region 24 and it assumes that the oxide 20 is charge free. Additional factors may be added to the equation for more precise calculations, or factors may be eliminated or simplified if less precise calculations are acceptable. Similar calculations can also be made for n-type substrates by changing the ionized acceptor density to the ionized donor concentration.

Figure 3:
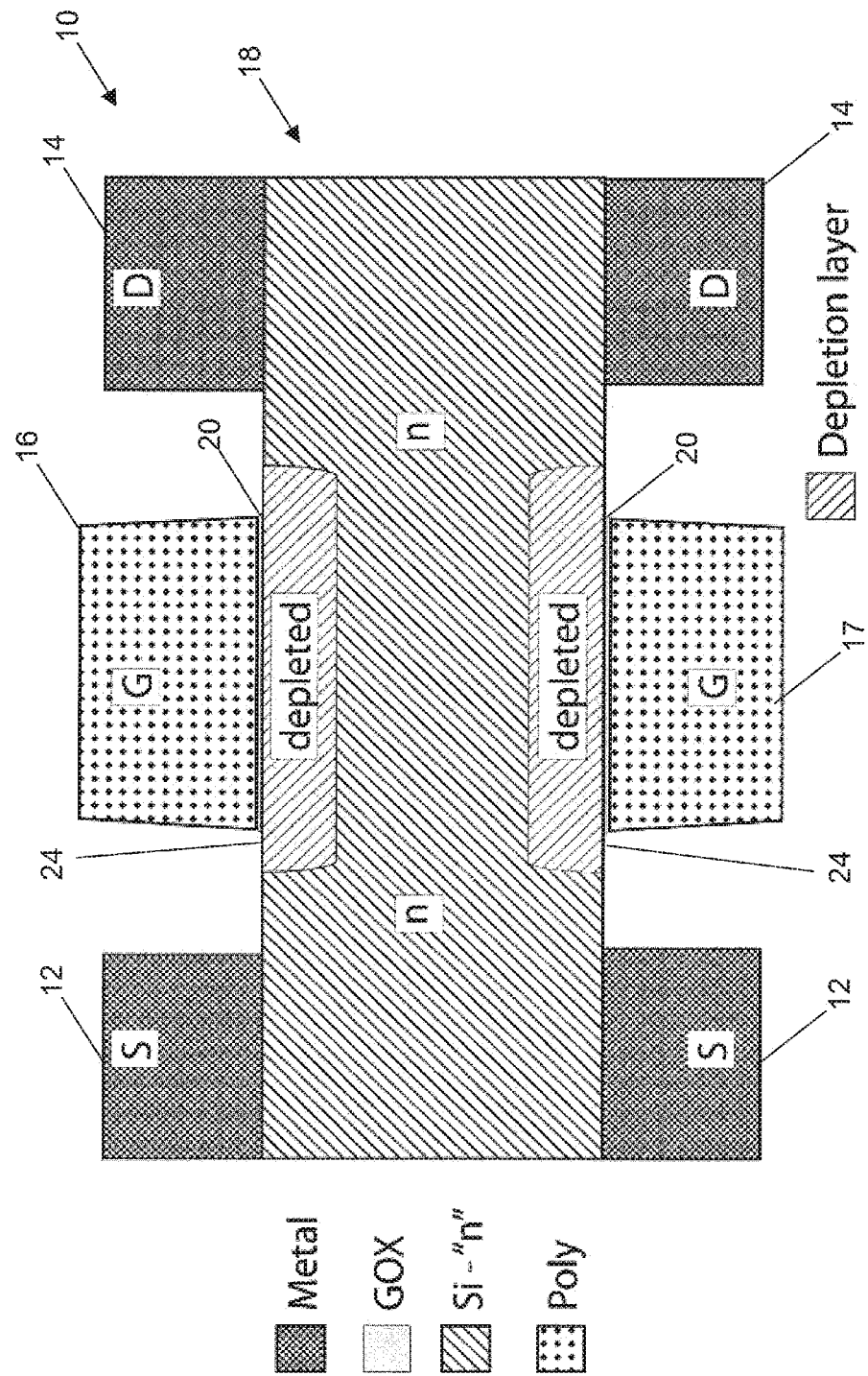

FIG. 3 is a cross-sectional view of another embodiment of the present invention including two gate terminals 16, 17, two source terminals 12, and two drain terminals 14. In this embodiment, the use of two gate terminals 16, 17 will allow for the creation of a larger depletion region 24 than would be possible with a single gate terminal 16. Although two source terminals 12 and two drain terminals 14 are illustrated, the present invention may also be practiced with more or less than two source terminals 12 and more or less than two drain terminals 14. Furthermore, the present invention may be practiced with more or less than two gate terminals 16, 17, and with various combinations of gate terminals 16, 17, source terminals 12, and drain terminals 14.

Figure 4:
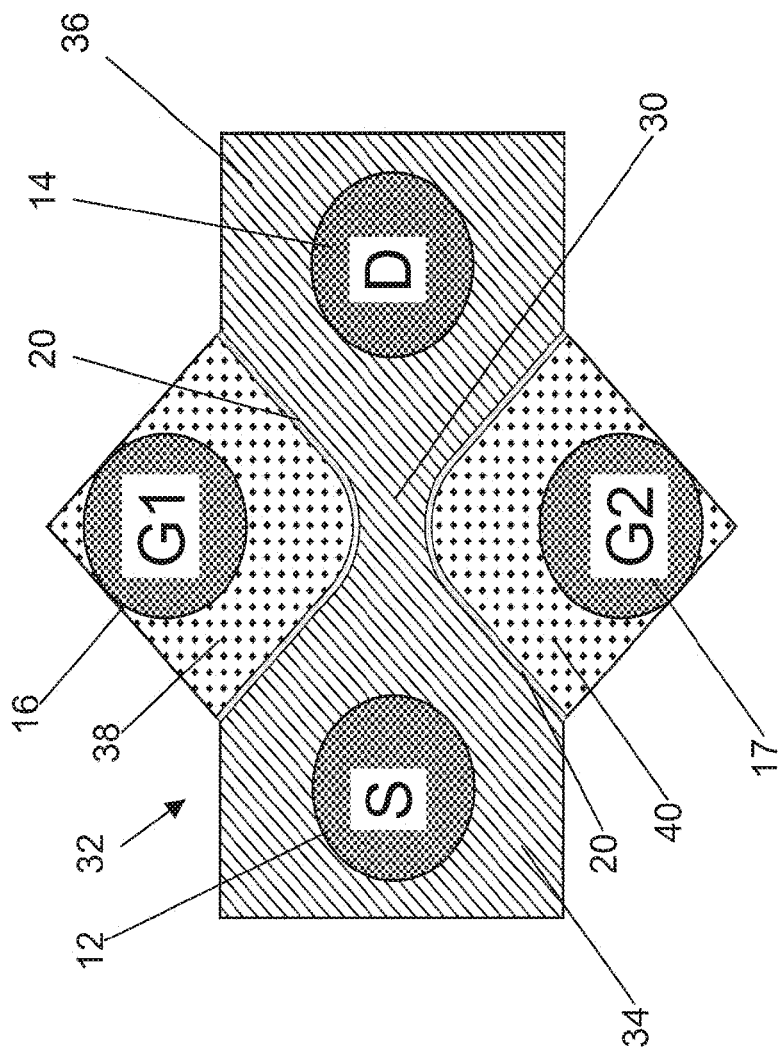

FIG. 4 is a top plan view of another embodiment of the present invention including two gate terminals 16, 17, one source terminal 12, and one drain terminal 14. In this embodiment the gate terminals 16, 17 are on opposite sides of a narrow region 30 in the semiconductor 18, thereby making it easier to form a depletion region 24 across the semi-conductor 18 and control the flow of current. This configuration is not required with the present invention, although it is often desirable, particularly if low-voltage gates are used.

The portion of the bulk semiconductor region 18 connecting the source terminal 12 and the drain terminal 14 and including the narrow region between the gate terminals 16, 17 will sometimes be referred to as the "first semiconductor portion" 32 to distinguish it from other parts of the device. The first semiconductor portion 32 has a first 34 end and a second 36 end. Although the first 34 and second 36 ends are illustrated as corresponding to the source 12 and drain 14, respectively, the source 12 may be located at the second end 36 and the drain 14 at the first end 34. In other embodiments the first 34 and second 36 ends may connect other than a source terminal and drain terminal. For example, in embodiments of the invention related to bipolar junction transistors, the first 34 and second 36 ends may connect the base terminals.

The portions between the gate terminals 16, 17 and the first semiconductor portion will sometimes be referred to as the second 38 and third 40 portions. These portions 38, 40 may be single crystal silicon, polysilicon, metal, or other materials. The second 38 and third 40 portions may be made of a different material than the first semiconductor portion 32. For example, the first semiconductor portion 32 may be doped single crystal silicon, which the second 38 and third 40 portions may be metal or polysilicon. In other embodiments, the first semiconductor portion 32 may be doped single crystal silicon, and the second 38 and third 40 portions may be single crystal silicon doped differently than that of the first semiconductor portion 32. For example, the first semiconductor portion 32 may be n-type doped, and the second 38 and third 40 portions may be p-type doped, or vice versa. Alternatively, the dopants may be of the same type, but the concentrations may vary. In the illustrated embodiment, the second 38 and third 40 portions form part of the gates in the field effect transistor. In other embodiments, the second 38 and third 40 portions may form a collector and emitter in a bipolar junction transistor. In other embodiments the second 38 and third 40 portions may form working and floating gates for a memory device. Many other variations are possible with the present invention.

The narrow region 30 of the first semiconductor portion 32 between the second 34 and third 36 portions will sometimes be referred to as a "slit portion" 30 to distinguish it from the first 34 and second 36 ends of the first semiconductor portion 32. The slit portion 30 has a width, measured across the narrow portion between the second 34 and third 36 portions, in a direction transverse to an imaginary line between the source 12 and drain 14 terminals. The width of the slit portion 30 may be, for example, less than the width of the source 12 and drain 14 terminals, and/or less than the width of the first 34 and second 36 ends of the first semiconductor portion 32.

Many variations are possible with the present invention. For example, although the present invention will generally be described in terms of a device having four terminals, it is possible to utilize the invention with less than four terminals. For example, a field effect transistor according to the present invention may be constructed with only one of the gate terminals 16, 17. Similarly, a bipolar junction transistor may be constructed with only one of the base terminals 12, 14. In memory devices, one terminal may be eliminated to form a "floating" gate as a memory element or storage node in which charge is stored. In such an embodiment, the terminal may be omitted from the floating gate, and/or that floating gate may be surrounded by an electrical insulator. Furthermore, the orientation of the parts of the device 10 may vary. For example, the second 38 and third 40 portions, and corresponding terminals 16, 17, may have the same or different orientation relative to the first 34 and second 36 ends. For example, in one device the second 38 and third 40 portions may be as illustrated in FIG. 4, and in another device the second 38 and third 40 portions may exchange positions.

This embodiment of the present invention can be referred to as a "Dual Gate N-channel Vertical Slit Field Effect Transistor ("DuGaN VeSFET"). The term "dual gate" refers to the fact that the device includes two gates 16, 17. The term "n-channel" refers to the doping of the channel. The term "vertical slit" refers to the orientation of the current channel 30 between the two gates 16, 17. In particular, the illustrated embodiment has gates 16, 17 oriented in a vertical fashion (i.e., into and out of the page for the perspective illustrated in FIG. 4) and defining a vertical current channel 30 (i.e., into and out of the page for the perspective illustrated in FIG. 4) which, in this embodiment, has the appearance of a "slit". The term "FET" is used in its conventional context to identify the device as a field effect transistor.

This embodiment of the present invention illustrates certain elements with round and angular shapes. However, many variations are possible with the present invention. For example, the overall shape of the device may be different than that illustrated herein. Also, particular elements of the device may also have different shapes and orientations. For example, the contacts are illustrated as having a circular shape, although rectangular or other shapes may also be used. Similarly, the gates 16, 17 have an approximately square shape, although round or other shapes may be used for the gates 16, 17 or other elements. Different shapes may have certain advantages in different applications and fabrication processes. Accordingly, different shapes may be used with the present invention.

DuGaN VeSFET and other terminology used herein is useful in understanding certain features of the present invention. However, this terminology is not limiting and the present invention can take other forms than those articulated by the terminology. For example, in some embodiments the device may have gates 16, 17 in orientations other than vertical, and the geometry may be such that the current channel does not have the appearance of a "slit". Similarly, the device may utilize a p-channel rather than an n-channel. Other variations are also possible. Nonetheless, this terminology is useful in explaining certain features of the present invention and it will be used to describe the present invention.

Figure 5:
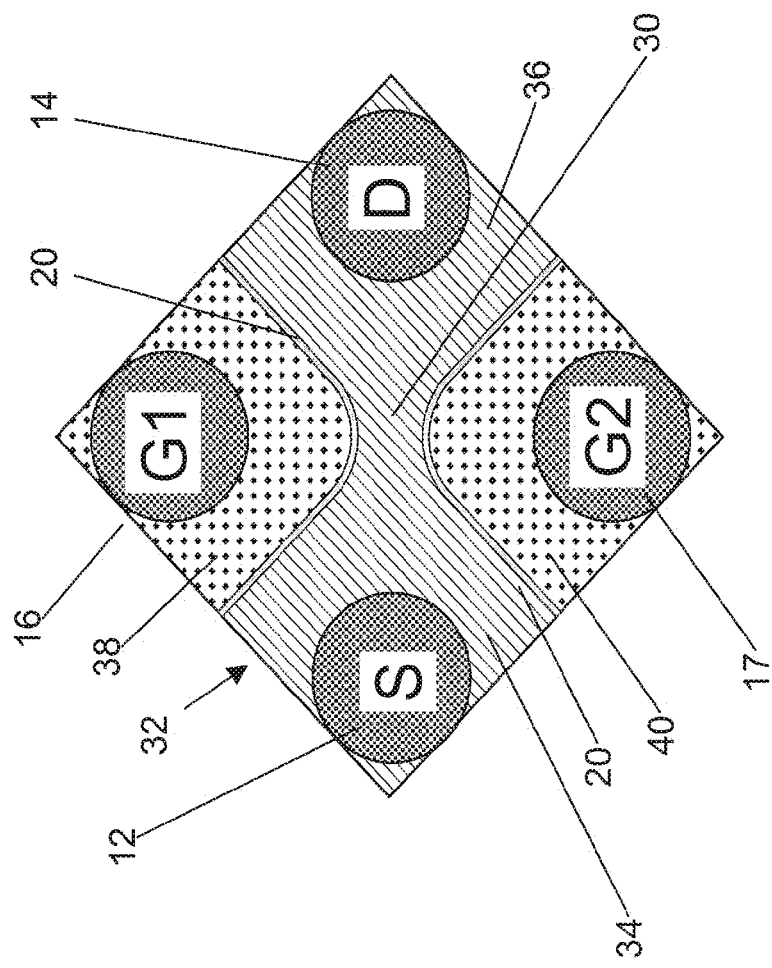

FIG. 5 is a top plan view of another embodiment of the present invention in which the device has a square shape. The gates 16, 17, source 12, and drain 14 are each located in different corners, providing for an efficient utilization of space. This embodiment is also a DuGaN VeSFET. The different shape of the devices in FIGS. 4 and 5 does not change the fact that both devices are DuGaN VeSFET. Other shapes are also possible with the present invention including, but not limited to, circular or other rounded, rectangular, or other shapes.

The square shape illustrated in FIG. 5 allows for certain advantages. For example, that device has equally-spaced terminals. When multiple devices are formed together, such as in an array or other structure, they can be made so that the terminals, both within and between devices, are all equally spaced. For example, the spacing between terminals of a device are equal, and the spacing of terminals between adjacent devices are also equal and may be made the same as the spacing of terminals within a device. As a result, fabrication is easier because the present invention allows for a regular, repeating pattern. Furthermore, as described herein, the same basic structure may be used to form different types of devices such as, for example, field effect transistors, bipolar junction transistors, resistors, memory devices, and other devices. As described herein, the same structure with minor changes, such as type and concentration of dopants, allow for different kinds of devices to be made. Accordingly, a pattern of evenly spaced design elements may be used to fabricate all such devices, thereby allowing for large sections on semiconductor systems or integrated circuits to be made with the pattern of evenly spaced design elements.

Figure 6:
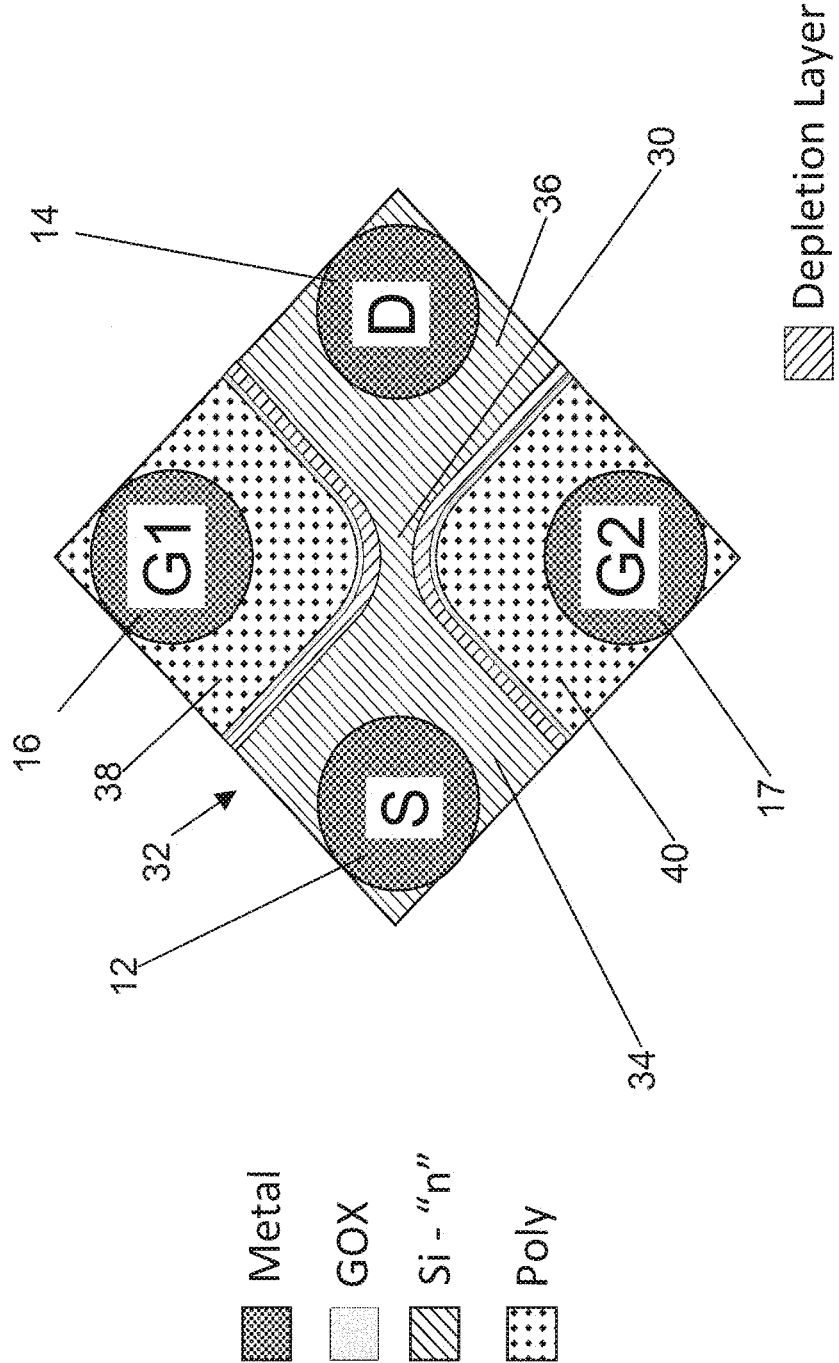
Figure 7:
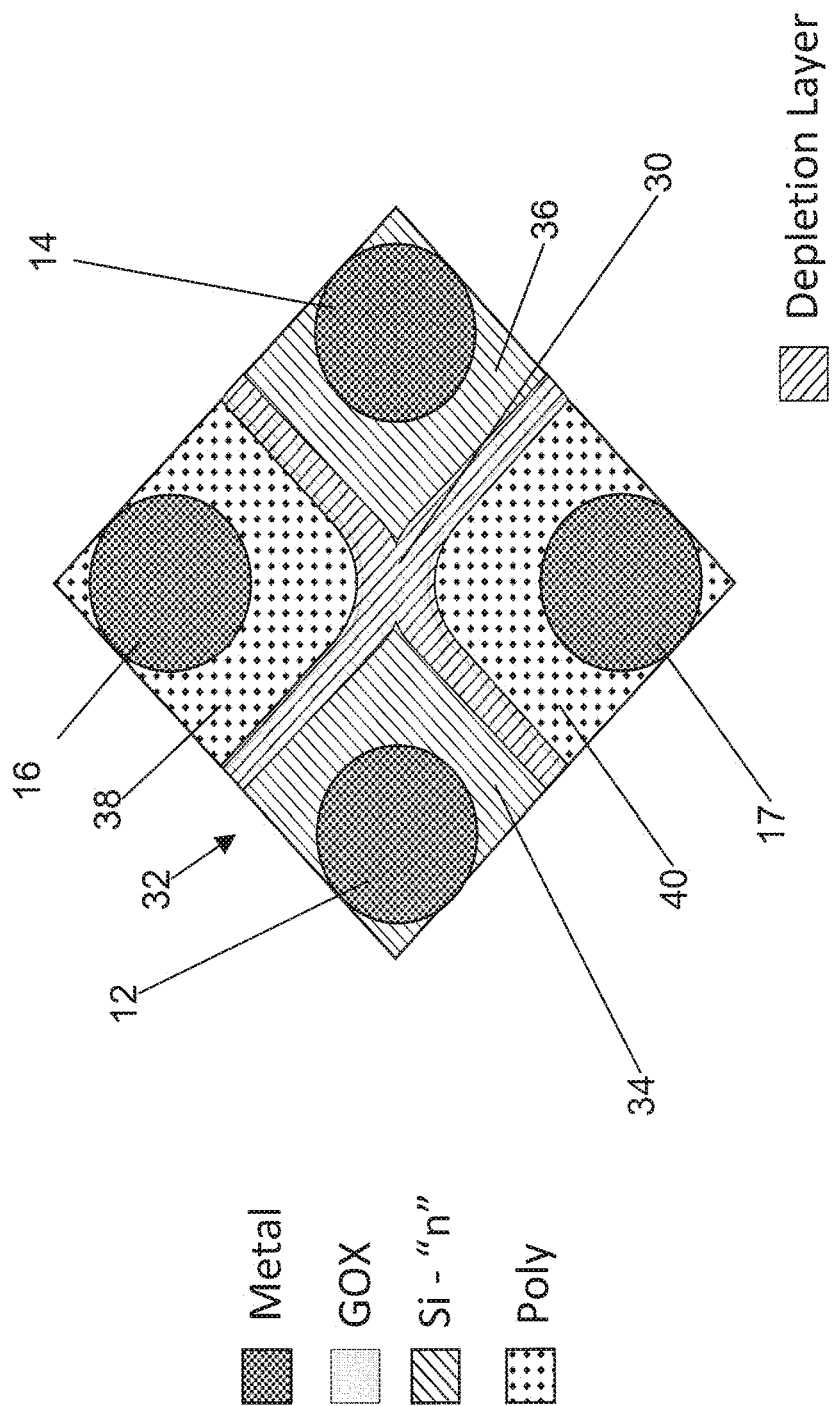
Figure 8:
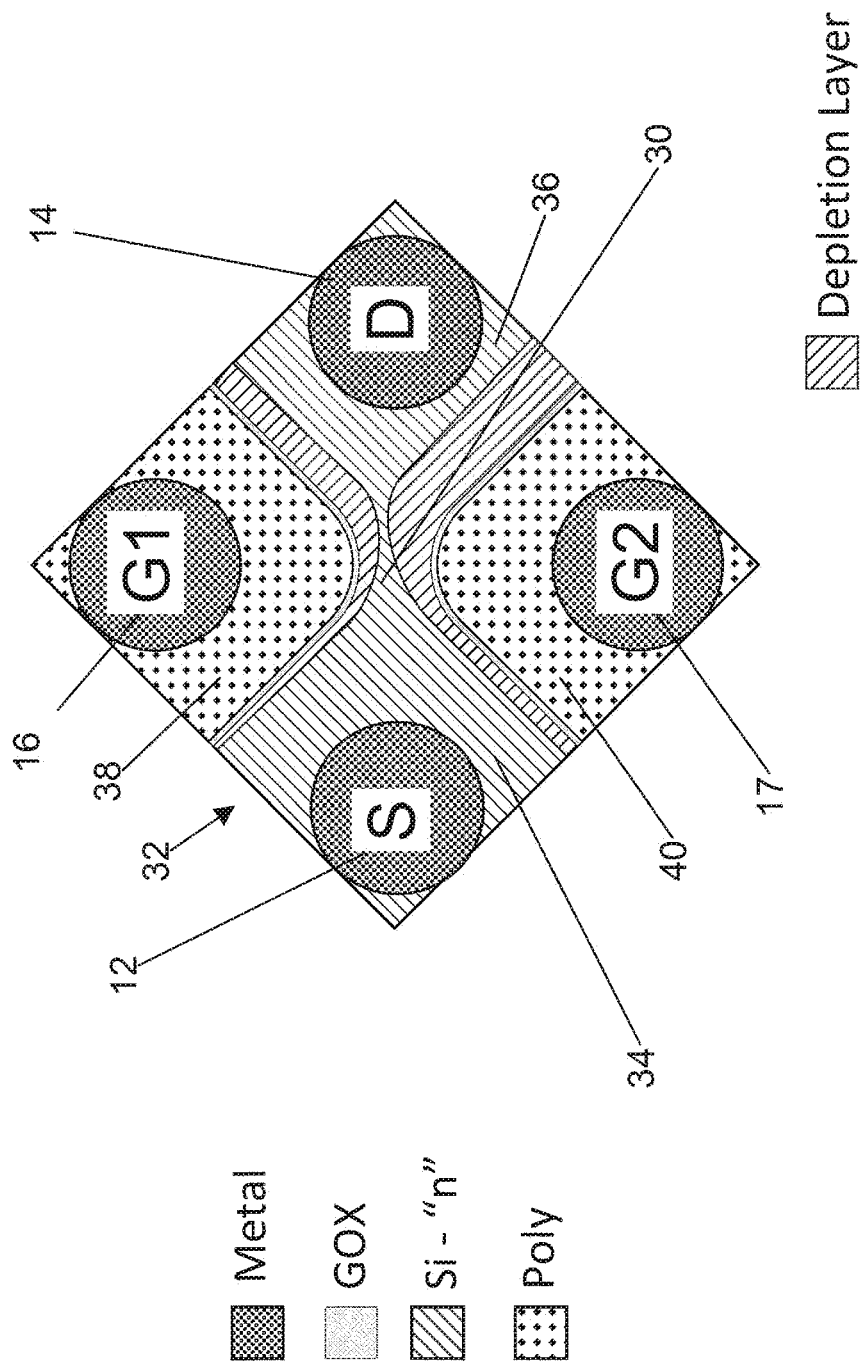

FIG. 6 illustrates the depletion regions in the embodiment of FIG. 5 with a voltage applied to the gates. FIG. 7 illustrates the present invention with a larger voltage applied to the gates resulting in the depletion region extending across the slit 30 of the first semiconductor portion and stopping current flow through the device. FIG. 8 illustrates the a distorted depletion region caused by voltage applied to the drain 14. Also illustrated in this embodiment is the application of different voltages to the gates 16, 17, resulting in different sized depletion regions around the gates 16, 17. The size and shape of the depletion region can be controlled by the voltages applied to the gates 16, 17, source 12, and drain 14.

The distance between the gates 16, 17 (FIGS. 3-5) or between a gate 16, 17 and the boundaries of the bulk semiconductor region (FIG. 2) are important to the proper operation of the present invention. If the distance to too small, the device may not exhibit the proper sensitivity. If the distance to too large, the device may not properly turn off or, alternatively, the voltage required to turn off the device may be so great that it damages the device. Other factors are also important, such as the materials used, the type and concentration of dopants used, the thickness of the insulator, the voltage applied, the number of gates, and the desired operation of the device.

Figure 9A:
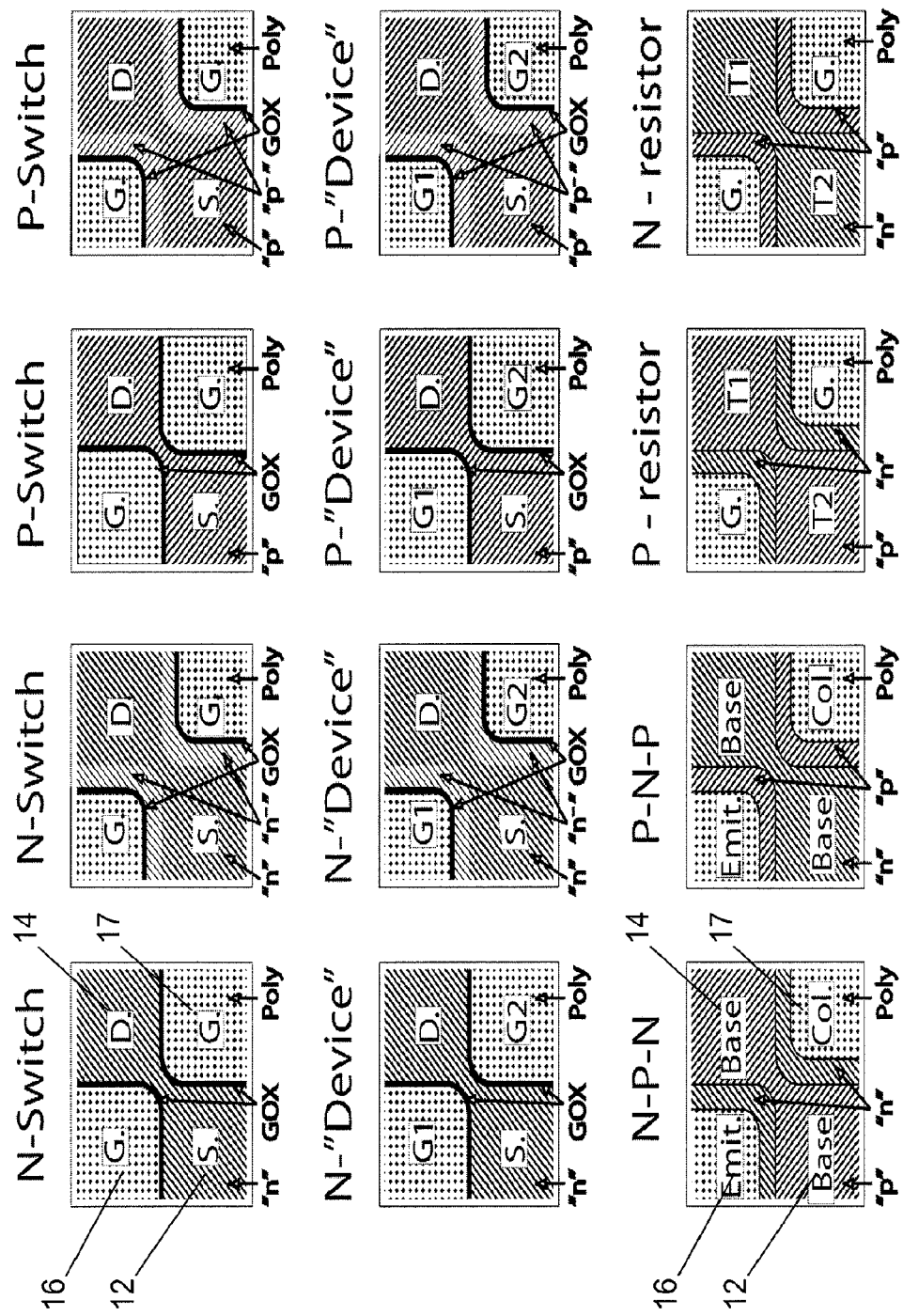

FIG. 9*a* illustrates a number of embodiments of the present invention, including different dopant combinations, embodiments for use as field effect transistors, embodiments for use as bipolar junction transistors, and embodiments for use as resistors or other resistive elements. Other embodiments are also possible. For example, the present invention may be used to create memory devices including flash memory devices and analog and digital memory devices. Other variations are also possible, such as adding additional layers of dopants between the contacts and the bulk semiconductor region to reduce resistive losses.

The top two rows of devices are field effect transistors, including a source terminal 12, a drain terminal 14, and two gate terminals 16, 17. In the bottom row are two embodiments of bipolar junction transistors. Although the bipolar junction transistors do not have source, drain, and gate terminals, those embodiments do have the same basic structure as the field effect transistors, and where a source and drain terminals exist in a field effect transistor, base terminals 12, 14 exist in the bipolar junction transistor. Similarly, the gate terminals of the field effect transistor become emitter 16 and collector 17 terminals. Furthermore, the particular orientation of the elements can be rearranged, such as switching the source and drain, or the emitter and collector. Therefore, the geometry of the device and the location of the terminals can be used for more than one different kind of device.

Figure 9B:
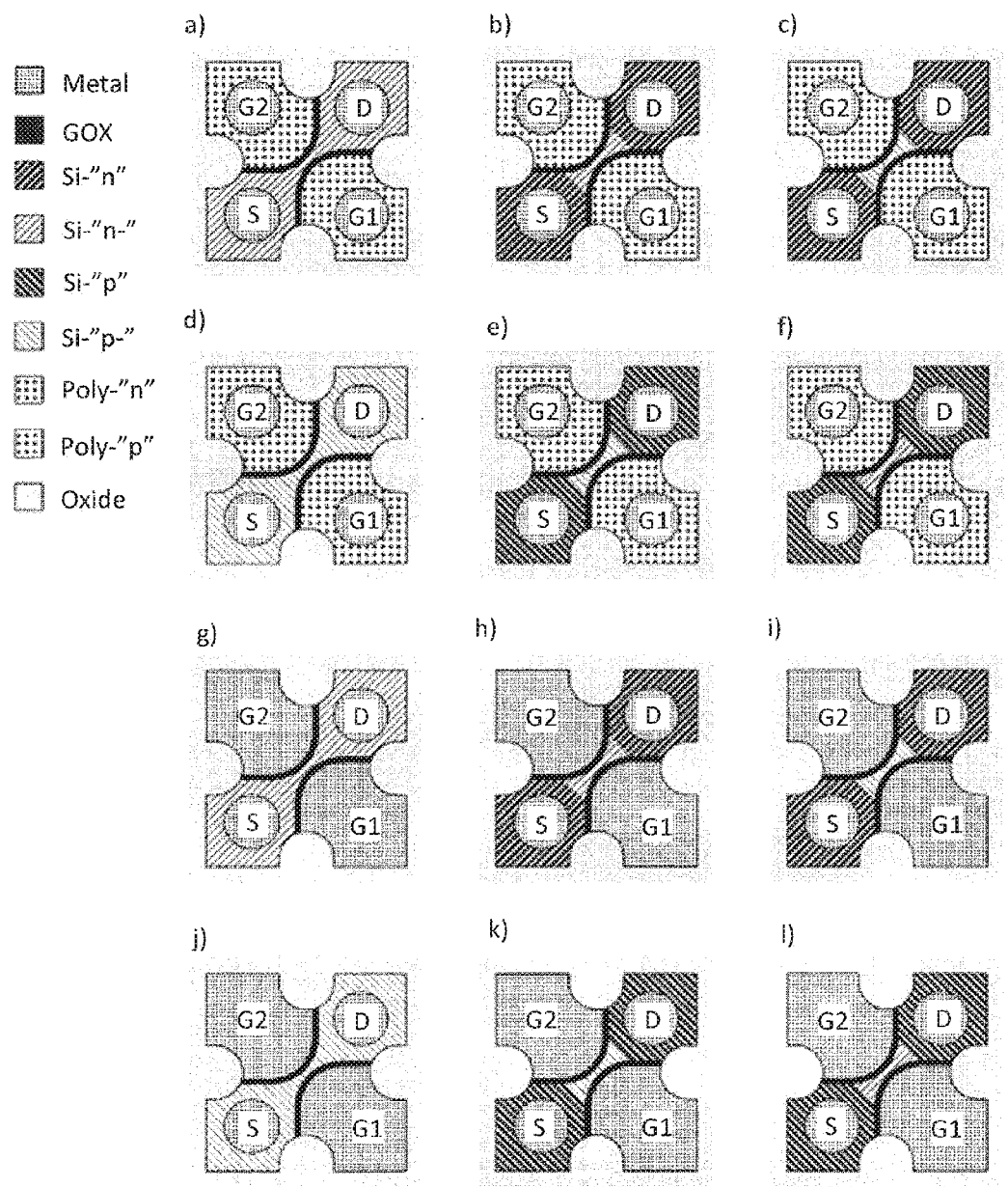

FIG. 9*b* illustrates several embodiments of field effect transistors according to the present invention. In several embodiments, the slit portion of the first semiconductor device is doped differently than the first and second ends of the first semiconductor device. In particular, in some embodiments the slit portion has a different dopant concentration, and in other embodiments the slit portion is doped with a p-type dopant while the first and second ends are doped with an n-type dopant, and vice versa. In other embodiments, the first and second portions surrounding the gates are made from metal, and in other embodiments the first and second portions are made from polysilicon and single crystal silicon.

Figure 9C:
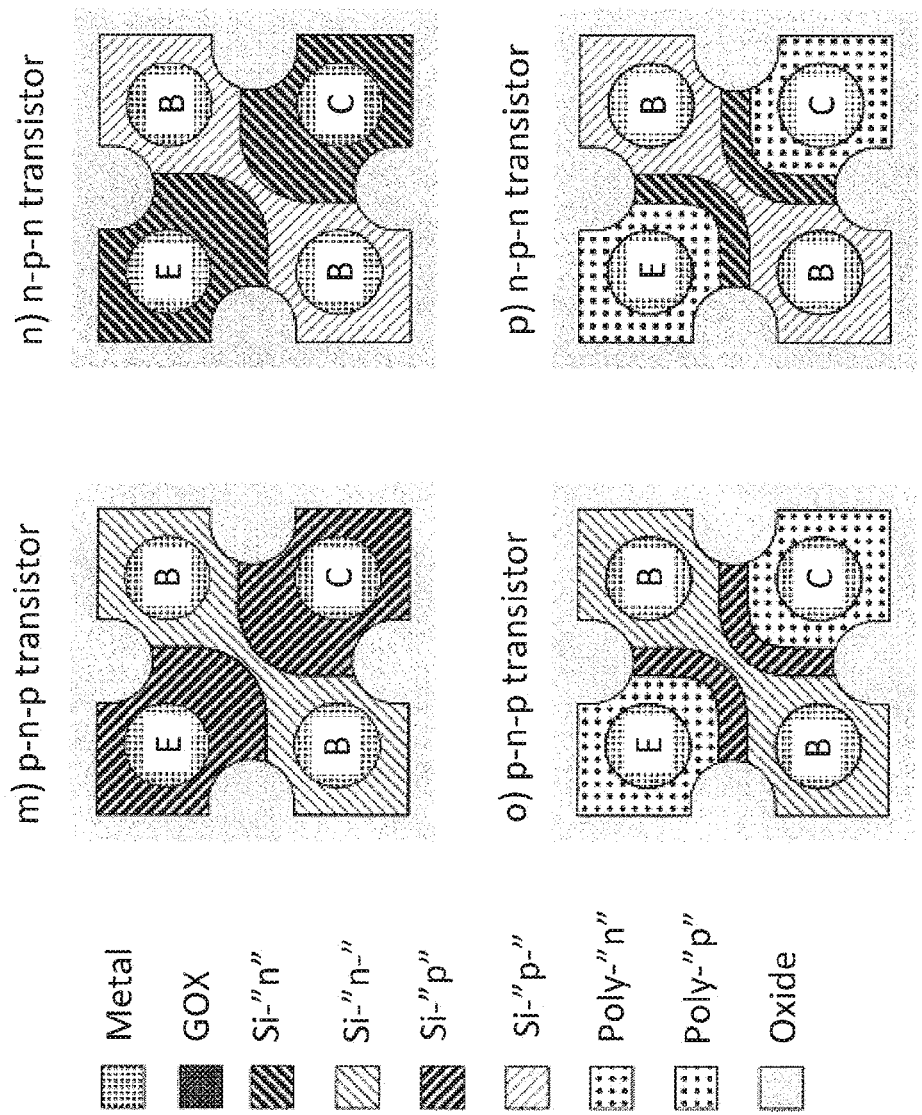

FIG. 9c illustrates several embodiments of bipolar junction transistors according to the present invention. In some embodiments, the second and third portions are polysilicon, and in other embodiments the second and third portions are doped single crystal silicon. In all of the embodiments illustrated in FIG. 9c the collector and emitter terminals in the second and third portions are connected to the first semiconductor portion via semiconductor p-n junctions.

FIGS. 9a-9c illustrate several embodiments of the present invention, although other variations are possible with the present invention.

FIG. 10 illustrates a schematic view of one embodiment of the present invention. In that embodiment, exemplary dimensions are provided, although other dimensions are also possible. In the illustrated embodiment, each grid square is approximately 50 nm.

Figure 11:
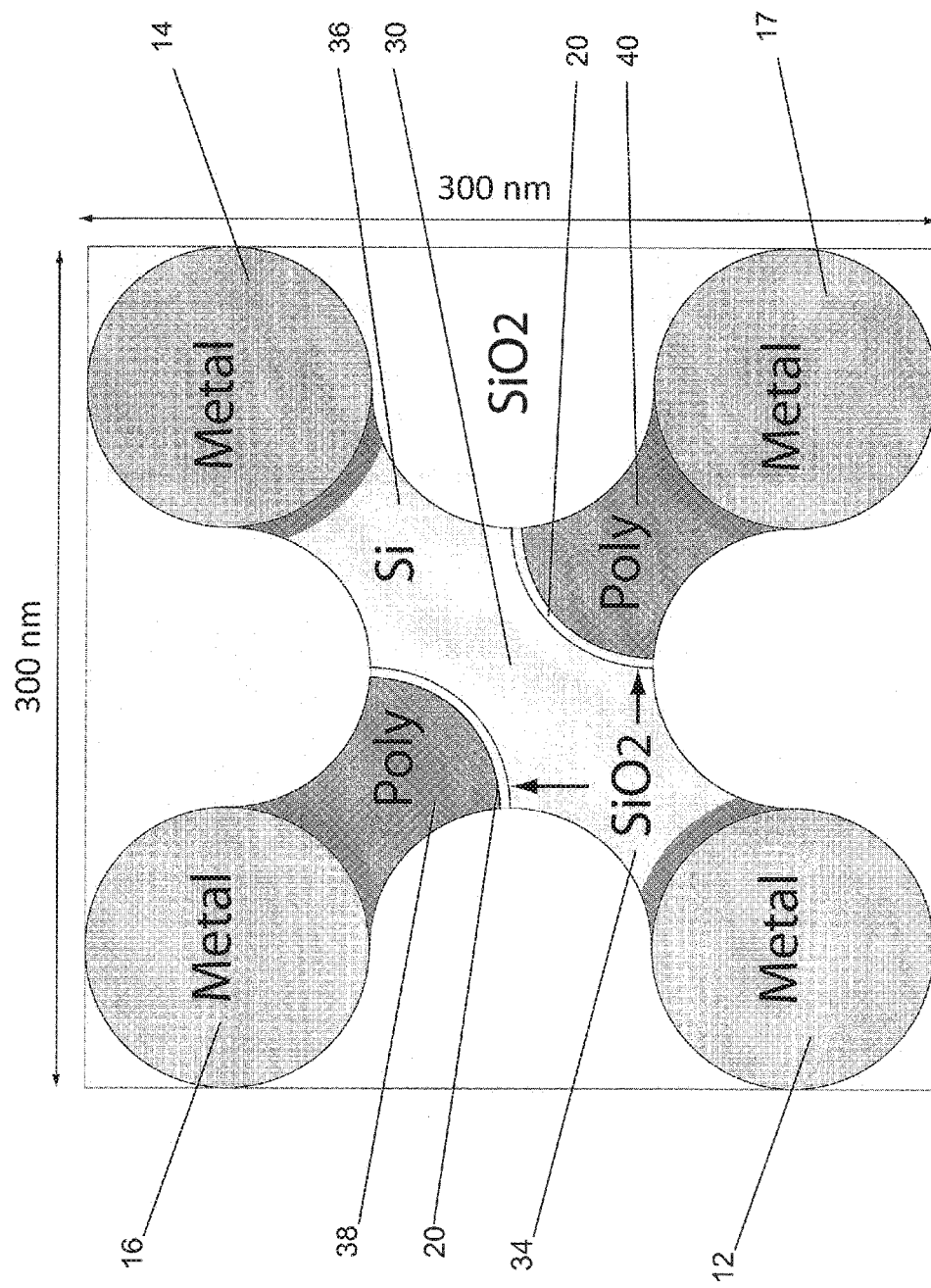

FIG. 11 illustrates a schematic view of another embodiment of a DuGaN VeSFET according to the present invention. In that embodiment, recesses are formed in the device to change the overall shape from a square or rectangular shape to an "x"-shape. In this embodiment, the bulk semiconductor region 18, and more specifically the first semiconductor region 32 and second 38 and third 40 regions, is made more narrow in certain parts, thereby reducing the capacitance of those regions and providing for improved response time and reduced power consumption. Another result of this embodiment is that the resistance may be increased relative to embodiments in which the regions are not reduced in width.

Figure 12:
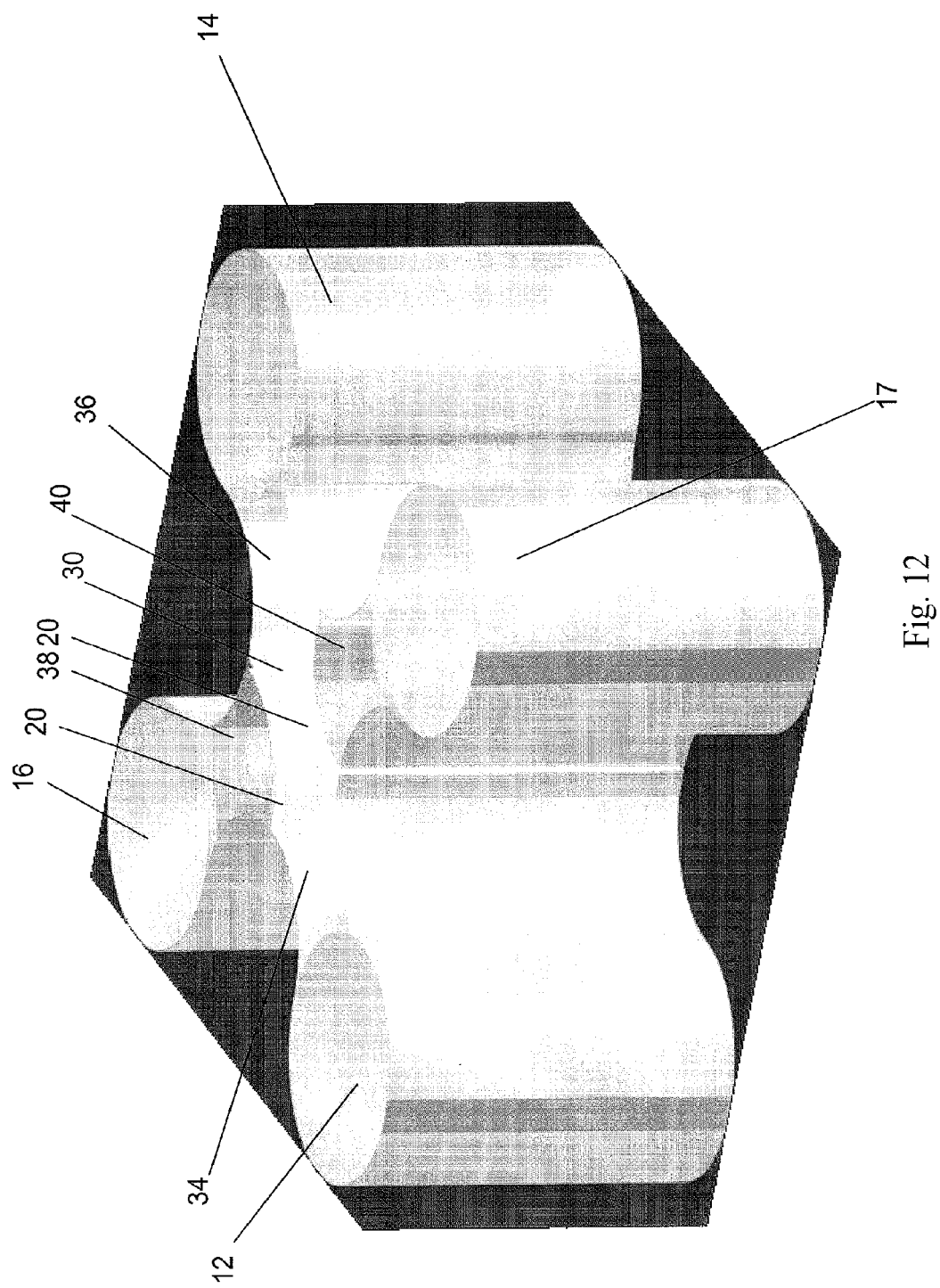

FIG. 12 illustrates a three dimensional view of the DuGaN VeSFET device illustrated in FIG. 11. In that embodiment the top surfaces of the various parts of the device 10, including the first semiconductor portion 32 (including the first 34 and second 36 ends, and the slit 30), the second portion 38, and the third portion 40, are all in the same imaginary plane. The terminals all pass through or contact that imaginary plane. In other embodiments, the some or all of the terminals may not pass or contact the top surfaces, but rather the terminals may pass through or contact the bottom surfaces. Similarly, the bottom surfaces of the various parts of the device 10, including the first semiconductor portion 32 (including the first 34 and second 36 ends, and the slit 30), the second portion 38, and the third portion 40, may all be in the same imaginary plane on the bottom of the device 10.

Other variations are also possible. For example, in some embodiments the top surfaces may not all lie in the same imaginary plane, but may lie in two or more different imaginary planes, all of which are parallel to each other. For example, the top surfaces of the second 38 and third 40 portions may be higher or lower than that of the first semiconductor portion 32. Similar variations are possible with the bottom surfaces.

Figure 13:
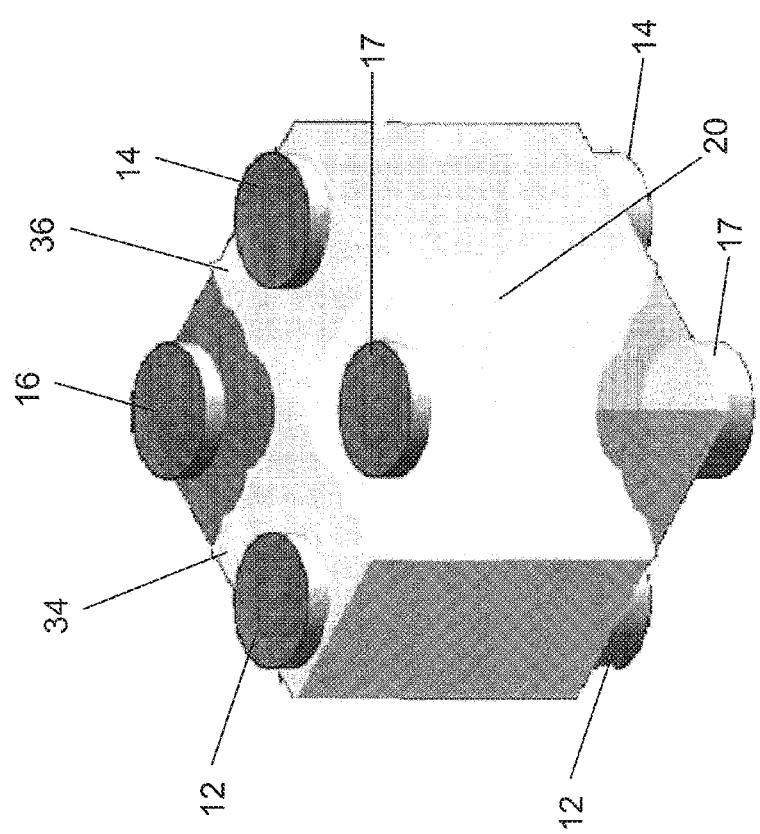
Figure 14:
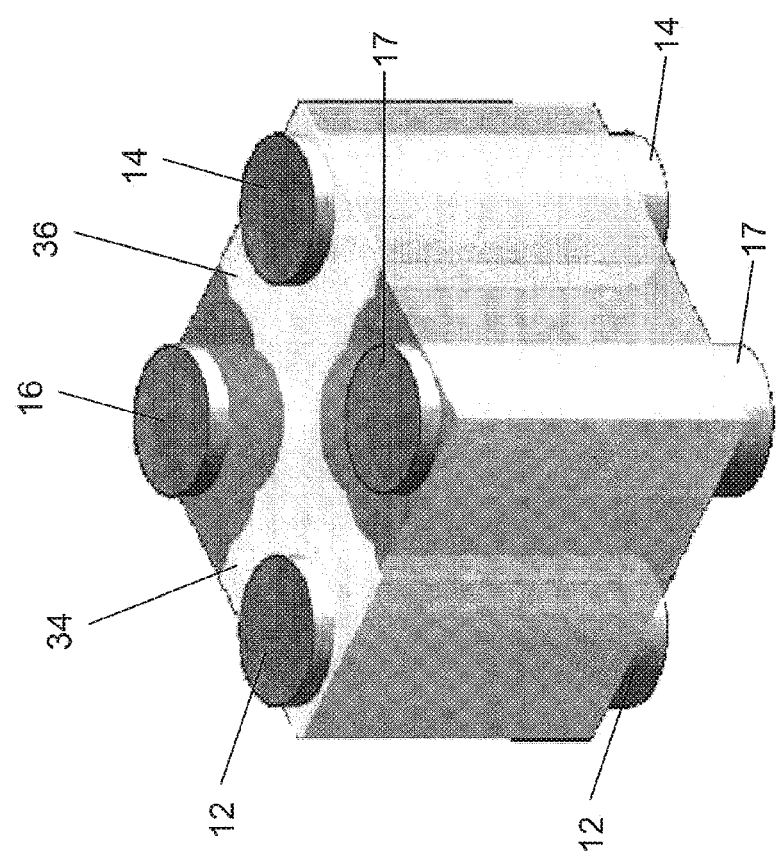

FIGS. 13 and 14 illustrate embodiments of a DuGaN VeSFET according to the present invention and having different contact configurations. In both figures the contacts are connected to the gate 16 regions and to opposite ends of the first semiconductor portion 32, such as the source and drain in the above-described embodiments. In FIG. 13, the contacts are surface contacts ("SC"), being electrically connected to a portion of the device. In FIG. 14, the contacts are "punch through" contacts ("PTC") or "via contacts" ("VC"), in which the contacts include an electrical conductor passing through a portion of the device. In the case of PTC or via contacts, the electrical conductor may be used to transmit electrical signals through the device, such as to locations above or below the device. In addition, the device may be effected by the signal passing through the device. For example, current may pass through the device and also charge a gate region of the device. In other embodiments, PTC may be used only to affect the device through which they are formed, such as to provide a desired voltage at a gate, without further transmitting the voltage or signal through the device and to another device. Alternatively, the signal on the PTC or via contact may have no effect on the device through which it passes. For example, the PTC may be insulated from the device through which it passes and the signal may be used at another device or location. Variations on these embodiments are also possible. For example, surface contacts may be placed both above and below the device, or only on one side. In other embodiments, the PTC may pass entirely through the device, or only partially through the device. Also, combinations of PTC and SC contacts may be used. In some embodiments, SC contacts may be used and current may be transmitted from one surface contact, through the device, to the other surface contact. Other combinations and variations may be used, such as a combination of one SC and a partial PTC contact.

Figure 15:
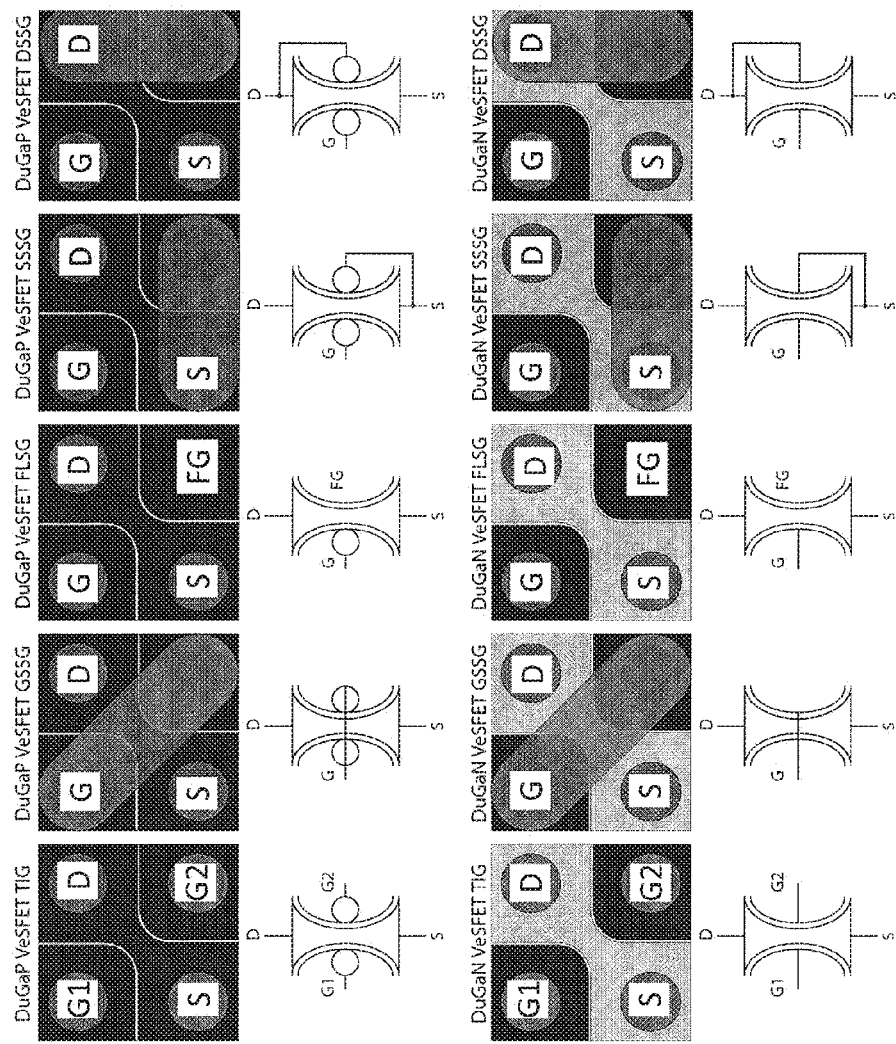

FIG. 15 illustrates embodiments of the present invention having different contact configurations and connections to form different variations of devices using the same basic structure and geometry. In some embodiments, the contacts are independently controlled, and in other embodiments two or more contacts are connected or shorted together. As a result, many configurations are possible with the present invention. For example, it is possible to tie one of the gates to the source or drain, to have independent gates, to tie one of the gates to the other gate, to allow one of the gates to "float", or to provide for other variations.

The top left embodiment is a DuGaP VeSFET TIG. The term "TIG" refers to a "two independent gate" configuration, in which the gates are not tied together and can be controlled separately. The second embodiment is a DuGaP VeSFET GSSG. The term "GSSG" refers to "gate-shorted second gate", in which one of the gates is shorted to the other gate and the gates are controlled together. The third embodiment is a DuGaP VeSFET FLSG. The term "FLSG" refers to a "floating second gate" in which one of the gates floats. This embodiment may be, for example, a memory device such as a flash memory device. The fourth embodiment is a DuGaP VeSFET SSSG. The term "SSSG" refers to "source-shorted second gate" in which one of the gates is shorted to the source of the device. The far right embodiment on the top row is a DuGaP VeSFET DSSG. The term "DSSG" refers to "drain-shorted second gate" in which one of the gates is shorted to the drain of the device. The bottom row of devices are analogous to the devices in the top row, except that the bottom row of devices are n-channel devices while the top row of devices are p-channel devices.

Figure 16:
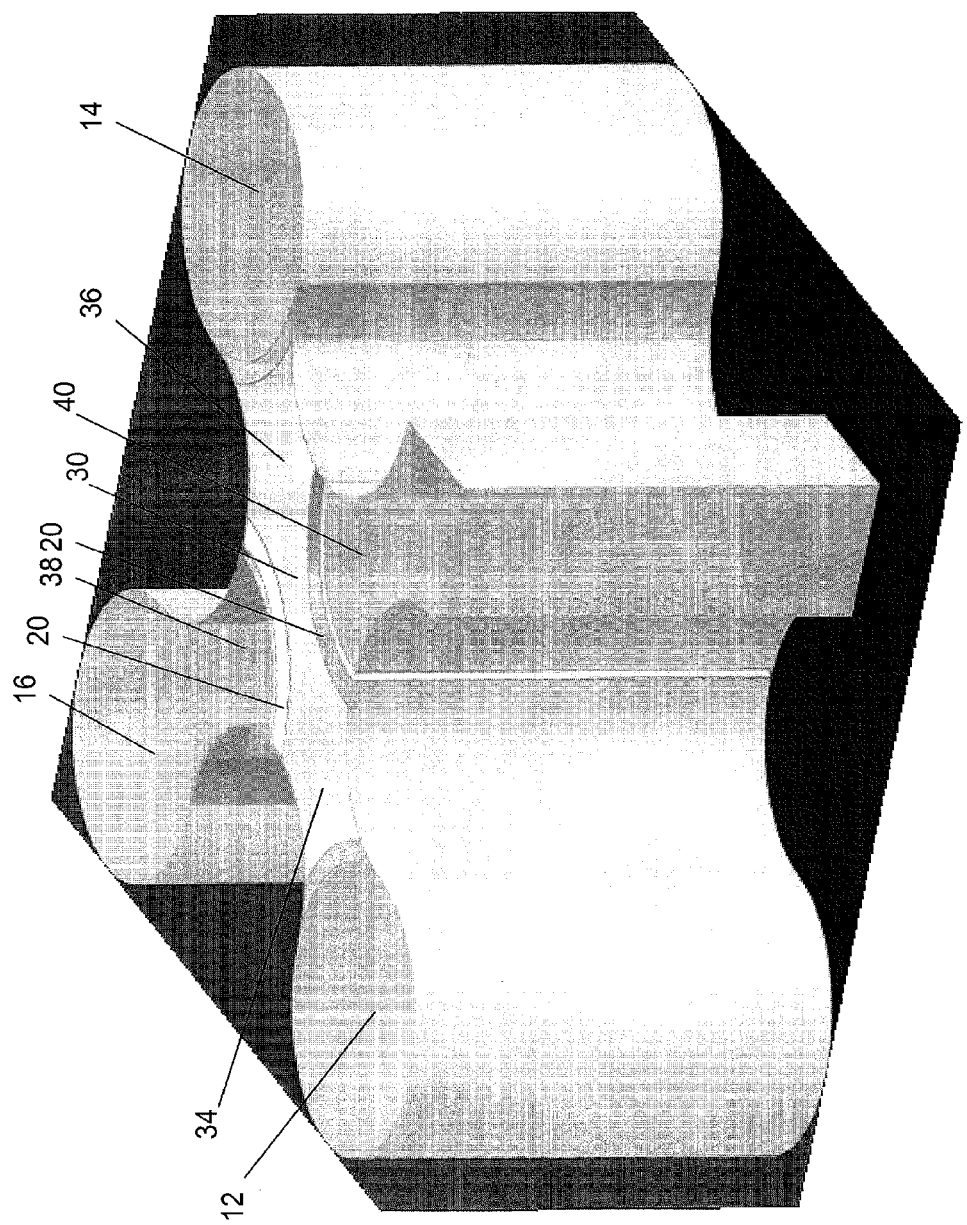

FIG. 16 illustrates a DuGaN VeSFET FLSG embodiment of the present invention in which one of the gates 40, or more specifically second portion, is "floating" and not connected to a terminal or other source of electrical potential. In other words, the floating gate 40 is completely surrounded by an electrical insulator 20. That electrical insulator 20 may be one or more separate insulators. For example, floating gate 40 may be partially surrounded by the oxide layer between the floating gate 40 and the first semiconductor portion 32, and the remainder may be surrounded by another oxide layer, or by semiconductor p-n junction, or by an electrical insulator 20 in the form of air or space between the floating gate 40 and other parts of the device 10 and other parts of other devices.

This embodiment of the present invention may be used, for example, as a memory device such as a flash memory device. In particular, the flow of current through the device, or more specifically through the first semiconductor portion 32, will result in "hot" electrons penetrating the thin oxide 20 of the floating gate 40, and that charge will accumulate over time in the floating gate 40. This accumulation of electrons in the floating gate 40 will effect the operation of the device. For example, the charge in the floating gate 40 will affect the threshold voltage of the device. The floating gate 40 described herein may take other shapes and forms. In addition, several examples of the present invention use floating gates 40 to store charge, although the floating gates 40 may be replaced with other structures for storing charge, and these structures can collectively be referred to as "charge storage nodes" 40.

In one embodiment, the charge on the floating gate 40 can leave the device permanently on, permanently off, or neither permanently on nor permanently off, depending on the charge on the floating gate 40. The amount of current passing through the device can also depend on the charge on the floating gate 40. Other factors can also be important, such as the potential on the working gate 38, or the gate which is connected to a source of electrical potential via a terminal 16, the potential difference between the source 12 and drain 14, the geometry of the device, and other factors. In another embodiment, the floating gate 40 is used to "condition" the device to operate in different ways, such as a non-linear resistor with resistance and other characteristics dependant on the charge of the floating gate. In other embodiments, the device can be used as a memory device. For example, the working gate can produce several different voltage levels, thereby allowing for multiple values to be stored and detected by the device. For example, if the working gate can produce no voltage, a first "on" voltage state (e.g., one volt) and a second "on" voltage state (e.g., two volts), then a total of three values may be stored and detected in the device. More or less values are possible when more or less voltages are applied by the working gate 38.

The present invention as a memory device has significant advantages over the prior art. For example, by not stacking the gates 38, 40, the working gate 38 is less affected by the charge in the floating gate 40. As a result, the device suffers less voltage drop between the working gate 38 and the first semiconductor portion 32, thereby allowing for more sensitivity and a greater operation range. In addition, the present invention also allows for improved charging and discharging characteristics. For example, charging and discharging may be performed at lower voltages because the voltage loss is lower in the present invention. Furthermore, the present invention may be used with terminal oxide. Terminal oxide is a high density oxide that can withstand higher voltages than the ONO oxide commonly used in conventional flash memory devices. In addition, terminal oxide is easier to produce than ONO oxide, resulting in reduced cost, increases yield, and increased performance.

Figure 17:
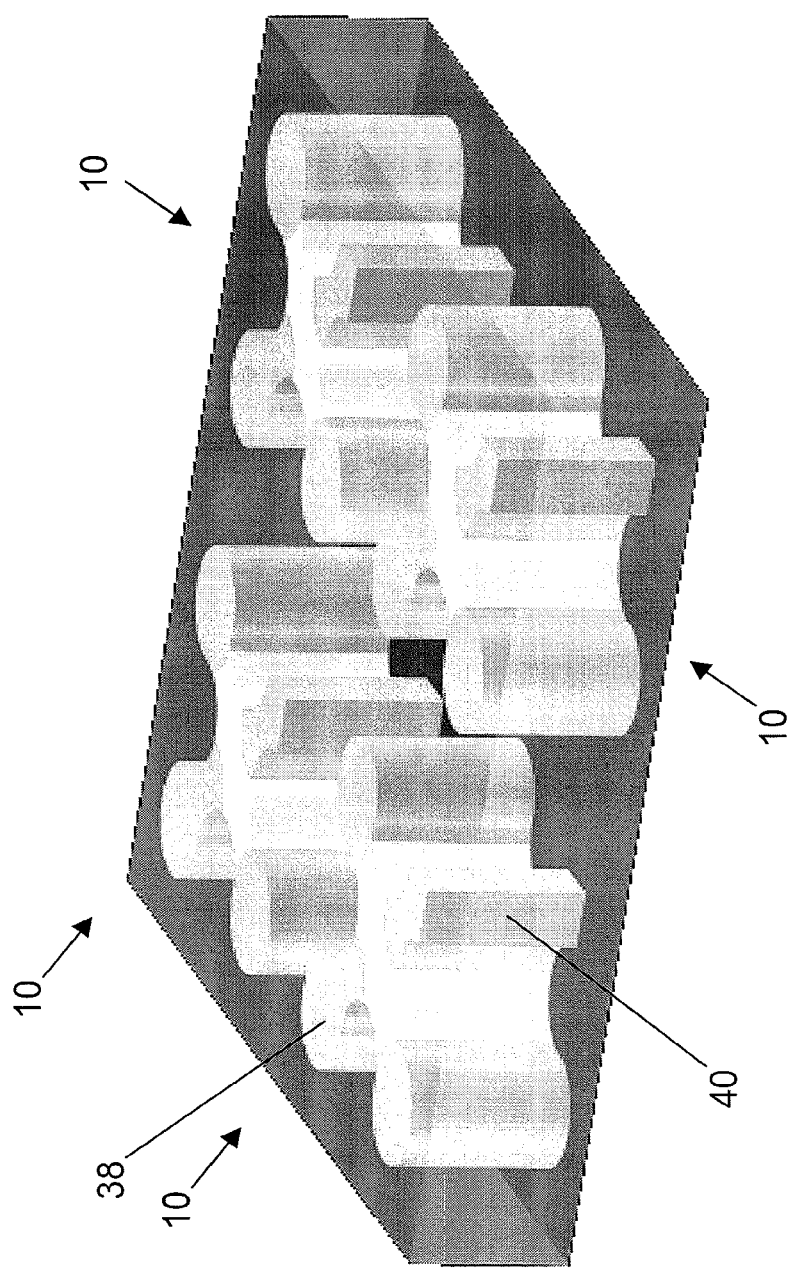
FIGS. 17-18 illustrate embodiments of the present invention as a memory device.
Figure 18:
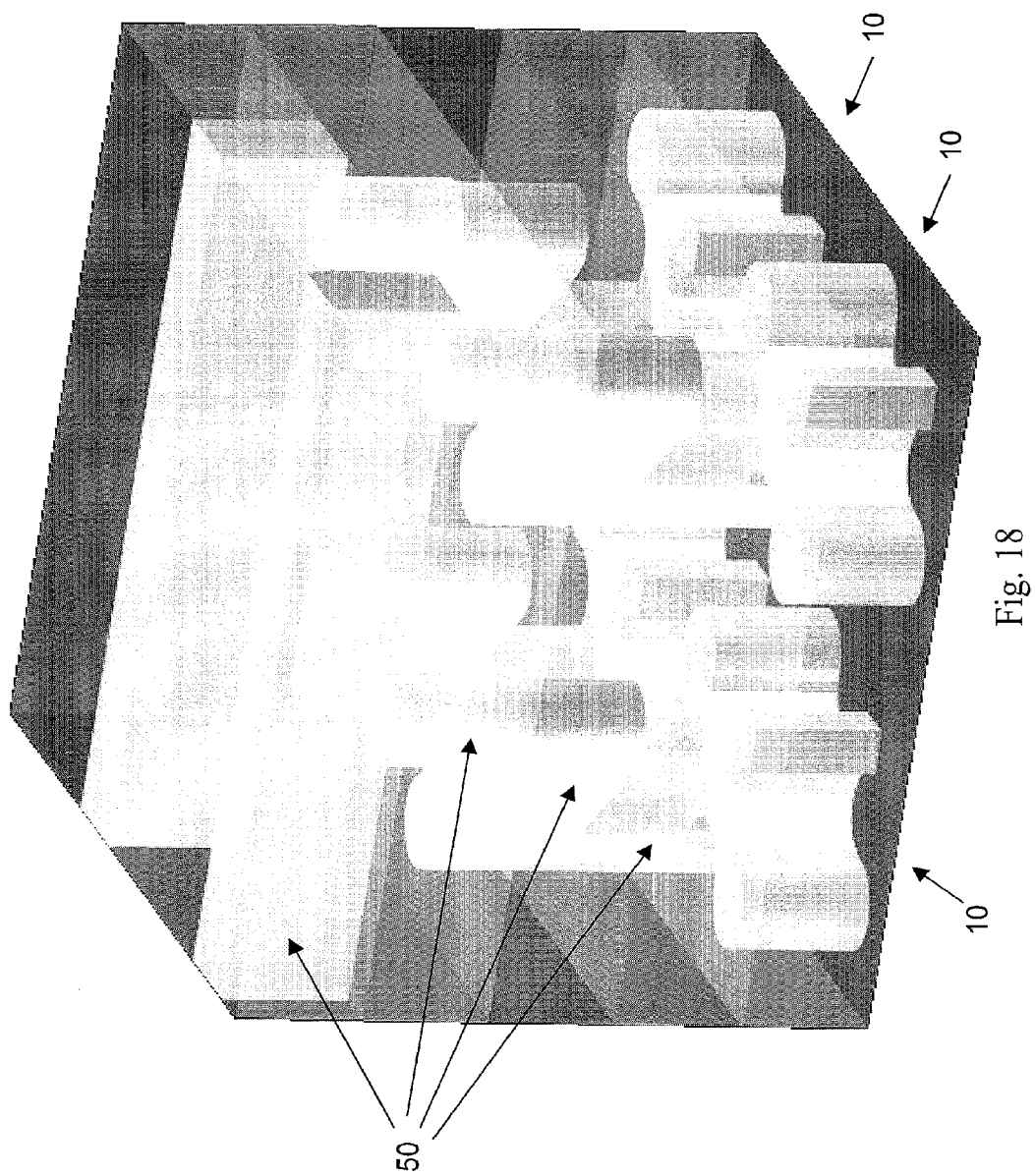

FIGS. 17 and 18 illustrate the present invention used as four EEPROM memory devices. FIG. 17 illustrates four memory devices 10, each with a floating gate 40 and a working gate 38, such as that illustrated in FIG. 16. In other embodiments, the devices 10 may be modified to be other than memory devices. For example, some of the devices 10 may be transistors, some of the devices 10 may be resistors, and some of the devices 10 may be memory devices, and those devices may be connected together to form an integrated circuit. In such an embodiment, the floating gates 40 may be changed to include a terminal for some of the devices such as described herein, but the basic structure for all devices 10 would be largely the same and would have a regular, repeating pattern for a variety of devices, allowing for easy fabrication.

FIG. 18 illustrates one embodiment of connecting the memory devices 10 to control lines or interconnects 50 for use in operating the memory devices 10. Additional connections are needed for fully functional devices, such as connections to the source and drain, and such connections may be made consistent with the teachings of the present invention and as is known in the prior art. The control lines or interconnects 50 may be connected to the top, the bottom, or both the top and the bottom of the devices 10. Although the devices in FIG. 18 are all memory devices 10, in other embodiments of the invention, different kinds of devices may be used together, such as memory devices, field effect transistors, bipolar junction transistors, resistors, and other devices all using the same basic structure described herein. The contacts or interconnects 50 can be used to connect the same or different kinds of devices 10 together in order to create an integrated circuit or other system or array.

Figure 19:
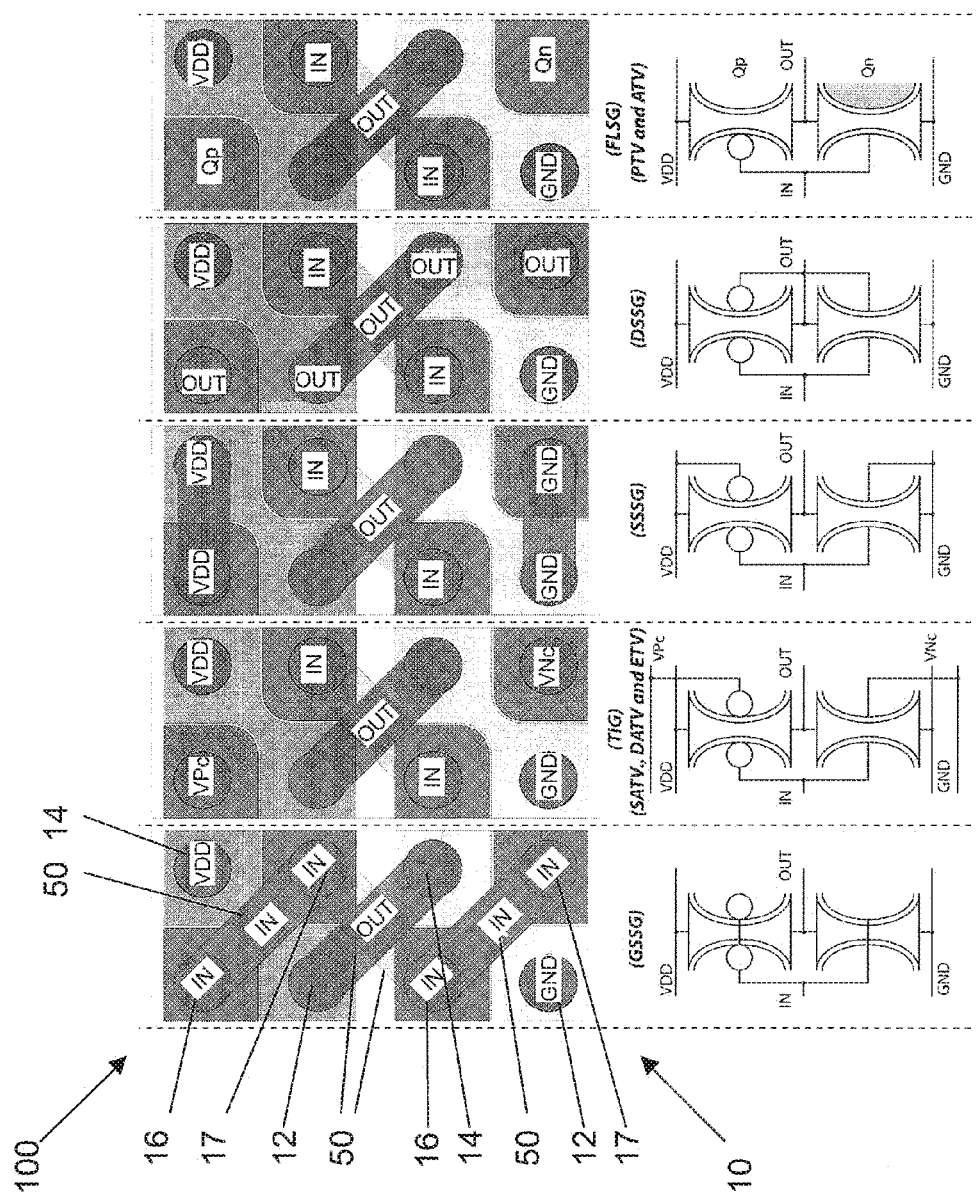
FIG. 19 illustrates various embodiments of the present invention.

FIG. 19 illustrates examples of different circuit embodiments possible with the present invention in CMOS-like configurations with the left-side gate from each device shorted together to form a single input. In each example two devices 10, 100 are connected together. The right side gates in each device 10, 100 can be shorted together, can float, or can be tied to or controlled by other signals. The two devices 10, 100 operate in a complimentary fashion to collectively to produce a single output signal. In addition, one device is connected to VDD and the other device is connected to ground. In other embodiments, more than two devices 10, 100 may be used, or devices may form larger structures or have other connections.

The first (far left) embodiment is a complimentary VeSFET circuit using a GSSG ("gate-shorted second gate") configuration. In other words, both gates of each device are shorted together and the gates for the two devices are also shorted together so that all of the gates in the complimentary VeSFET circuit respond to a single input signal. The circuit produces a single output in response to a single input at the gates.

The second embodiment is a complimentary VeSFET circuit using a TIG ("two independent gate") configuration. In other words, each device includes two gates which are independently controlled. In the illustrated embodiment the right gate on each device is separately controlled (VPC and VNC) to provide for an "adjustable threshold voltage" ("ATV") which can be independently controlled for each of the two devices. The adjustable threshold voltage may be static ("SATV") or dynamic ("DATV"), and in some embodiments the adjustable threshold voltages may be the same for all transistors, or it may be different. The adjustable threshold voltages may be used, for example, to change the operational characteristics of the circuit. For example, at certain times the device may operate as a low-leakage device with a high threshold voltage, and at other time the device may operate as a high-speed device with a low threshold voltage. In some embodiments the device may operate in an intermediate state with an intermediate threshold voltage. In some embodiments, the threshold voltage changes during operation, such as to change the device from a low-leakage device to a high-speed device, or vice versa, or to some intermediate state. These embodiments can be referred to as "dynamic adjustable threshold voltage" ("DATV") devices.

This embodiment also can be an "equalized threshold voltage" ("ETV") circuit. ETV allows for two or more devices to be set with the same threshold voltage, thereby allowing for tighter tolerances and better performance. One embodiment of providing for ETV will be described in the context of a plurality of devices, each having a working gate and a floating gate. The same voltage is applied to the working gates of the devices. At the same time, current is passed between the drain and the source of the devices. As this current flows between drain and source, some of the electrons passing through the devices will accumulate in the floating gates, thereby affecting the threshold voltage of the devices. As the electrons accumulate in the floating gates, the current flowing through the devices will decrease. Eventually, when sufficient charge has accumulated in the floating gates, the current will stop flowing. At that time, the voltage applied to the working gates will be the threshold voltage for the devices. Each device will be slightly different from the other devices, and each device will accumulate slightly different charge in its floating gate, and each device will stop the flow of current at a different time. Nonetheless, when the current has stopped flowing through all of the devices, then all of the devices will have the same threshold voltage.

The ETV process may be accomplished in several ways. For example, the gates of the devices may be connected together and a single voltage applied to all gates. This may be done during the fabrication of the devices, such as by forming a metal layer to connect all of the working gates together. In that case, after the ETV process is complete, the connection of the gates may be reversed, such as with an etching process and/or a CMP process. Thereafter, the fabrication of the devices may proceed to completion. In another embodiment, the ETV process may be performed without special fabrication processes, such as by applying voltages to the working gates and passing current through the devices via normal operation of the devices.

The third embodiment is a complimentary VeSFET circuit using a SSSG ("source-shorted second gate") configuration. In other words, the right side or "second gates" on each device are tied to the source of each device.

The fourth (far right) embodiment is a complimentary VeSFET circuit using a DSSG ("drain-shorted second gate") configuration. In other words, the right side or "second" gates on each device are tied together and to the output. In this embodiment the output of the circuit also controls the signal on the right side or "second" gates.

The fifth embodiment is a complimentary VeSFET circuit using a FLSG ("floating second gate") configuration. In other words, the right side or "second" gates are floating. In this embodiment, both devices are also PTV ("programmable threshold voltage") devices and ATV ("adjustable threshold voltage") devices. In other words, the second gates can be provided with a charge to program or adjust the threshold voltage of the particular device. The floating gates may be charged, for example, with an e-beam or with other means. In some embodiments the floating gates can be discharged, for example with the application of ultraviolet light, and then re-charged.

As used herein, PTV will refer to the process of programming a threshold voltage of a device to achieve a desired characteristic from the device. For example, one or more devices may be programmed to be in particular states, such as to route current in a particular path, to perform logic operations on signals, or to perform other functions. The programmed devices may be permanently programmed or they may be capable of reprogramming at a later time.

As used herein, ATV will refer to the process of adjusting a threshold voltage to achieve a desired characteristic from the device. ATV differs from PTV in that ATV is a more active, less permanent process, such as where one or more separate inputs are used to bias one or more second gates to desired states.

The present invention also includes a design style. One element of that design style is connections on both sides of the device. These connections can be used in many ways, such as for local interconnections or for other purposes. The use of connections on both sides of the device allows for greater interconnect densities per device and/or for simplification of stacked interconnect layers.

Another design element of the present invention is the use of multi-sided contacts, such as illustrated in FIG. 14. The multi-sided contacts can be used with connections on both sides of the device, such as to pass signals from one side of a layer of devices to the other side.

Another design element of the present invention is the use of metal interconnect layers on opposite sides of a device and oriented orthogonally to each other. One example is illustrated in FIG. 19 in which interconnect lines on top of the device run diagonally in the figure from top-left to bottom-right, and the interconnect lines on the bottom of the device run diagonally in the figure from bottom-left to top-right in the figure. This arrangement allows for efficient designs in which devices have small footprints or areas, thereby allowing for higher densities and for more devices to be fabricated on a given area. The present invention also allows for shorter interconnect distances, further simplifying the devices and improving operation.

One or more of these design elements may be used together according to the present invention. It is not necessary to use all design elements in order to realize benefits of the present invention.

Many variations of the present invention are possible, including more or less contacts, more or less regions and components, and different arrangements. For example, in some embodiments a single gate may be used, or more than two gates may be used. In other embodiments a single contact may be electrically connected to more than one region, such as a single contact controlling more than one gate. In some embodiments the contacts are connected to the surface, such as the surface of a gate region or the surface of a first semiconductor portion. In other embodiments, the contact may be connected to or form part of a larger electrical conductor, such as a conductor running through part of all of the semiconductor device. In some embodiments, an electrical conductor extends from one surface, through the device, and through another surface of the device. In those embodiments, for example, the electrical conductor may be used not only to impart an electrical potential or to carry an electrical current to or from the device to which it is connected, but it may alternatively or additionally act as a via or interconnect for another part of the device or for another device altogether.

An exemplary method of fabricating a device according to the present invention will be described beginning with FIG. 20. This embodiment will illustrate the fabrication of an SOI device, although in other embodiments the process may be used to produce devices with non-insulating substrates.

Figure 20:
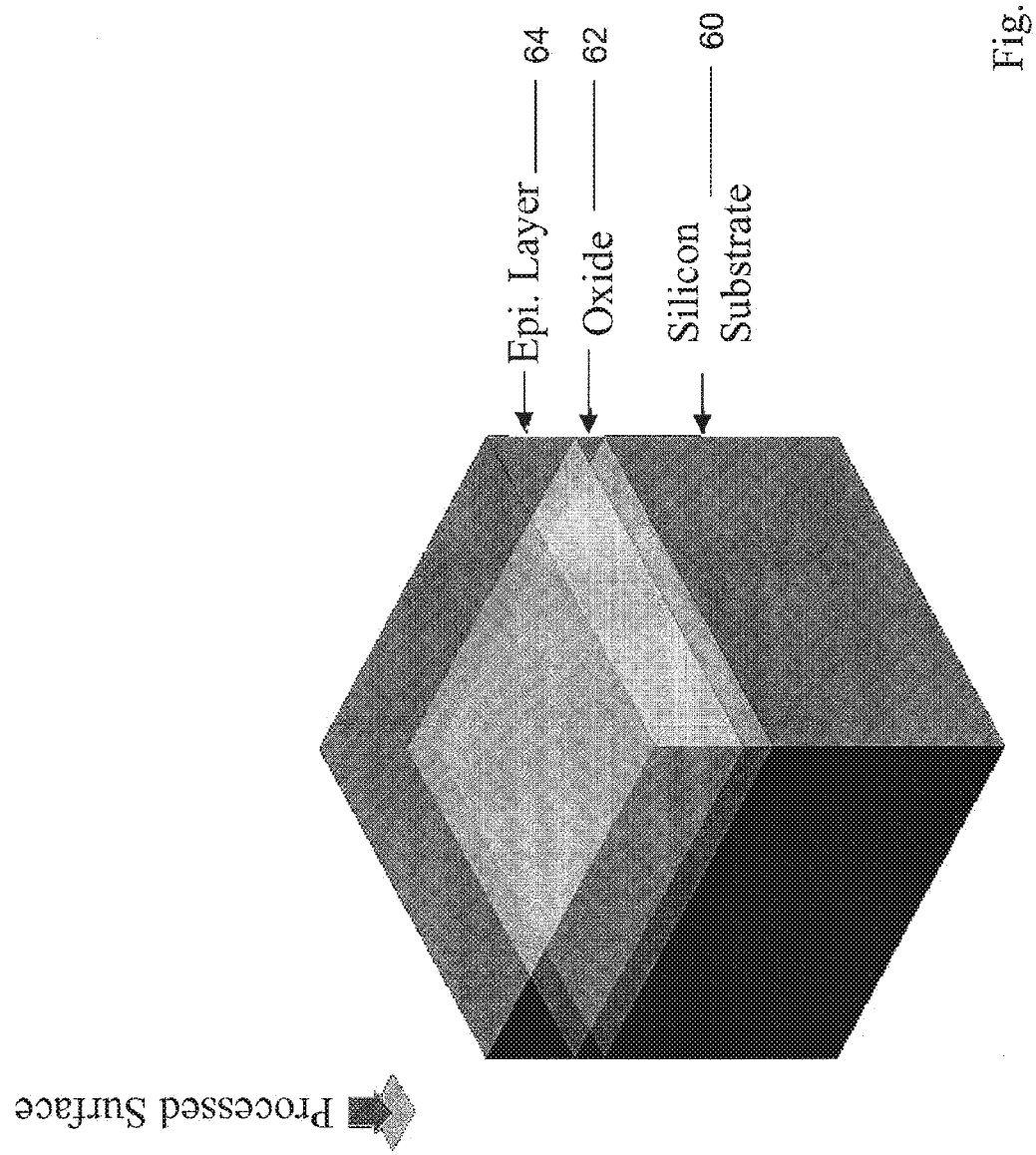

FIG. 20 illustrates a silicon substrate 60 on which an insulator of silicon dioxide 62 is formed, and on which an epitaxial semiconductor layer 64 is located. This structure will be the starting point for the fabrication of a device according to the present invention. Although the present invention will be described in term's of an SOI structure, other structures and technologies may be used, such as silicon substrates without insulators.

FIG. 21 illustrates the formation of n-wells and p-wells in the semiconductor layer 64. The p-wells may be formed, for example, through Boron implantation. In this embodiment, the semiconductor layer 64 is n-doped and forms n-wells in locations where there has not been Boron implantation. FIG. 22 illustrates one embodiment of a mask that may be used to form the p-wells.

Figure 24:
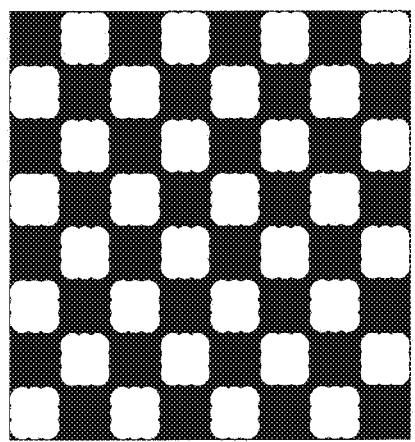
Figure 23:
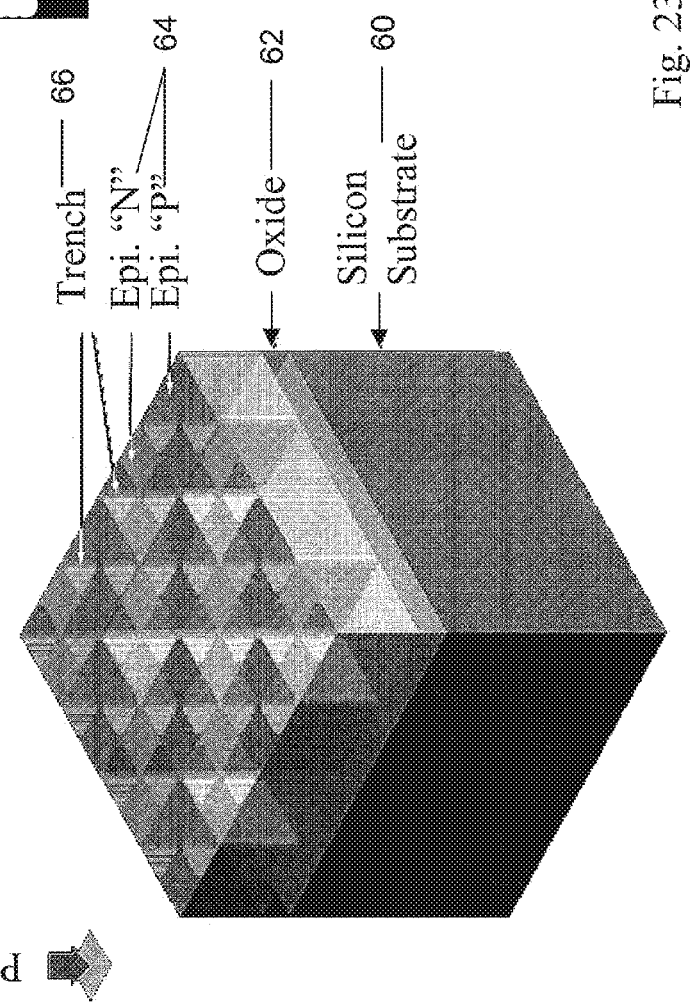

FIG. 23 illustrates the formation of electrode trenches 66 in the semiconductor layer 64. The electrode trenches 66 may be formed, for example, by etching the semiconductor layer 64. FIG. 24 illustrates one embodiment of a mask that may be used in the etching process.

After etching the electrode trenches 66, steps of lithography, oxide deposition, and out-diffusion may be performed to create n-doped and p-doped regions, which may be used in the fabrication of active devices.

Thereafter, gate oxide (GOX) may be formed on selective walls of the electrode trenches 66. The gate oxide may be used to electrically insulate gate regions from the bulk semiconductor region. The gate oxide may be formed with the steps of oxidation, lithography, and etching.

Figure 25:
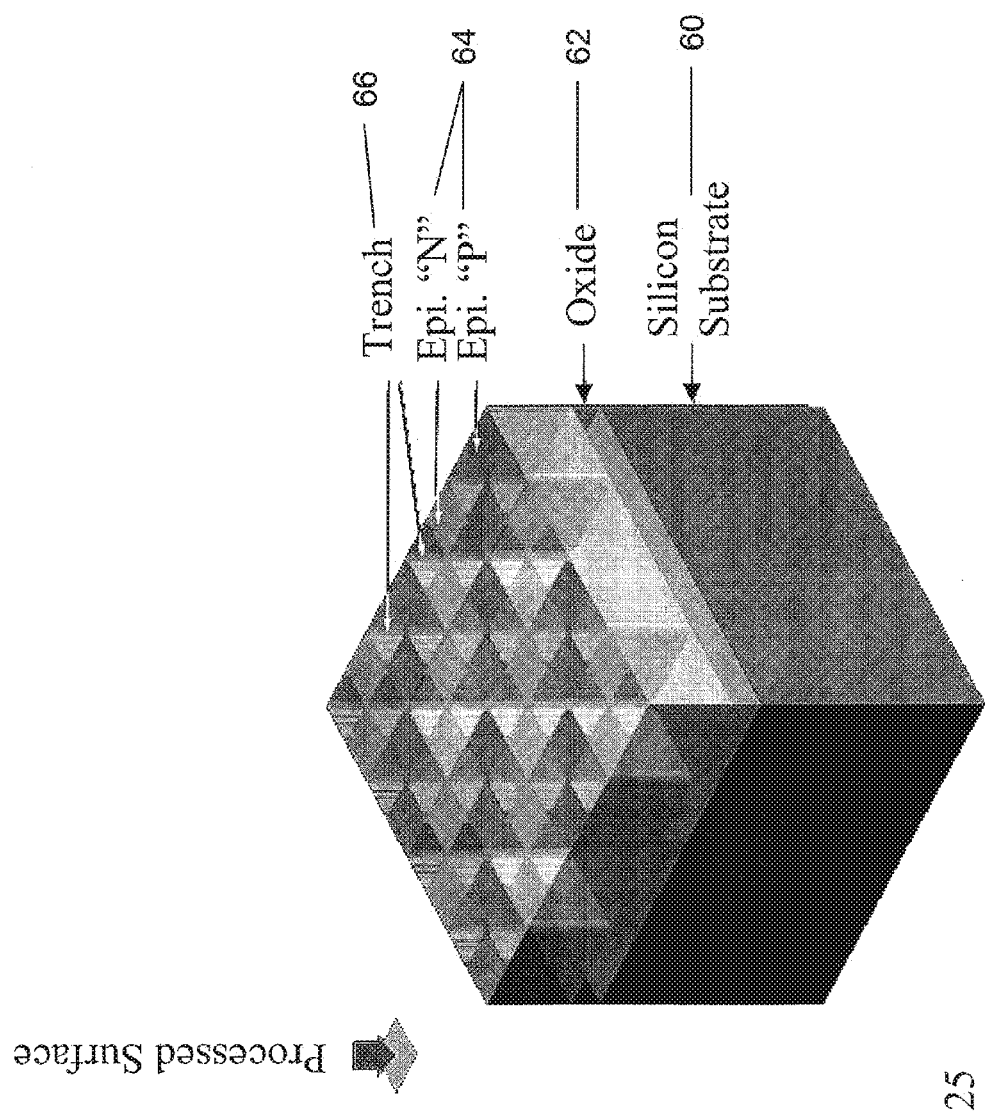

FIG. 25 illustrates doping of the walls of the electrode trenches. This may be accomplished, for example, by growing a sacrificial oxide (SOX) layer covering both the trench walls and the surface of the semiconductor layer. Thereafter, a lithography step for n diffusion is performed, followed by removal of the SOX, and the deposition of Arsenic-doped oxide. A step to drive-in the Arsenic is then performed, followed by removal of the Arsenic-doped oxide. Thereafter, the process may be repeated for the n+ dopant. For example, another SOX layer is grown, followed by lithography for the n+ diffusion, removal of the SOX, deposition of Arsenic-doped oxide, drive-in of the Arsenic, and removal of the As-doped oxide. The process steps may be repeated for the p and p+ dopants. In those steps, different lithography may be used to correspond to the different regions that will receive the p and p+ dopants, and different dopants may be used, such as Boron in place of Arsenic.

Figure 27:
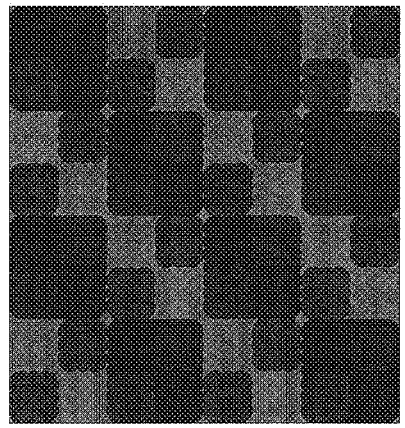
Figure 26:
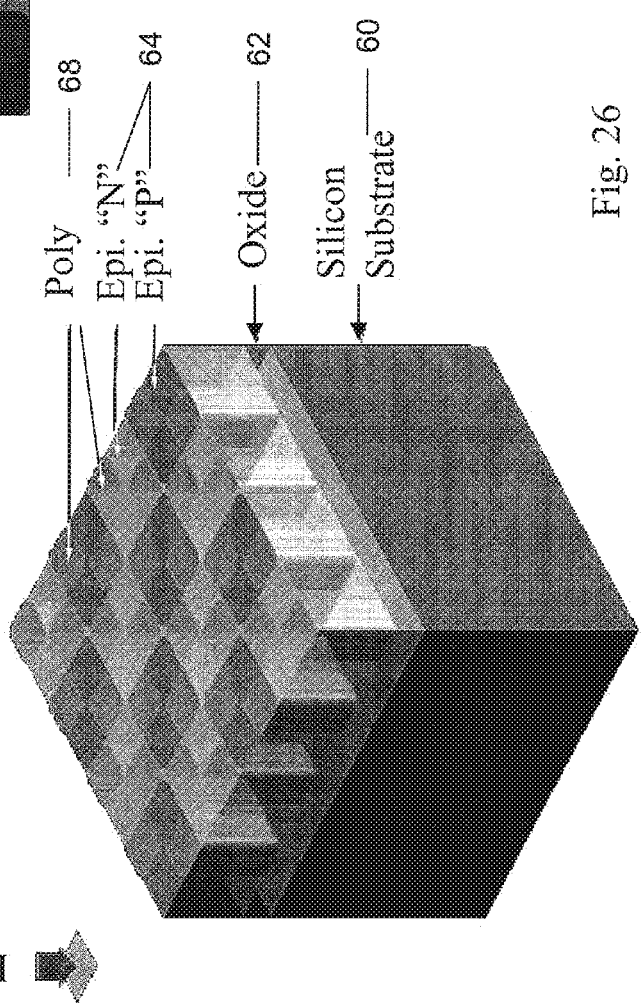

FIG. 26 illustrates the deposition of polysilicon 68 in the trenches. Thereafter, the surface may be subject to a chemical-mechanical polishing ("CMP") step to smooth and planarize the surface of the device. FIG. 27 illustrates a top plan view of the devices at this stage of fabrication. There is no physical barrier between the devices at this point.

Figures 28, 29:
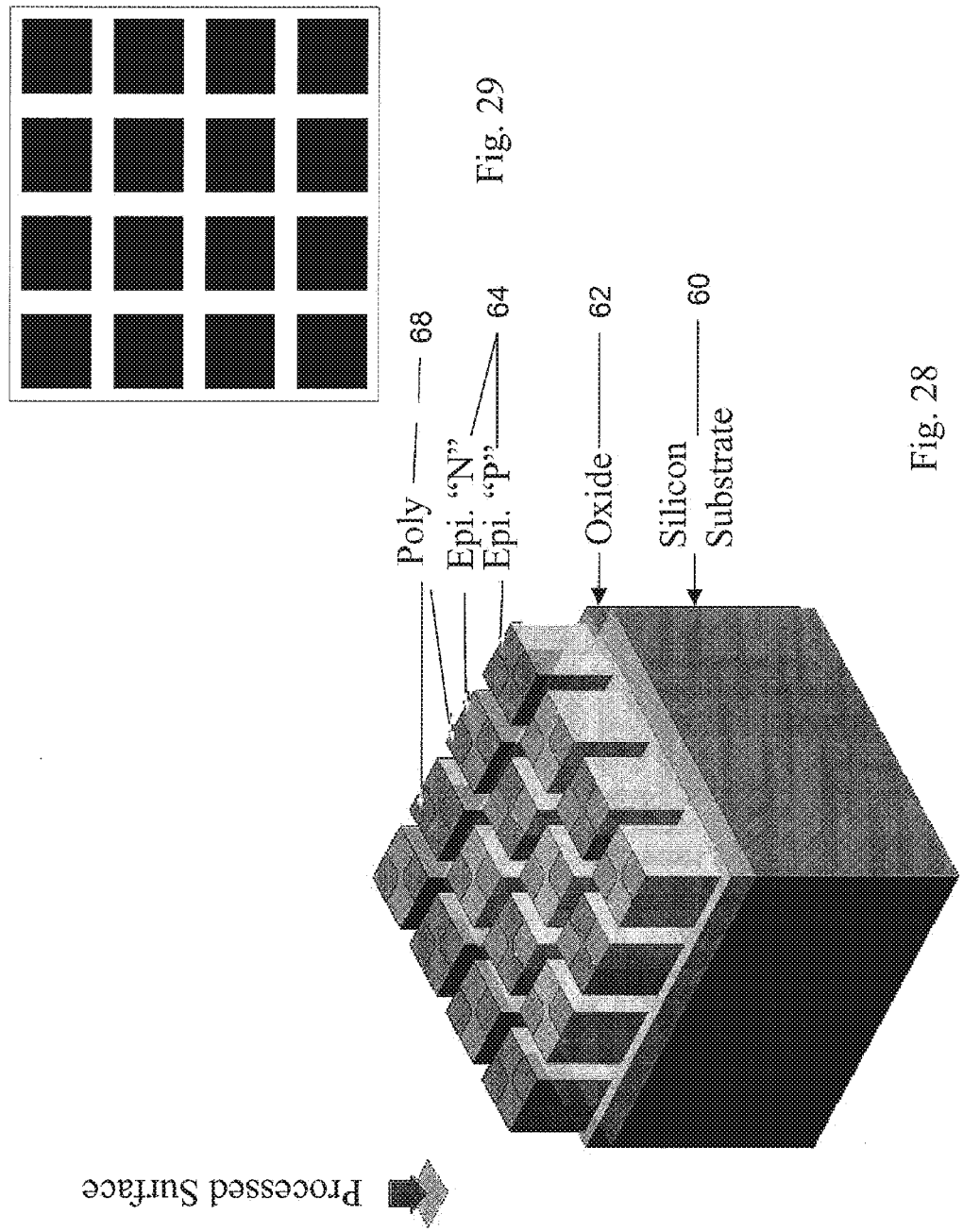

FIG. 28 illustrates the formation of a trench around individual devices. For example, a lithography step may be performed followed by etching to form the trenches. FIG. 29 illustrates one embodiment of a mask that may be used in this process.

FIG. 30 illustrates the formation of high density plasma ("HDP") oxide 70 and the subsequent formation of an oxide layer. After the formation of the HDP 70, a CMP step may be performed to provide for a suitable surface on which to form the oxide layer. FIG. 31 illustrates a top plan view of the devices at this stage of fabrication. There is now a physical barrier between the devices in the form of HDP in the trenches previously formed around the devices.

Figures 32, 33:
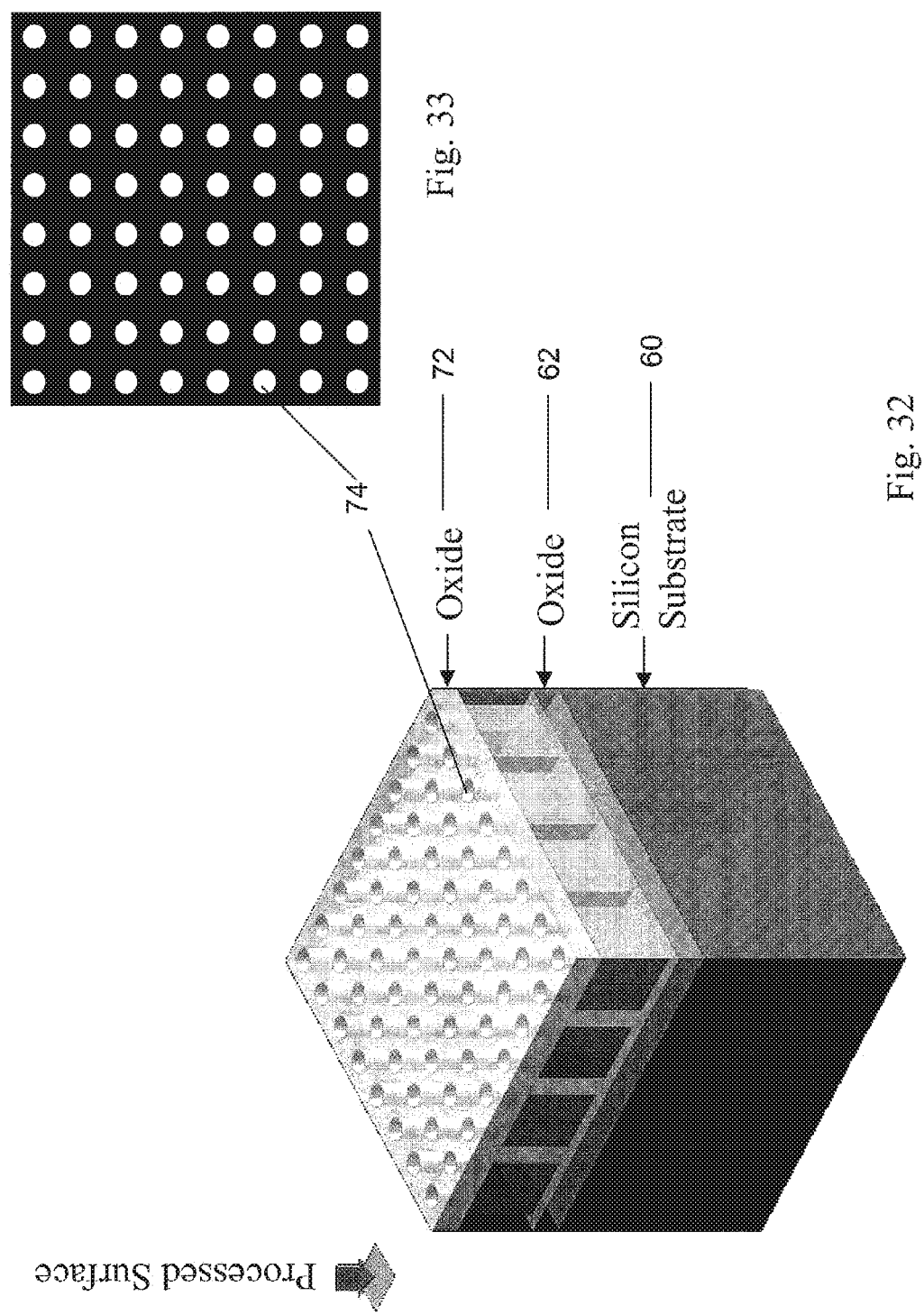

FIG. 32 illustrates the formation of contacts 74 for the devices. The formation of the contacts 74 may include the steps of depositing an inter layer dielectric ("ILD") layer 72, lithography for the contacts, etching the contacts, deposition of a barrier, and deposition of the contact materials (such as Tungsten via a chemical vapor deposition ("CVD") process). After deposition of the contact material, a CMP step may be performed to create a surface suitable for further processing. Thereafter, a barrier may be deposited. FIG. 33 illustrates one embodiment of a mask that may be used for the lithography of the contacts.

Figure 34:
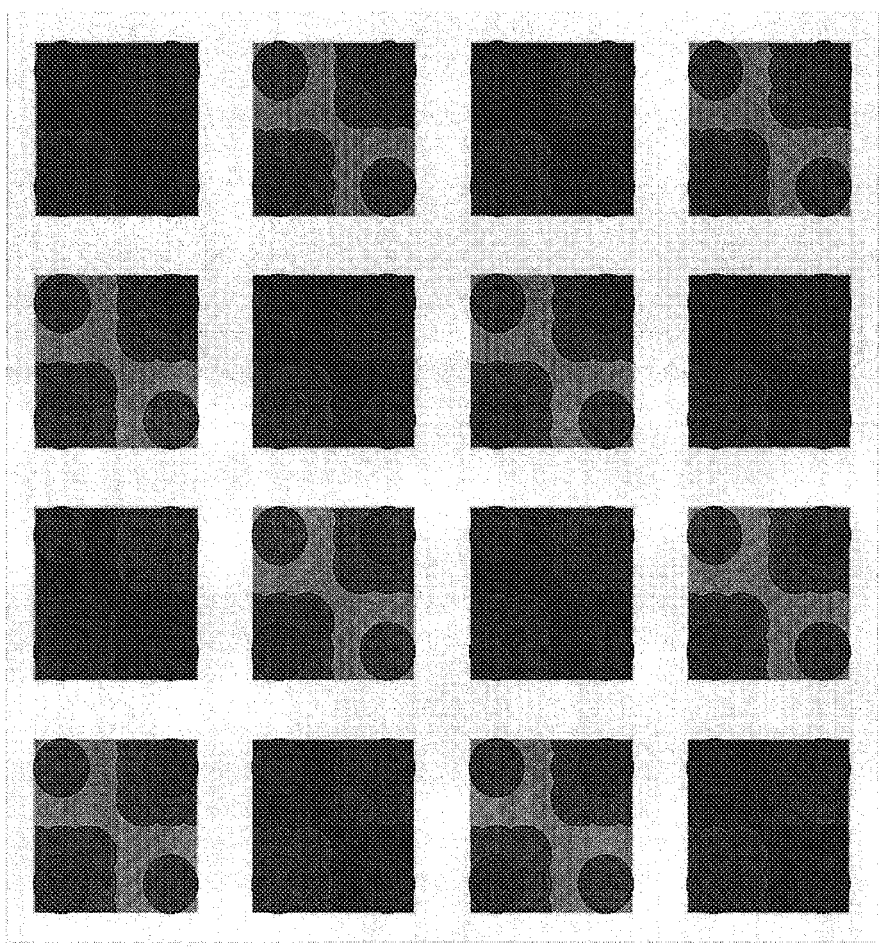

FIG. 34 illustrates a top plan view of the devices at this stage. Contacts now exist on the various parts of the devices.

FIG. 35 illustrates the formation of a barrier 76 for use in forming connections between and within devices. That formation may include the steps of depositing an ILD layer, performing an "upper" metal 1 lithographic process, etching, and barrier etching. FIG. 36 illustrates one embodiment of a mask that may be used in the lithographic process.

FIG. 37 illustrates the formation of metal 1 connections 78. That formation may include the steps of depositing a barrier/seed, the formation of a metal layer (such as via copper electro plating), and barrier deposition. Thereafter, a CMP step may be performed to produce a surface suitable for further processing. FIG. 38 illustrates a top plan view of the device at this stage. The metal 1 connections are visible.

Figure 39:
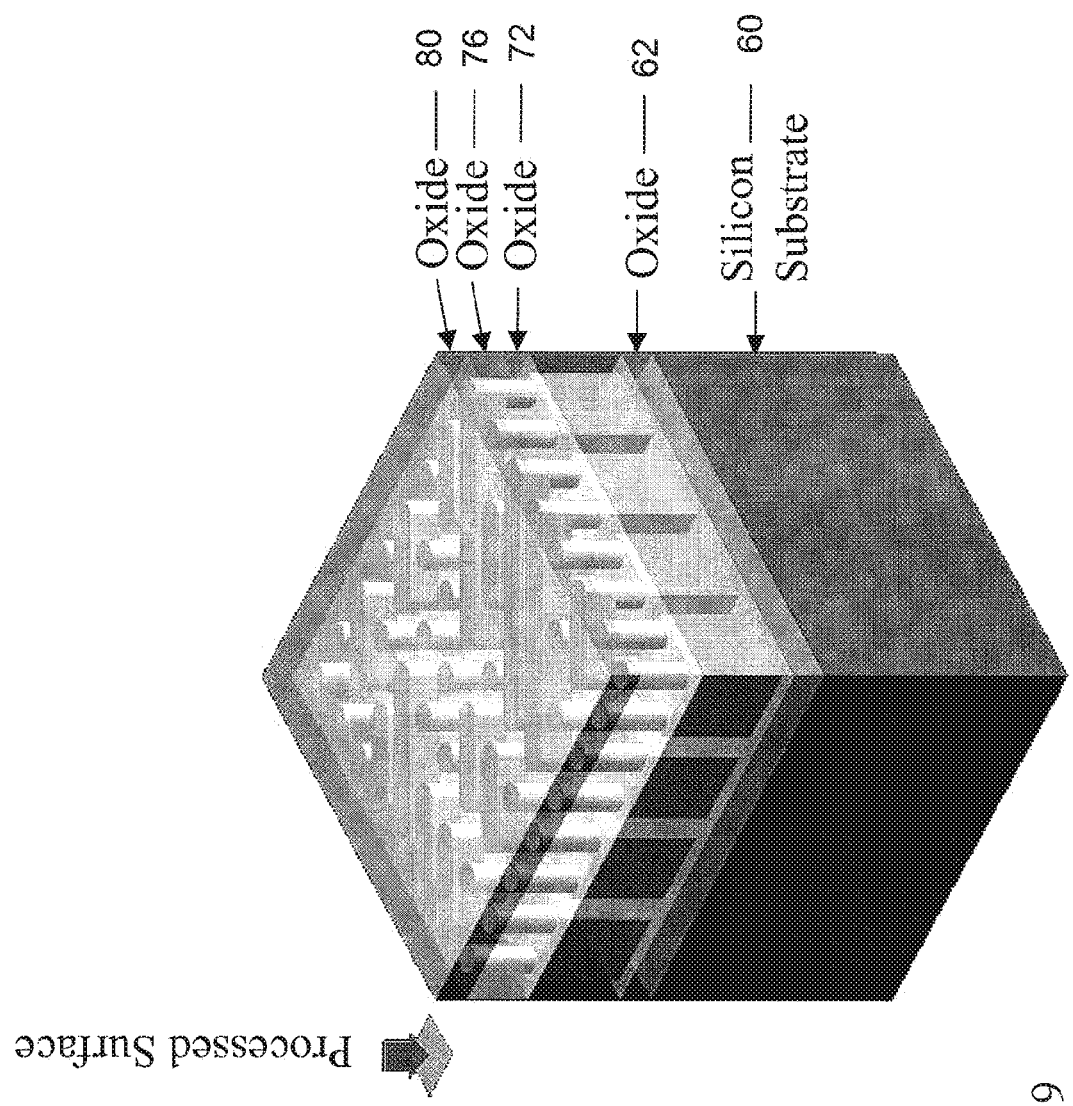

FIG. 39 illustrates the formation of an ILD layer 80 on top of the metal 1 connections. At this point, additional devices may be formed on top of the devices just completed. For example, two or more layer of devices may be formed, and they may operate independent of each other or they may be connected and interact with each other.

Figure 40:
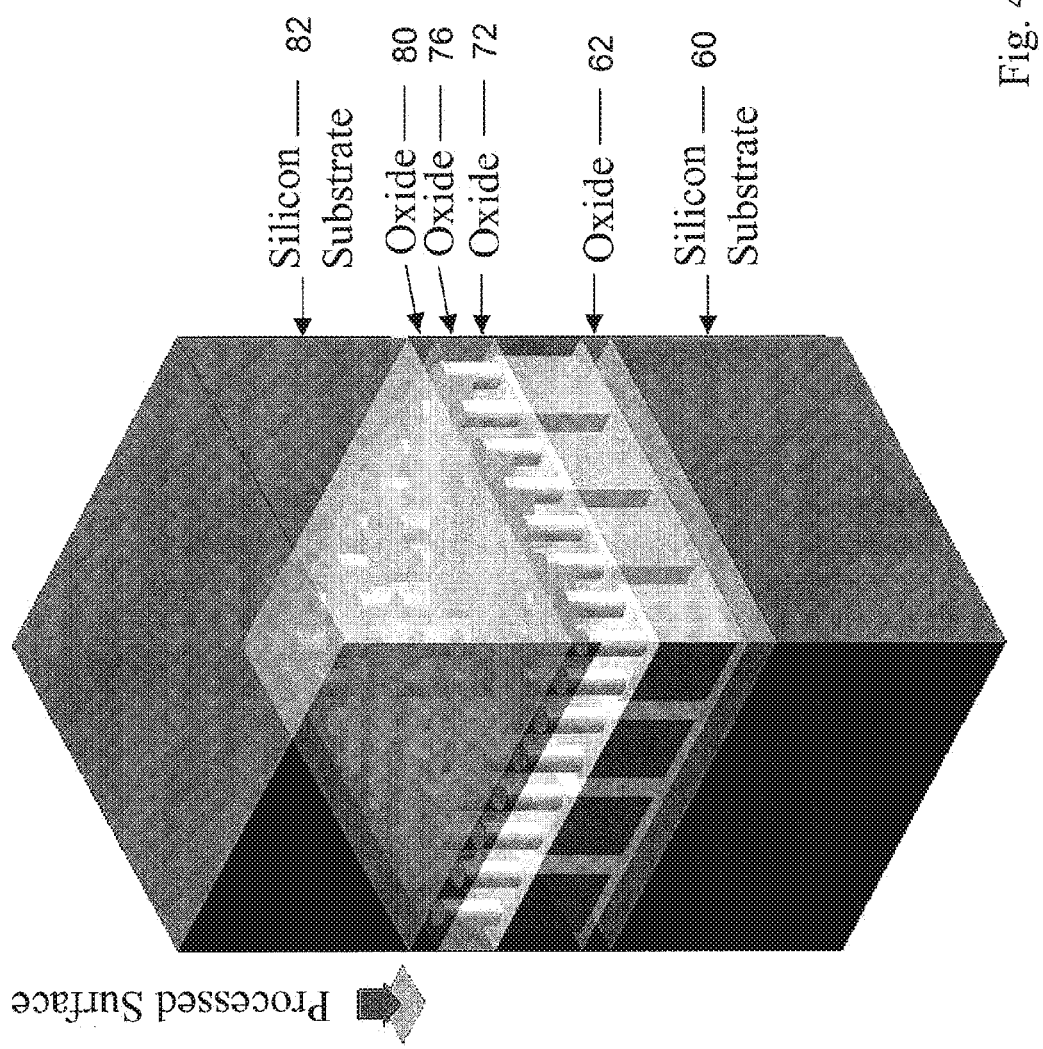

FIG. 40 illustrates the formation of new substrate 82 on top of the devices already formed. The new substrate 82 may be to protect or insulate the devices, or to provide a barrier or buffer for additional devices which may be formed. Alternatively, the new substrate 82 may not be formed if other provisions are taken to protect the device.

Figure 41:
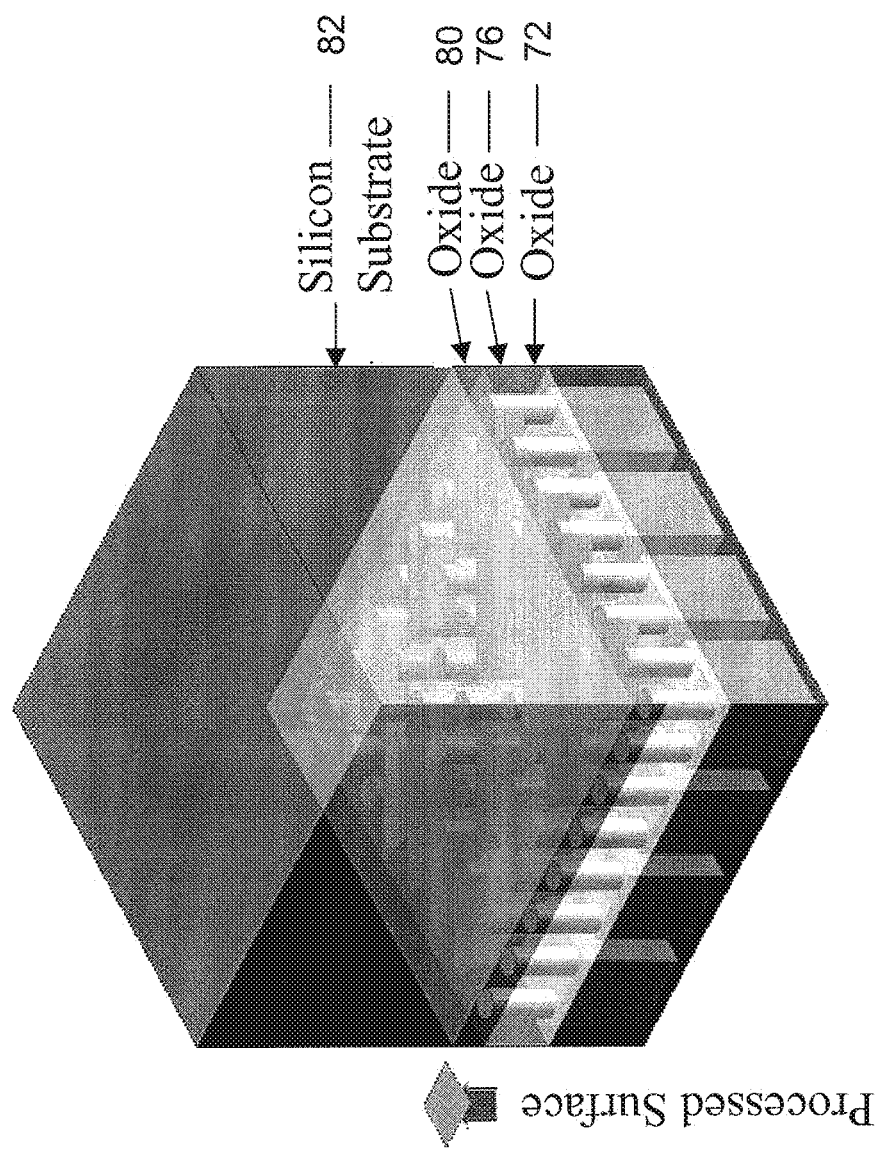

FIG. 41 illustrates the beginning of process steps on the bottom side of the devices. A CMP process may be performed to prepare the bottom surface for further processing and to remove material from the bottom so that the active devices may be further processed. In other embodiments, the present invention is practiced without processing the bottom side.

Figure 43:
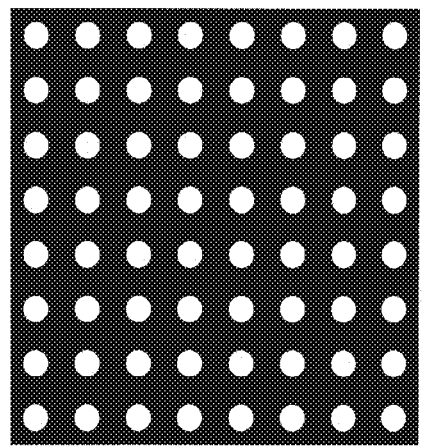
Figure 42:
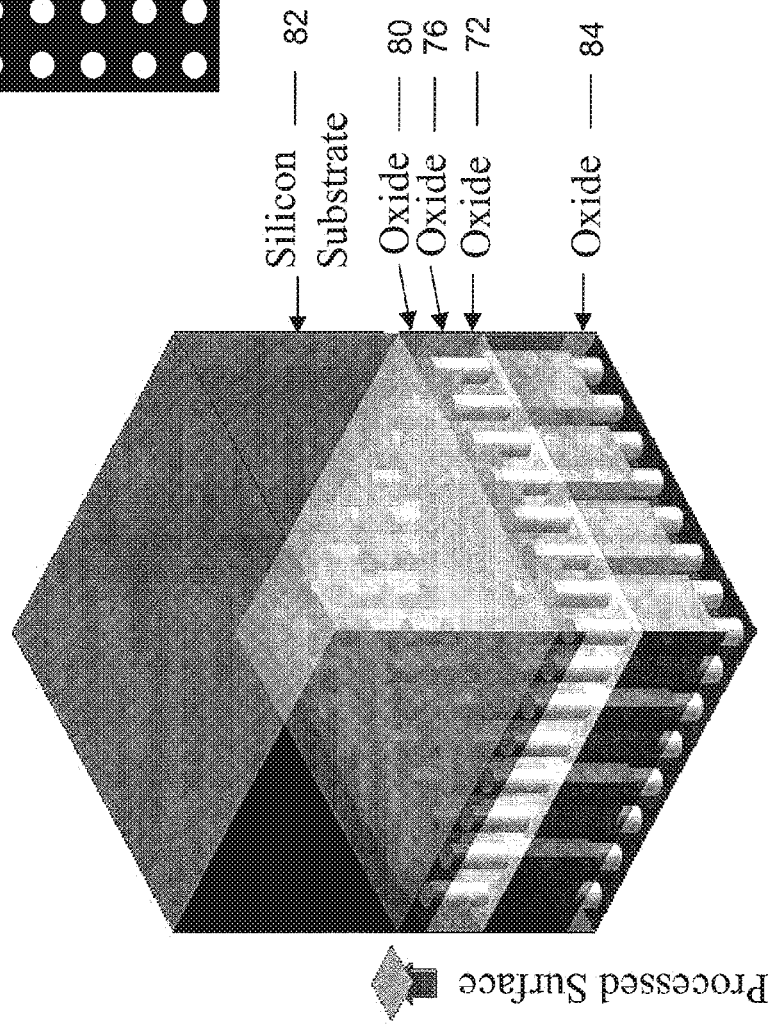

FIG. 42 illustrates the formation of contacts on the bottom of the devices. These steps are analogous to the steps illustrated in FIGS. 30 and 32, beginning with the formation of the oxide layer in FIG. 30 through the formation of barrier in FIG. 32. An oxide layer 84 is shown in which contacts are formed. FIG. 43 illustrates one embodiment of a mask that may be used in the formation of the contacts.

FIG. 44 illustrates the formation of "lower" metal 1 on the bottom of the devices. These steps are analogous to the steps illustrated in FIGS. 32-39. Variations in the steps are possible, such as using a different metal 1 mask (for example, a "lower" metal 1 mask) in order to make different connections. An corresponding oxide layer 86 in which the lower metal layer is formed is illustrated. FIG. 45 illustrates one embodiment of a mask that may be used to form the "lower" metal 2 layer.

Thereafter, additional devices may be formed below the devices just completed. For example, two or more layer of devices may be formed, and they may operate independent of each other or they may be connected and interact with each other. Furthermore, additional steps analogous to those described with respect to FIG. 32 may be performed to form more conventional integrated circuit interconnects including input/output pads. These connections may be formed on the top, the bottom, or both sides of the devices.

Figure 47:
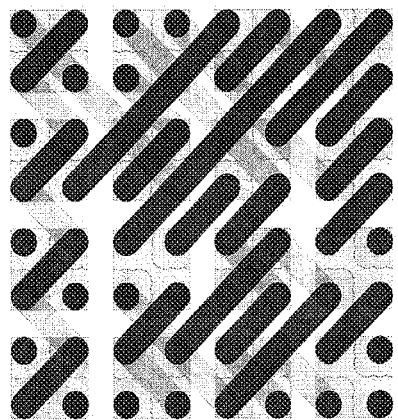
Figure 46:
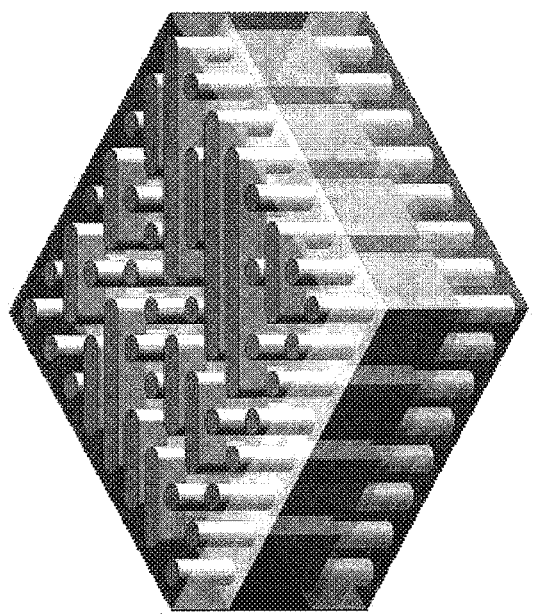

FIG. 46 illustrates the devices 88 with the "upper" metal 1 90 and "lower" metal 1 92 features. These devices 88 may operate as a field effect transistor, with one or both of the polysilicon regions acting as the gate to control current flowing through the narrow region between the two larger regions of silicon. When an appropriate voltage is applied to the polysilicon regions, a conductive channel will form in the narrow silicon region between the two polysilicon regions. This conductive channel will allow current to flow between the large square silicon regions. When the proper voltage is not present at the polysilicon regions, the narrow region of silicon will be a high resistance element preventing the flow of current between the larger silicon regions. FIG. 47 illustrates a top plan view of the layout illustrated in FIG. 46.

Many variations are possible when making devices according to the present invention. For example, the present invention has been illustrated with only a single metal layer on each side. In other embodiments, more than one metal layer may be used on each side of the devices 88. In addition, the present invention described only a single layer of active devices 88 and associated metal and other layers. However, multiple layers of devices 88 may be used with the present invention. For example, the structure described and illustrated in FIG. 46 may be formed and then attached onto a similar structure, thereby forming stacked layers of devices 88. More than two layers of devices 88 may be stacked to form very dense structures. Communication with and between the layers of devices 88 and between devices within a given layer may be accomplished with connections at the metal layers or in some other outer layer, generally known as interconnects. For example, connection terminals or pads may be formed at the metal layer or in some other outer layer, and pads or connections from one device may be aligned with pads or connections from an adjacent device so that communication is possible between layers of devices. Other variations are also possible. For example, pads or connections may be formed on the outer edge of the structure, so that each layer of devices may communicate independent of the layers of devices adjacent to it. Combinations of communications paths are also possible.

Figure 48:
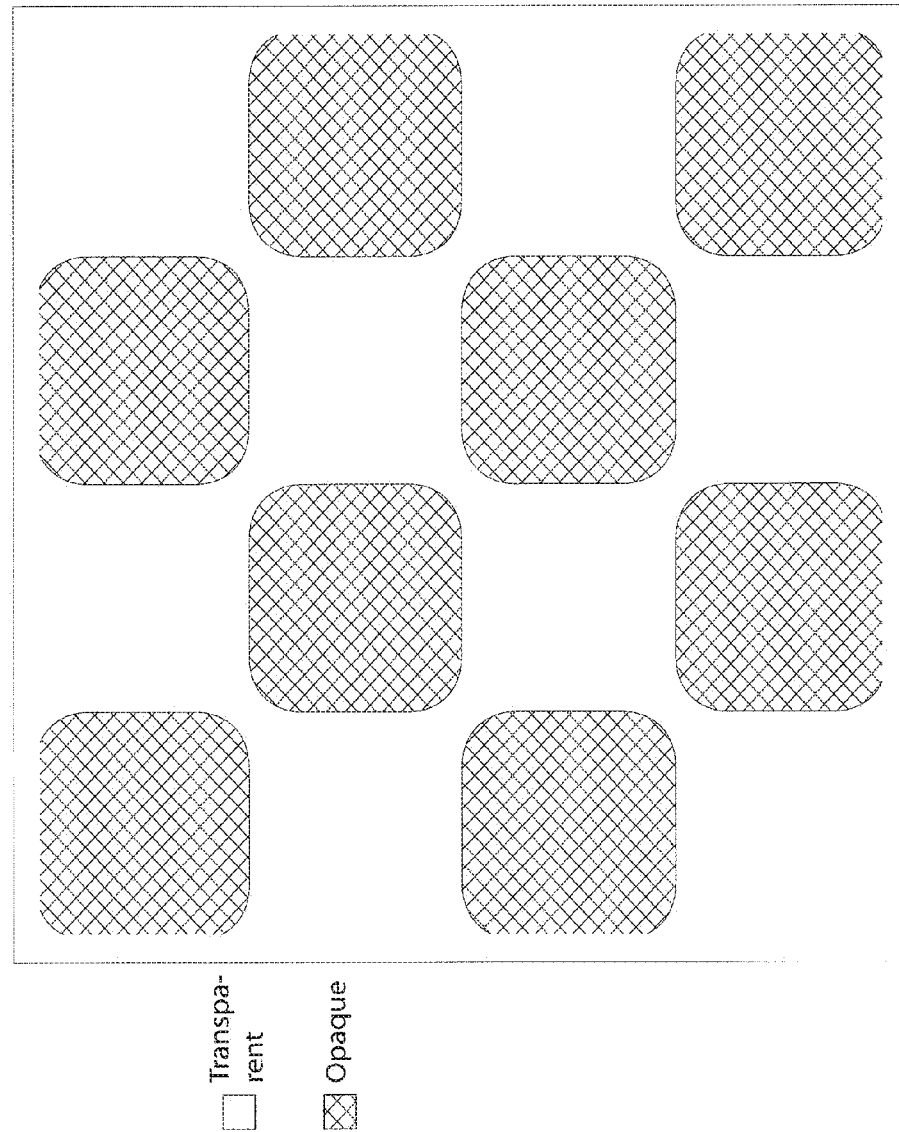
FIGS. 48-54 illustrate exemplary fabrication processes according to the present invention.
Figure 49:
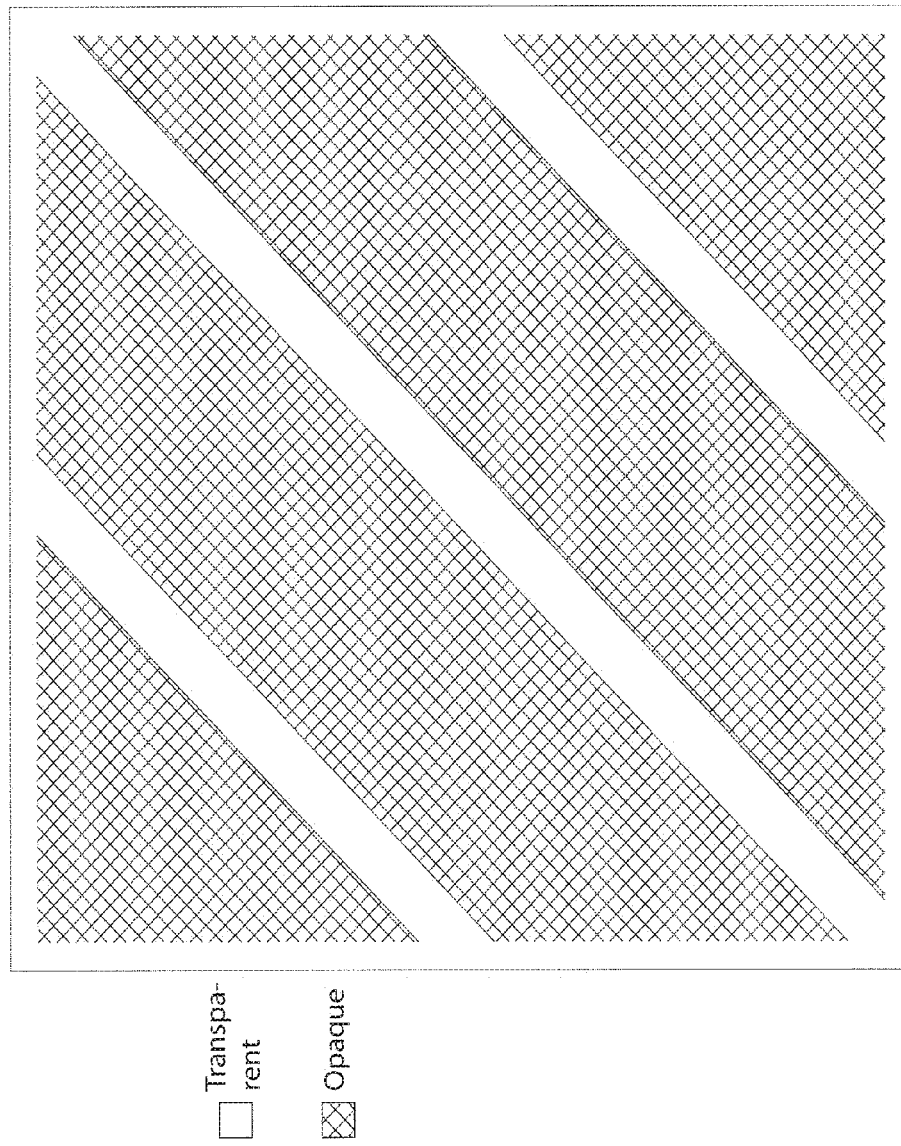
Figure 50:
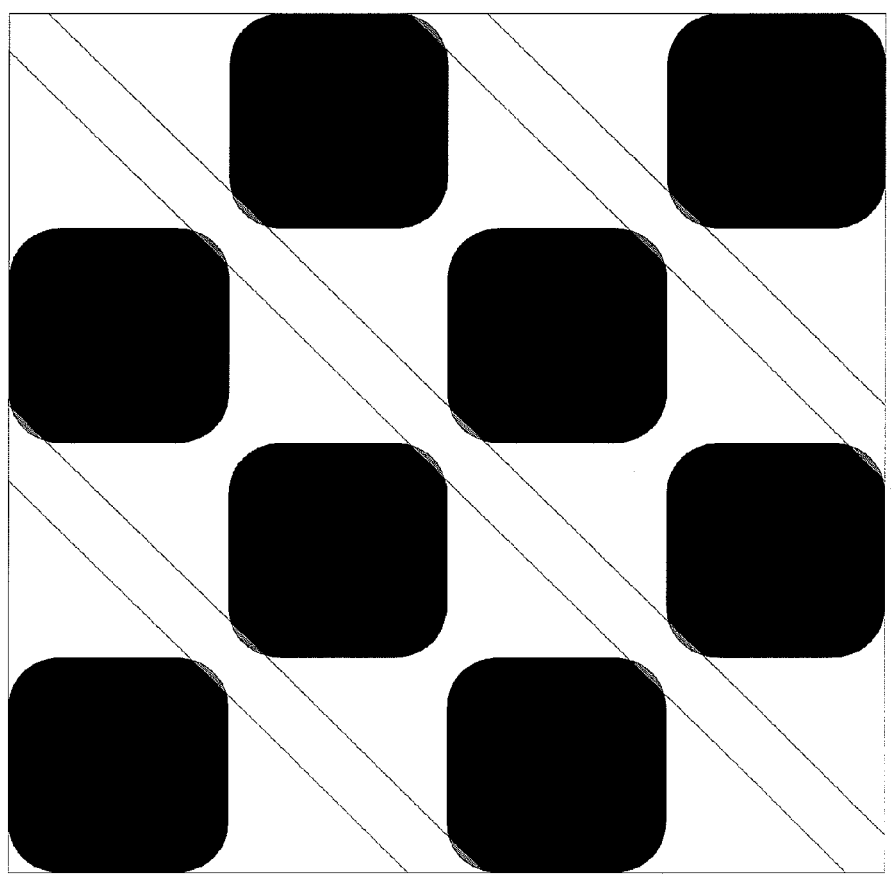

Other embodiments are also possible. For example, FIGS. 48-50 illustrate another embodiment for fabricating precise gaps or slits between gates in the present invention. FIG. 48 illustrates a mask that may be used to form the gates in a device. The distance between the gates, however, may vary from one application of the mask to the next, and from one iteration of the pattern to another iteration of the pattern on the same or different masks. As a result, the gaps or slits between the gates, and the resultant operational characteristics of the devices will also vary. However, consistent gates gaps (or slits) can be achieved according to the present invention.

In FIG. 48, the pattern intentionally places the gates closer than desired, thereby making the gap or slits between the gates smaller than desired. FIG. 49 illustrates another mask that can be applied to broaden the gap or slit between the gates to the desired distance. The long, straight pattern of this mask is relatively easy to make and is more uniform and consistent than non-repetitive patterns. As a result, this mask produces a more consistent features during fabrication. FIG. 50 illustrates the mask of FIG. 49 being applied to several devices and corresponding pairs of gates in each device. The gates are formed closer together than desired for operation, and the mask illustrated in FIG. 50 "trims" the corners of the gates so that the distance between the gates is uniform and the desired width. As a result, if variations in the fabrication process initially result in the gates being even closer, the trimming step with the mask from FIG. 49 will create the appropriate gap or slit between the gates. Conversely, if variations in the fabrication process result in the gates being farther apart than was planned, this variation is off-set by intentionally forming the gates closer than desired.

The steps of forming the gates and trimming the gates to produce the desired distance between them may be performed separately, or they may be performed at the same time. In other words, an energy-sensitive material, such as photoresist, may subject to multiple exposures. For example, one or more exposures may be performed to define the initial gate region, and one or more exposures to trim the gate regions and provide for the desired spacing between the gates. As a result, the multiply-exposed energy-sensitive material contains a complex pattern representing both the formation of the gate regions and the trimming of the gate regions. Thereafter, the multiply-exposed energy-sensitive material may be further processed to form the desired structure.

Figure 51:
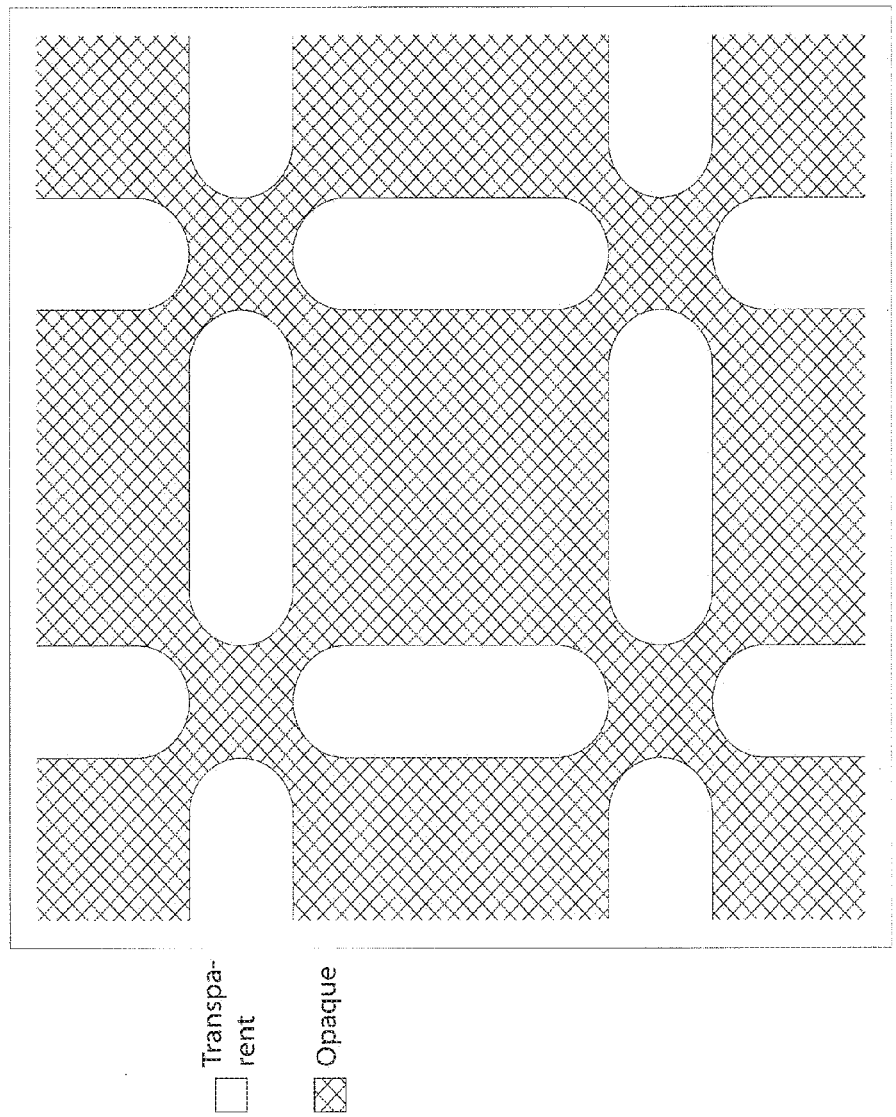
Figure 52:
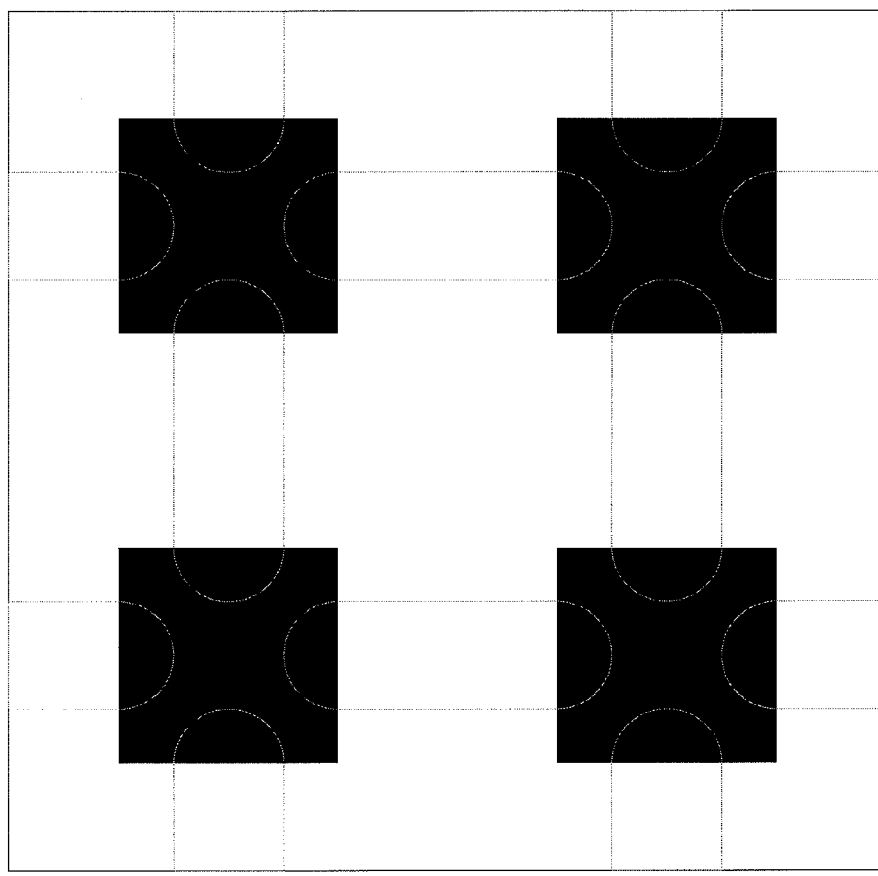
Figure 53:
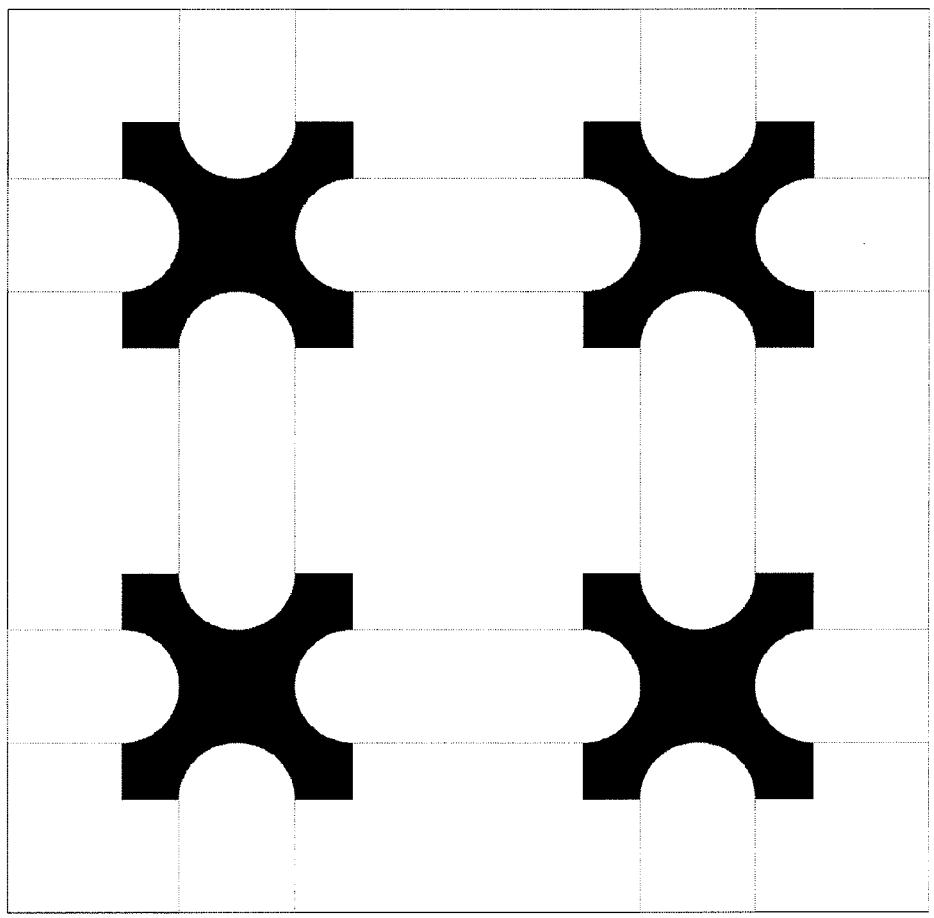

FIGS. 51-53 illustrate another embodiment for fabricating the "x"-shaped device illustrated in FIGS. 11 and 12. FIG. 51 illustrates a mask that may be used to remove material from a square device and leave an "x"-shaped device. The straight patterns of this mask are relatively easy to make and are more uniform and consistent than non-repetitive patterns. As a result, this mask produces more consistent features during fabrication FIG. 52 illustrates the mask from FIG. 51 overlaid on four square regions that will form devices according to the present invention. This figure illustrates how the mask may be used to remove material from the devices. FIG. 53 illustrates the resultant "x"-shaped devices and the mask used to form them.

Similar to the discussion above with regard to FIGS. 48-50, the steps for forming the "x"-shaped device may be performed separate from the formation of other features, or it may be part of a multiple-exposure of an energy-sensitive material. For example, the mask illustrated in FIG. 51 may be part of a multiple-exposure step with the formation of trenches around the devices, such as described with respect to FIG. 28.

Figure 54:
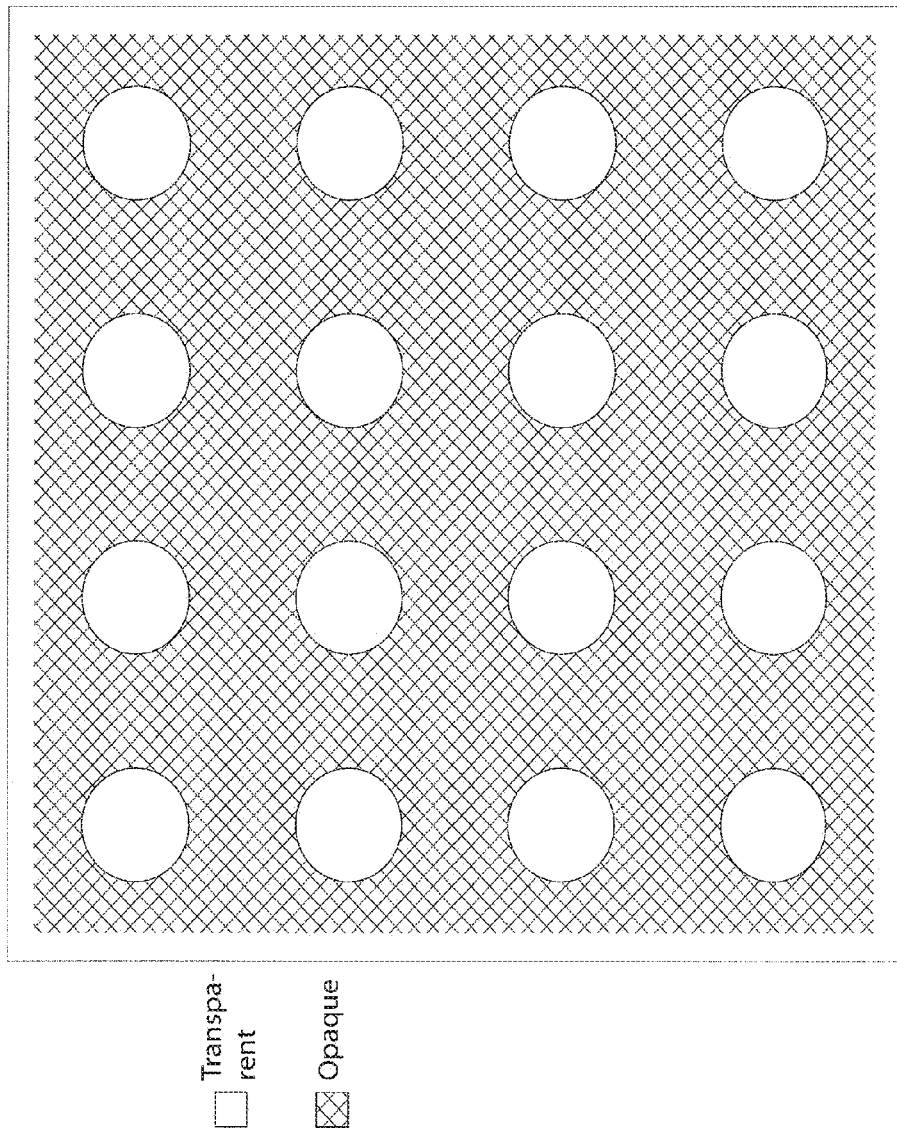
Figure 55:
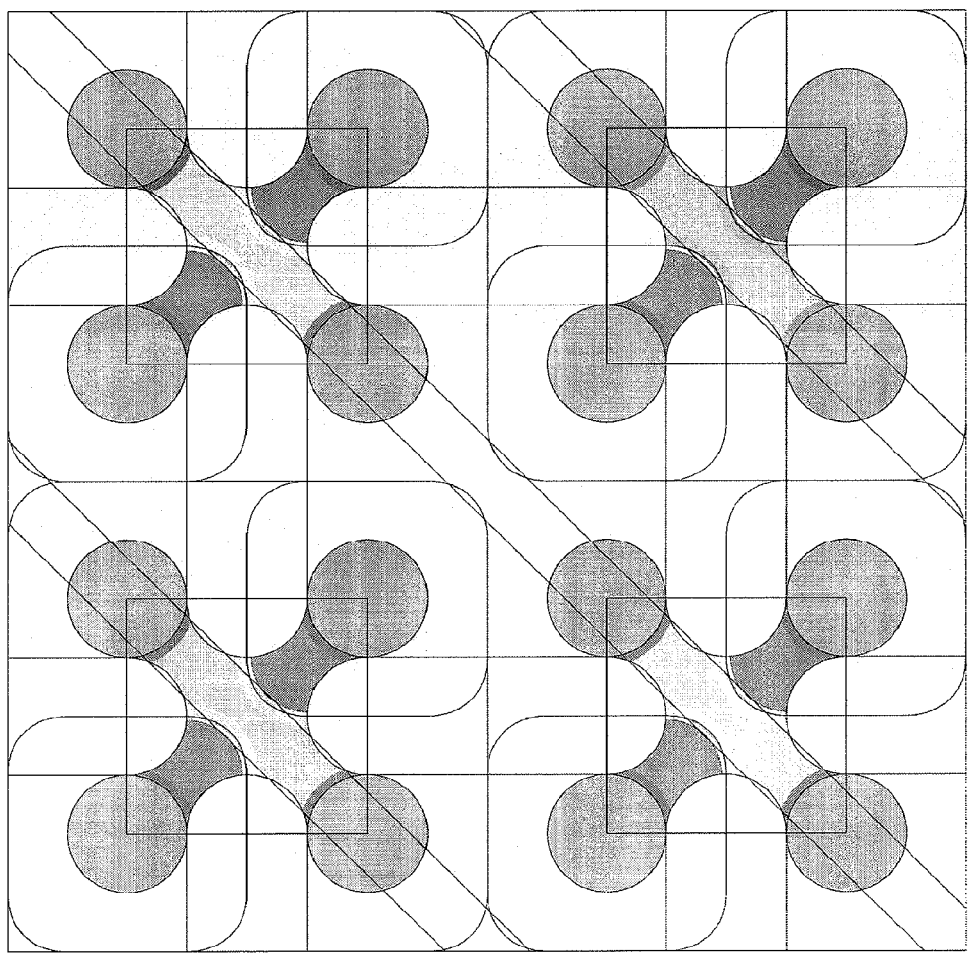
FIGS. 55-56 illustrate embodiments of the present invention in the context of fabrication processes described herein.

FIG. 55 illustrates "x"-shaped devices overlaid with the mask from FIG. 49, the mask from FIG. 51 and the mask from FIG. 54. FIG. 54 illustrates a mask that may be used to form contacts in the device. The mask from FIG. 49 is used to produce uniform gaps between gates, and the mask from FIG. 51 is used to create the "x"-shaped device.

FIG. 55 also illustrates that the contacts formed for this embodiment of the x-shaped device are etched into two adjacent materials. Silicon or other semiconductor materials form the active parts of the transistor, and silicon-dioxide or some other insulator surrounds and isolates the transistor. In the illustrated embodiment, the contacts are formed at an interface between these two materials. As a result, the etching process for forming the contacts may be complicated by the presence of both materials. In an alternative embodiment, the fabrication of the device may be modified so that the contacts are formed in a single material. For example, the mask used to form the square region illustrated in FIG. 52 may be modified so that the square region is large enough to include the entire contact and, therefore, allow the contact to be etched into silicon, without the added complication of etching into several different materials. Alternatively, the mask may be modified to form smaller square elements so that the etch is made almost entirely in silicon-dioxide.

Figure 56:
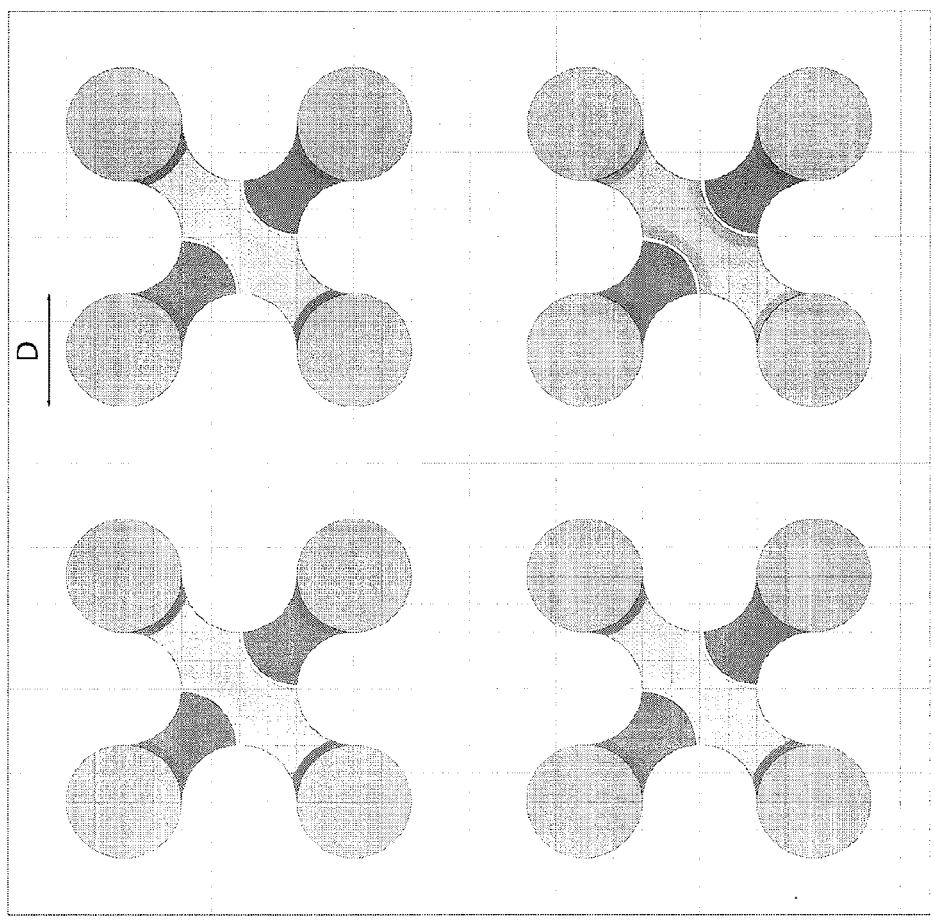

FIG. 56 illustrates "x"-shaped devices in which the contacts are constructed with a diameter equal to the minimum feature size "D". Although this is not required to practice the present invention, the geometry illustrated and described herein is well suited to such arrangements.

FIGS. 57-61 illustrate one embodiment of the present invention in the form of a NAND gate. In this embodiment, FIGS. 57-61 illustrate successive layers of the NAND gate. The layers of the NAND gate will be described using terms "lower" and "upper". Although the NAND gate may be fabricated with the "upper" and "lower" layers oriented accordingly, this is not required. For example, the "upper" layer may be oriented on the bottom, and the "lower" layer may be oriented on the top. The use of the terms "upper" and "lower" are for convenience and are not limiting.

Figure 57:
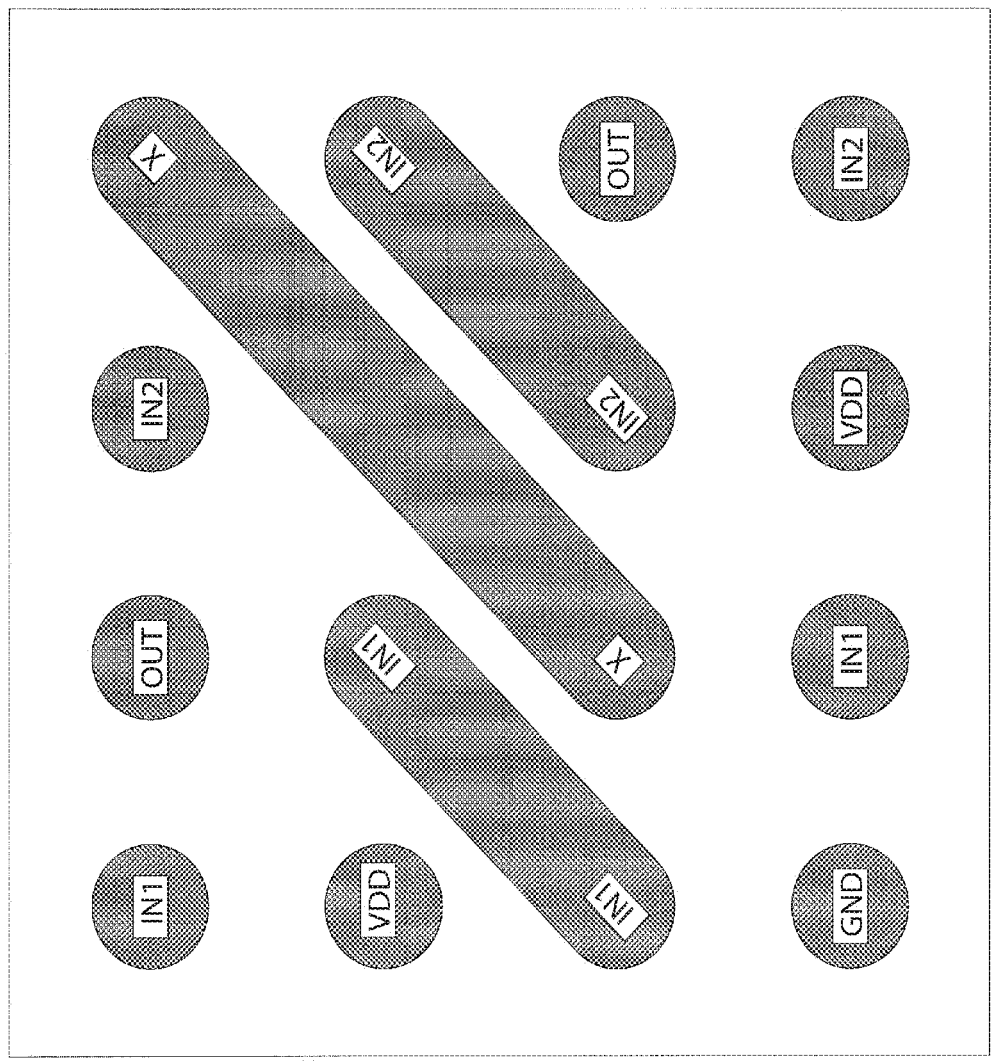
FIGS. 57-61 illustrate an embodiment of the present invention in the form of a NAND gate.
Figure 58:
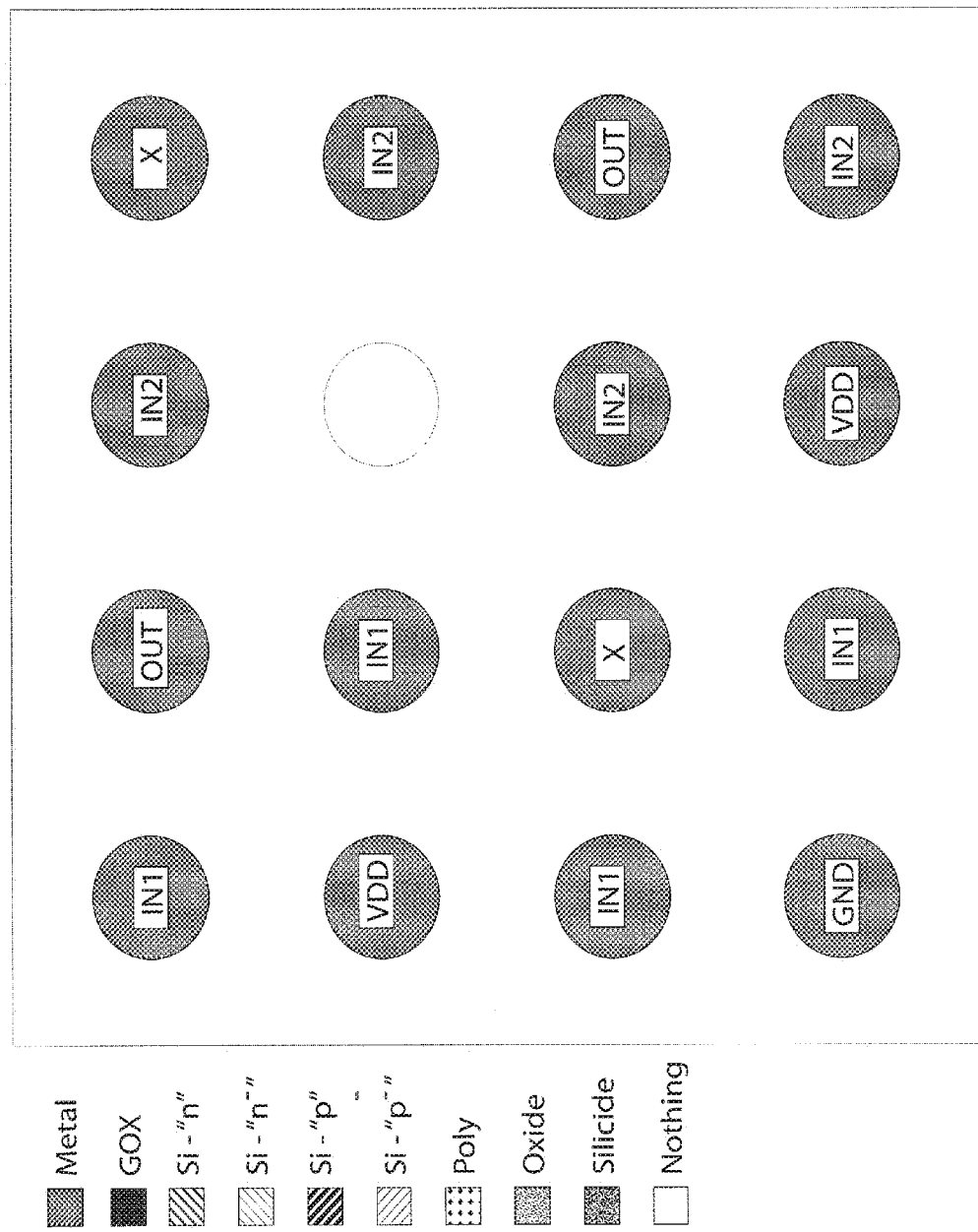
Figure 59:
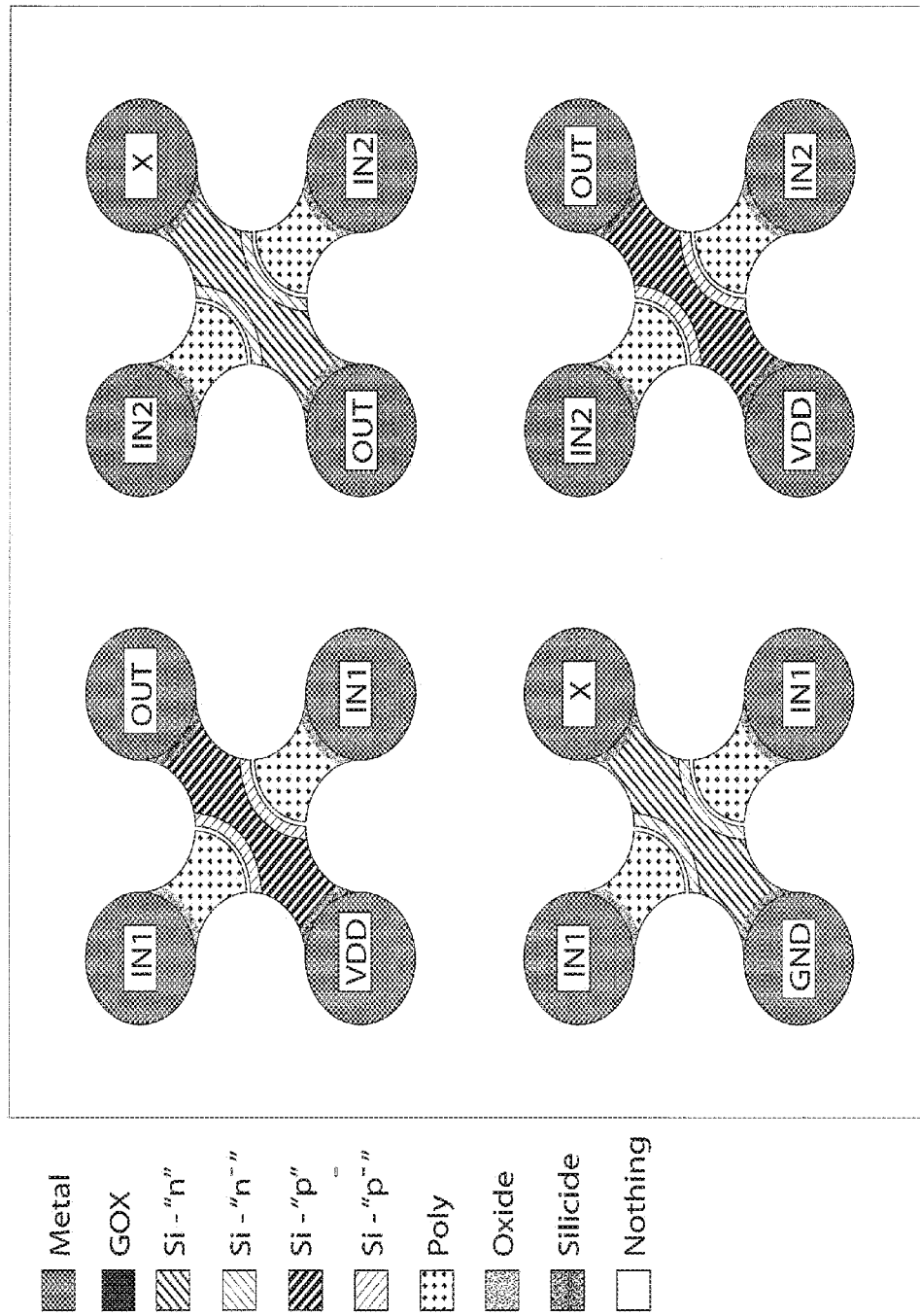
Figure 60:
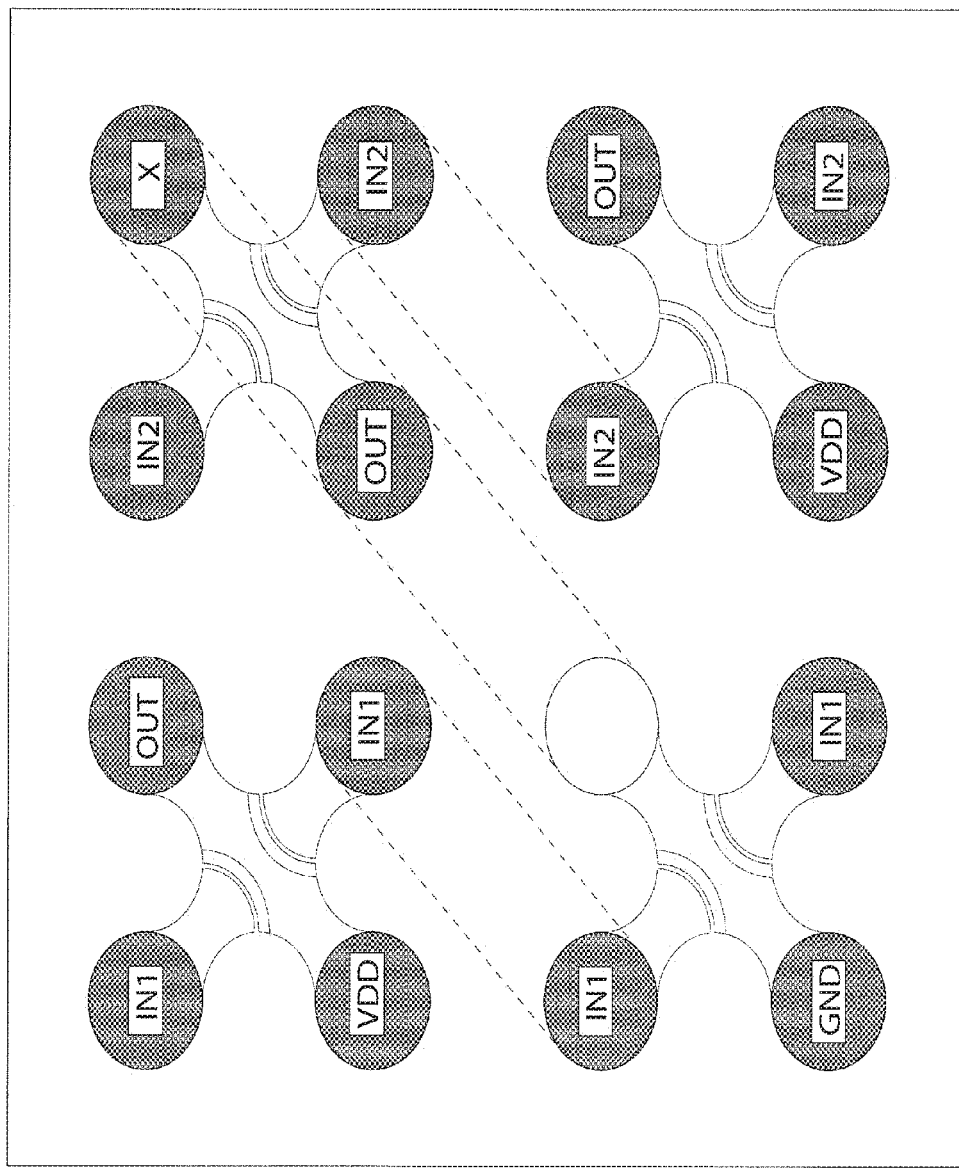
Figure 61:
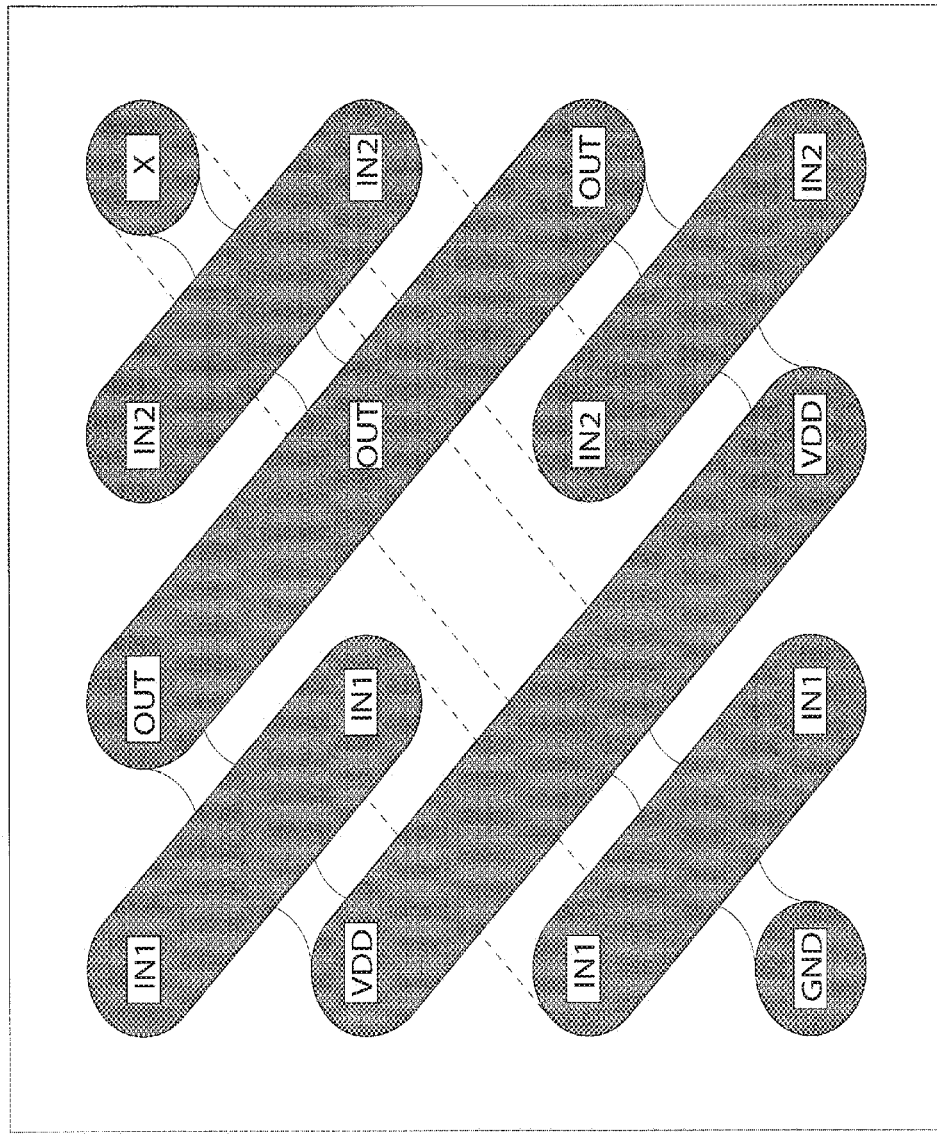

FIG. 57 illustrates a metal layer carrying signals to and from the device and forming local interconnects. This metal layer will be referred to as the "lower metal layer". FIG. 58 illustrates the next layer and represents lower contacts between the lower metal layer and the active part of the device that will be described with reference to FIG. 59. One of the contact positions in this embodiment is not being used and, therefore, it has not been formed. In other embodiments more or less contacts and more or less unused contact positions may be used. FIG. 59 illustrates the active elements or transistor elements of the NAND gate. These transistor embodiments are similar to that described and illustrated with reference to FIG. 12, although other embodiments, such as those described with reference to FIGS. 4 and 5 may also be used. FIG. 60 illustrates another contact layer between the transistors and the "upper metal layer" which will be described with reference to FIG. 61. FIG. 60, like FIG. 58, illustrates an unused contact position. FIG. 60 also illustrates, in dashed lines, the lower metal layer, the transistors, and the relationship between the lower metal layer, the transistors, and the contacts of FIG. 60. FIG. 61 illustrates the upper metal layer carrying signals to and from the device and forming local interconnects. FIG. 61 also illustrates, in dashed lines, the lower metal layer, the transistors, and the relationship between the lower metal layer, the transistors, and the upper metal layer of FIG. 61.

The contacts in the upper contact layer, the transistors, and the lower contact layer collectively form contacts or pillars between the upper interconnection layer, the transistors, and the lower interconnect layers. In this embodiment, different masks are used to form the contacts in the different layers. These multilayer structures effectively form a single contact spanning several layers of the device.

FIGS. 57-61 also illustrate the use of double-sided contacts in the present invention. In particular, some of the contacts electrically connect both the "upper" and the "lower" sides of the transistors. As a result, signals carried by the lower metal layer (FIG. 57) and through the contacts (FIG. 58) to the transistor (FIG. 59) can pass to the other side of the contact and connect to the upper contacts (FIG. 60) and into the upper metal layer (FIG. 61).

For example, signal input 1 ("IN1") in the upper left side of FIG. 57 represents one of the input signals to the NAND gate. That signal passes through the lower metal layer of FIG. 57, through the corresponding contact in FIG. 58, and into the upper left transistor in FIG. 59, where it biases one of the gates on the upper left transistor. The signal continues though the double-sided contact that form part of the transistor and exits the other side of the transistor, where it is connected to the upper contact layer (FIG. 60) and passes into the upper metal layer (FIG. 61). The upper metal layer forms a local interconnect with the upper right corner where signal IN1 emerges above the gate of the transistor. The other end of the local interconnect is above the other gate of the same transistor. FIG. 60 illustrates the contact between the upper metal layer and the second gate of the upper left transistor, where signal IN1 enters the second gate of the transistor (FIG. 59). FIG. 58 illustrates the lower contact layer where signal IN1 emerges from the second gate of the upper left transistor and FIG. 57 illustrates an interconnect in the lower metal layer that connects signals IN1 to a location below another transistor in the lower left of the device. Similar to that described with regard to the transistor in the upper left, signal IN1 passes from the lower interconnect (FIG. 57) through the contact layer (FIG. 58) and into one of the gates of the lower left transistor (FIG. 59). Signal IN1 passes through the double sided contact at that gate and is connected to the upper contact layer (FIG. 60) and into another upper local interconnect (FIG. 61). The upper local interconnect (FIG. 61) connects signal IN1 to the contact layer (FIG. 60) above the other gate of the lower left transistor, and into the other gate of the lower left transistor (FIG. 59). FIGS. 57 and 58 also illustrate that signal IN1 is connected through the lower contact layer (FIG. 58) and to the lower interconnect layer (FIG. 57). Although this is not required in this particular embodiment of the present invention, it does allow signal IN1 to be provided to the NAND gate from two sides, thereby reducing the amount to time required for all of the gate voltages connected to signal IN1 to reached the desired voltage.

The embodiment illustrated in FIGS. 57-61 illustrates the use of double sided contacts according to the present invention. The double-sided contacts allow for efficient routing of signals. The embodiment illustrated in FIGS. 57-61 also illustrates the use of interconnect layers on both sides of a device. The combination of double-sided contacts and interconnect layers on both sides of the device allow for a small footprint or area of the devices. The present embodiment also allows for efficient routing of signals. In this particular embodiment, it is not required to stack one interconnect layer on top of another interconnect layer, thereby simplifying the device. In addition, this embodiment illustrates the use of interconnect layers on opposite sides of a device, wherein the interconnect layers are only oriented orthogonal to each other. By only using orthogonal interconnects on corresponding layers on opposite sides of a device, the fabrication process can be simplified. For example, if the interconnects in a particular layer are only oriented in one direction, without bends or turns, then the process of forming the interconnects can be simplified and the interconnects can be made more uniformly.

Many variations are possible with the present invention. The example illustrated in FIGS. 57-61 may be modified in many ways. For example, the interconnect layers may include elements that are not all oriented in the same direction and, therefore, not entirely orthogonal to the elements on the other interconnect layer. In addition, the interconnect layers may be formed only on one side of the device. Other variations are also possible, such as the use of single-sided contacts and other modifications. This example and other examples provided herein are illustrative and not limiting of the present invention.

Figure 62:
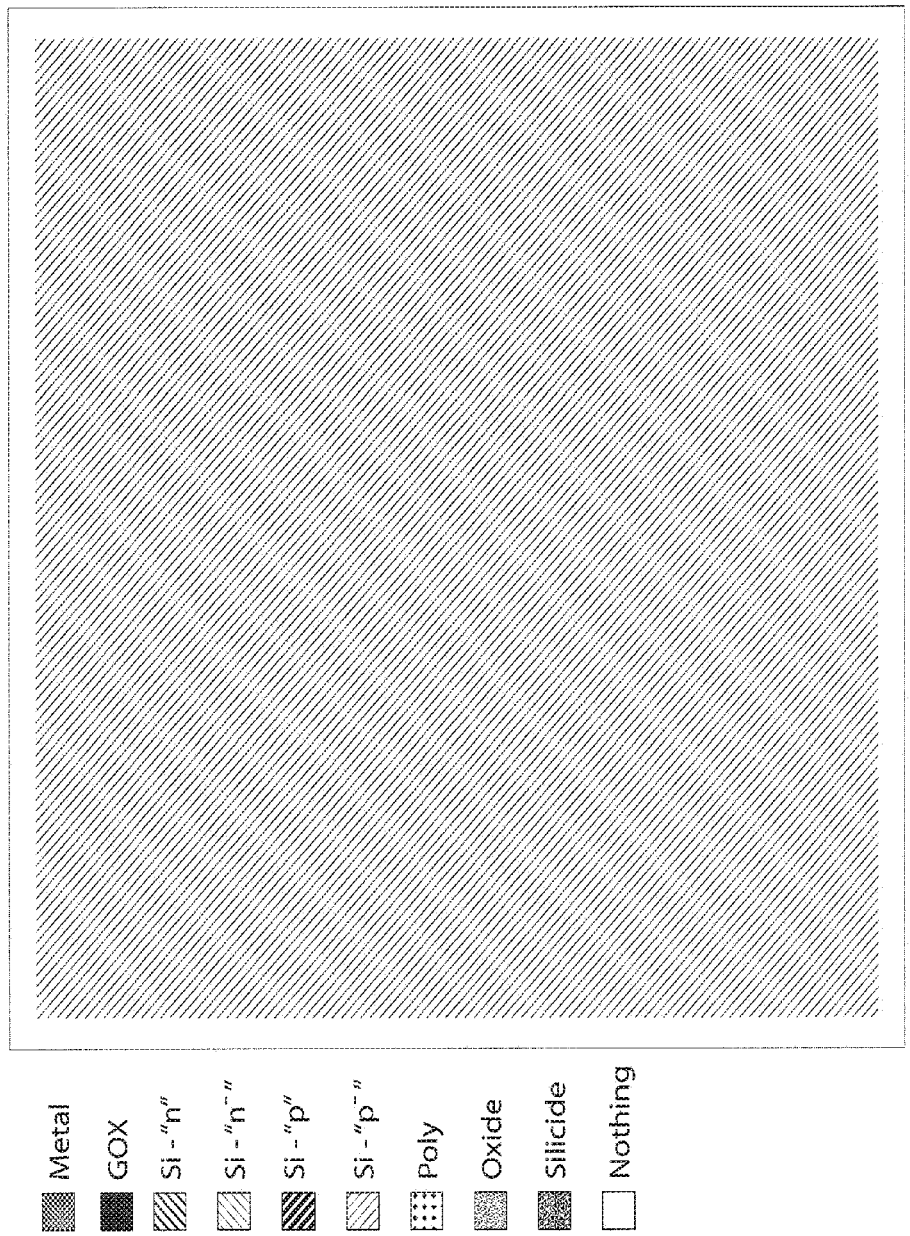
FIGS. 62-92 illustrate a fabrication process according to one embodiment of the present invention.

Another embodiment of circuit fabrication according to the present invention will now be described. FIG. 62 illustrates a top view of a starting material for the circuit fabrication. In this embodiment the starting material is a semiconductor substrate.

Figure 63:
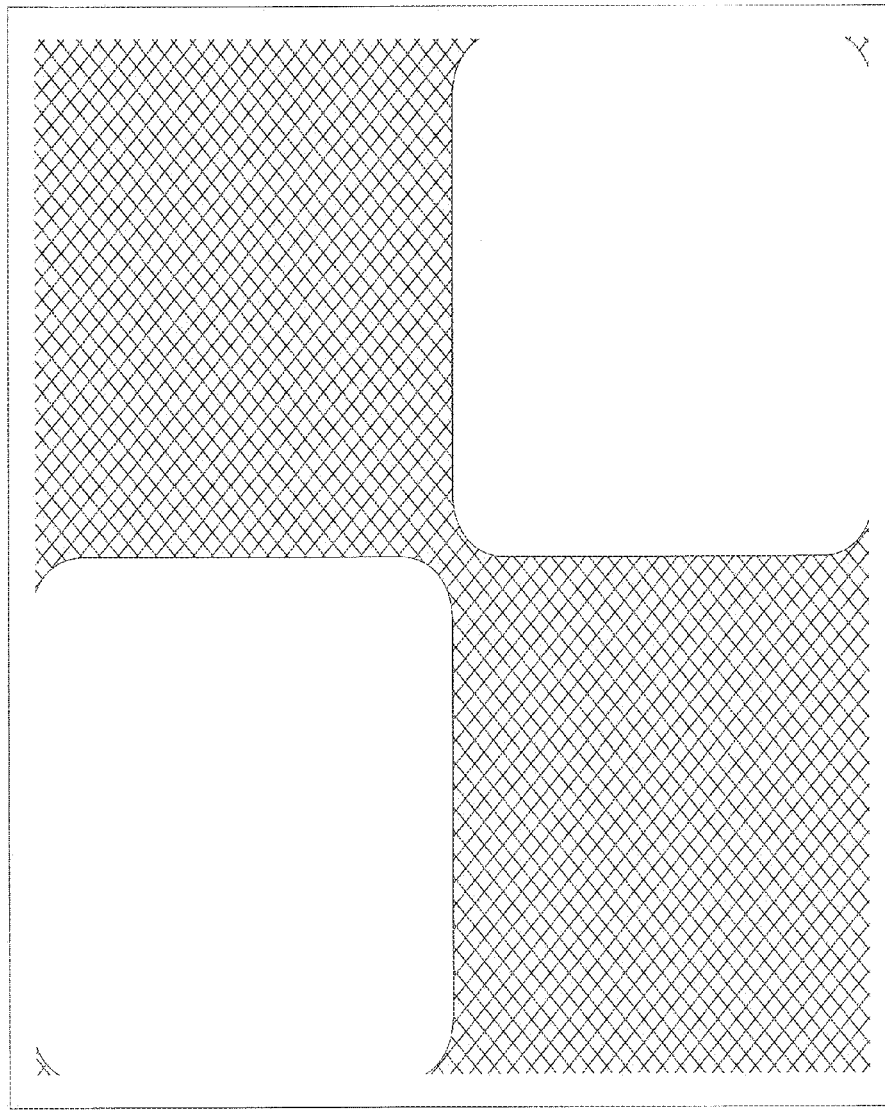

FIG. 63 illustrates a mask that is used in a lithographic process for the formation of p-wells on the starting material. The mask may be used, for example, in conjunction with an energy-sensitive material, such as photoresist, to form a desired pattern of photoresist on the surface of the starting material. In this embodiment, negative photoresist is used to form a pattern of photoresist covering the portions of the starting material corresponding to the transparent portions of the mask. After the pattern of photoresist is formed, dopants are deposited in the photoresist and in the areas of the starting material not covered by photoresist. In this embodiment Boron is used to form p-wells, although other dopants may also be used. Thereafter, the photoresist is removed, leaving the Boron-doped regions in the portions of the starting material that were not covered by the photoresist.

Figure 64:
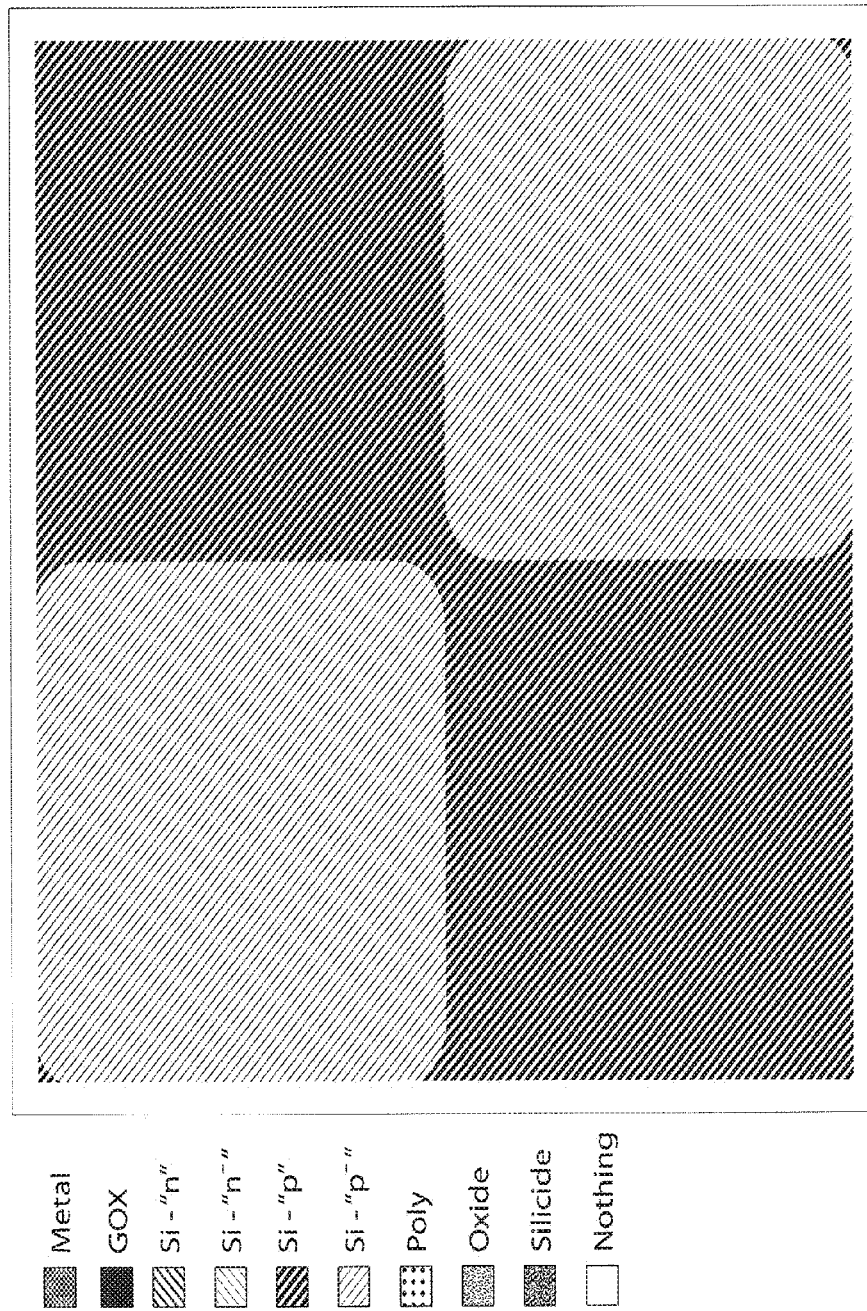

FIG. 64 illustrates a top view of the resulting structure with the p-wells formed.

Figure 65:
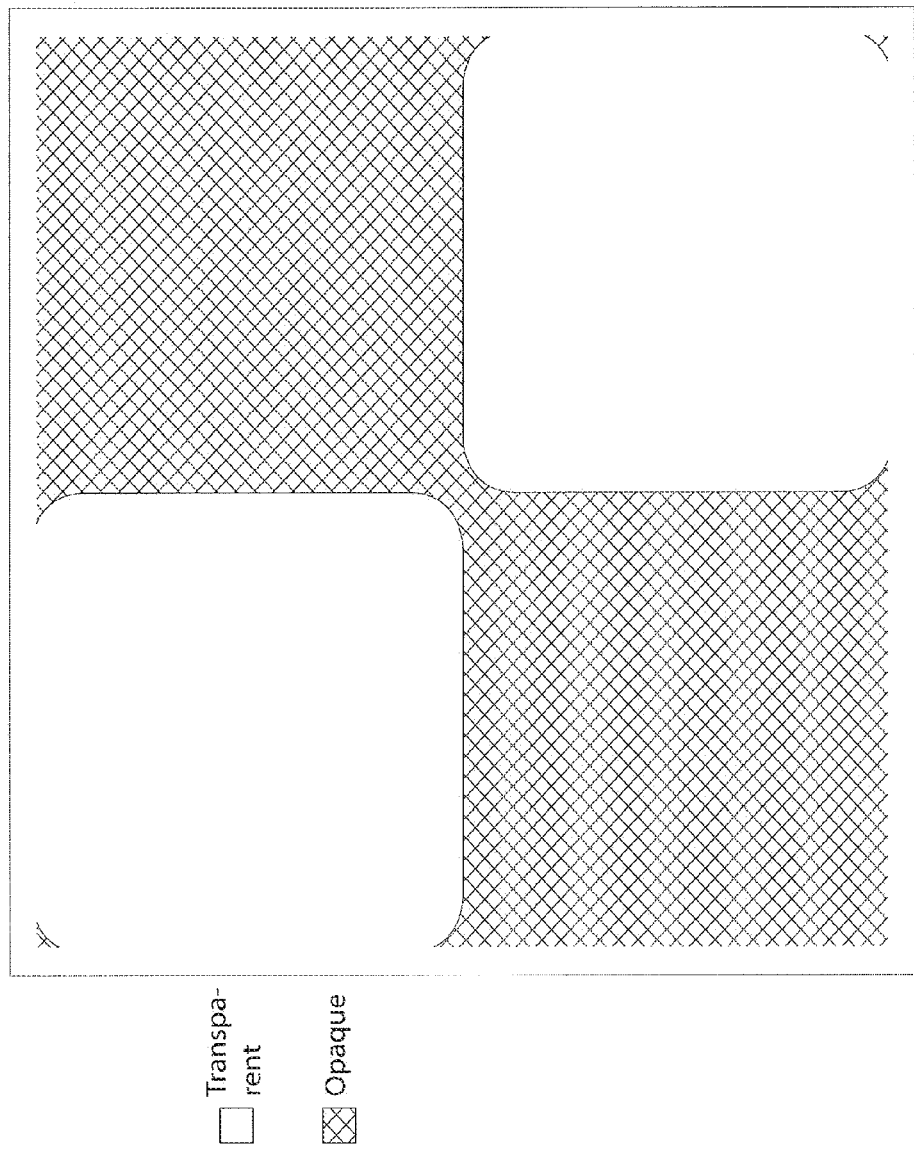

FIG. 65 illustrates a mask that will be used to form n-wells in the starting material. In this embodiment phosphorous is used as the dopant for the n-wells, although other materials may also be used. In this embodiment, the same mask is used to form both the n-wells and the p-wells. This can be done by using different photoresist or other energy-sensitive materials. In this embodiment, negative photoresist was used with this mask to form the p-wells and positive photoresist is used to form the n-wells. In other embodiments, the same type of photoresist or other energy-sensitive material may be used for both steps and different masks may be used to form different patterns.

Figure 66:
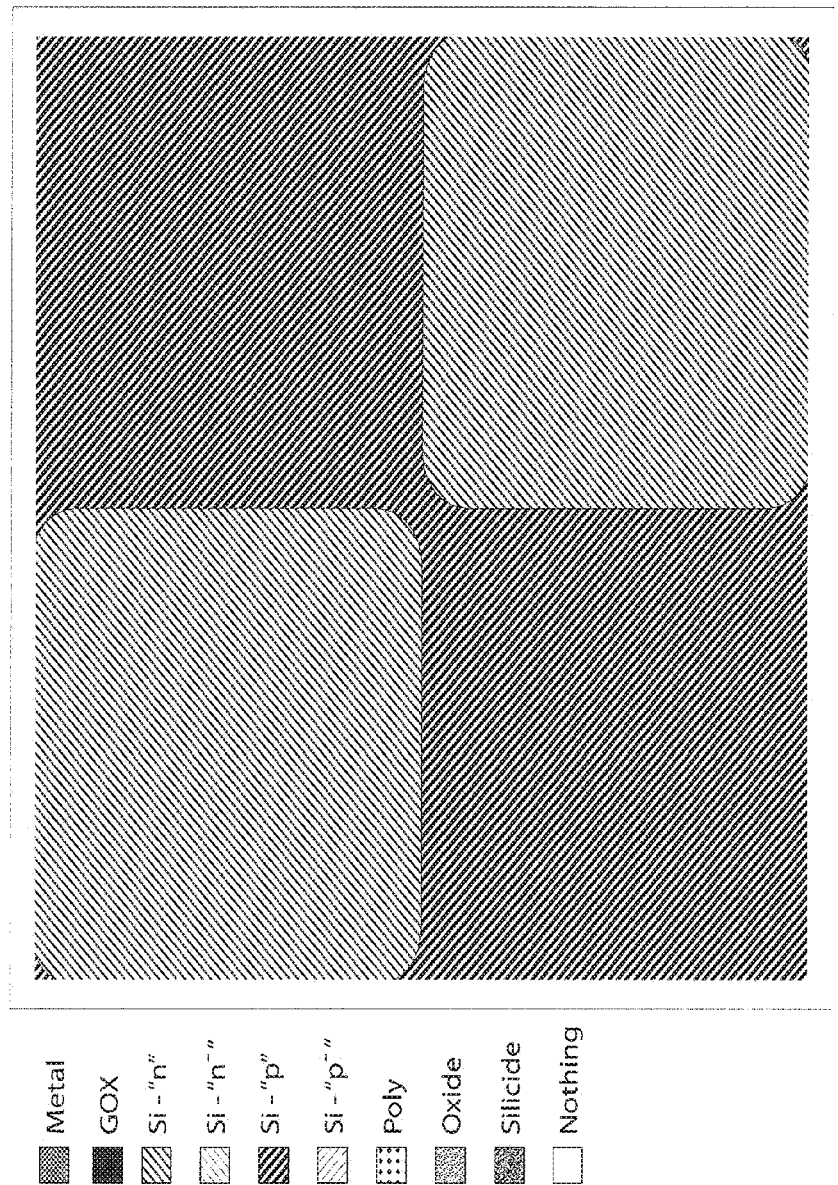

FIG. 66 illustrates a top view of the resulting structure with the n-wells formed.

Figure 67:
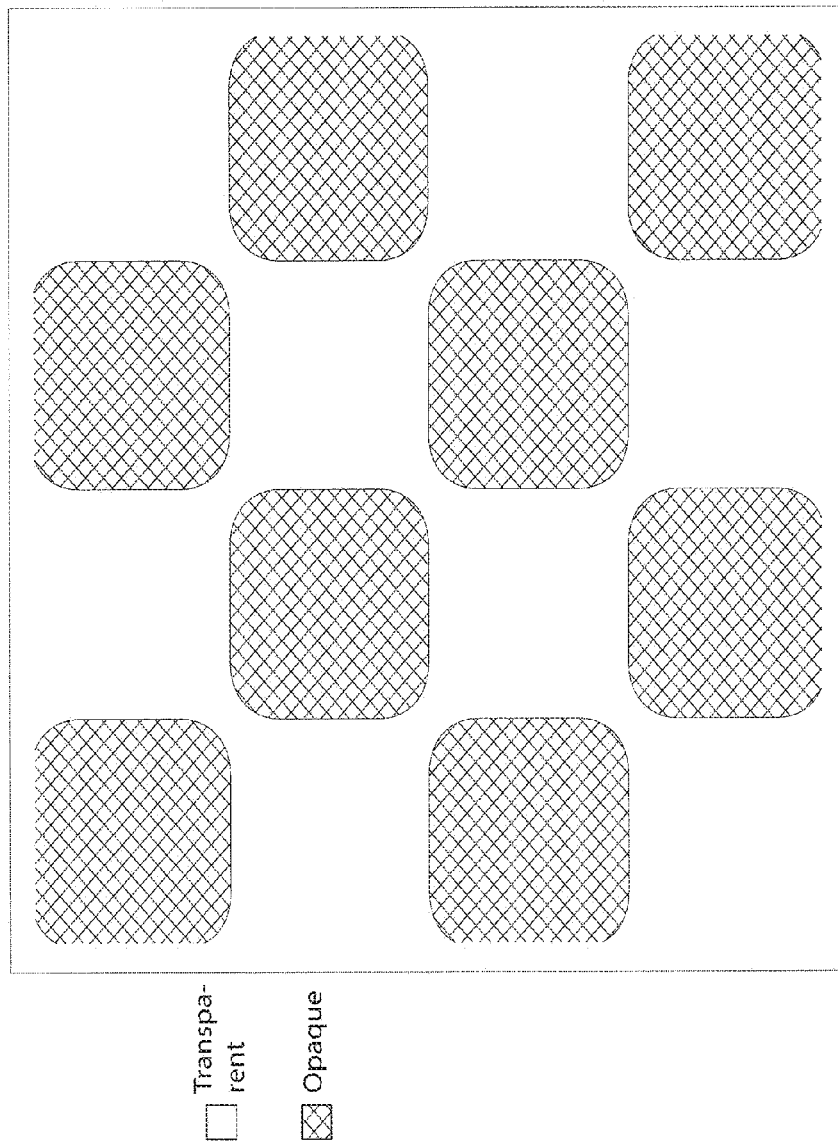

FIG. 67 illustrates the first of two masks that are used in a multiple-exposure process used to form the electrode trenches {"ET") in this embodiment. In particular, more than one mask or pattern of energy is used to expose a layer of photoresist or other energy-sensitive material. The mask in FIG. 67 represents the first exposure for the electrode trenches. The spacing of the trenches has a significant affect on the characteristics of the devices formed. In order to achieve more precise spacing, the mask in FIG. 67 forms the electrode trenches closer together than desired, and a subsequent step will adjust the spacing.

Figure 68:
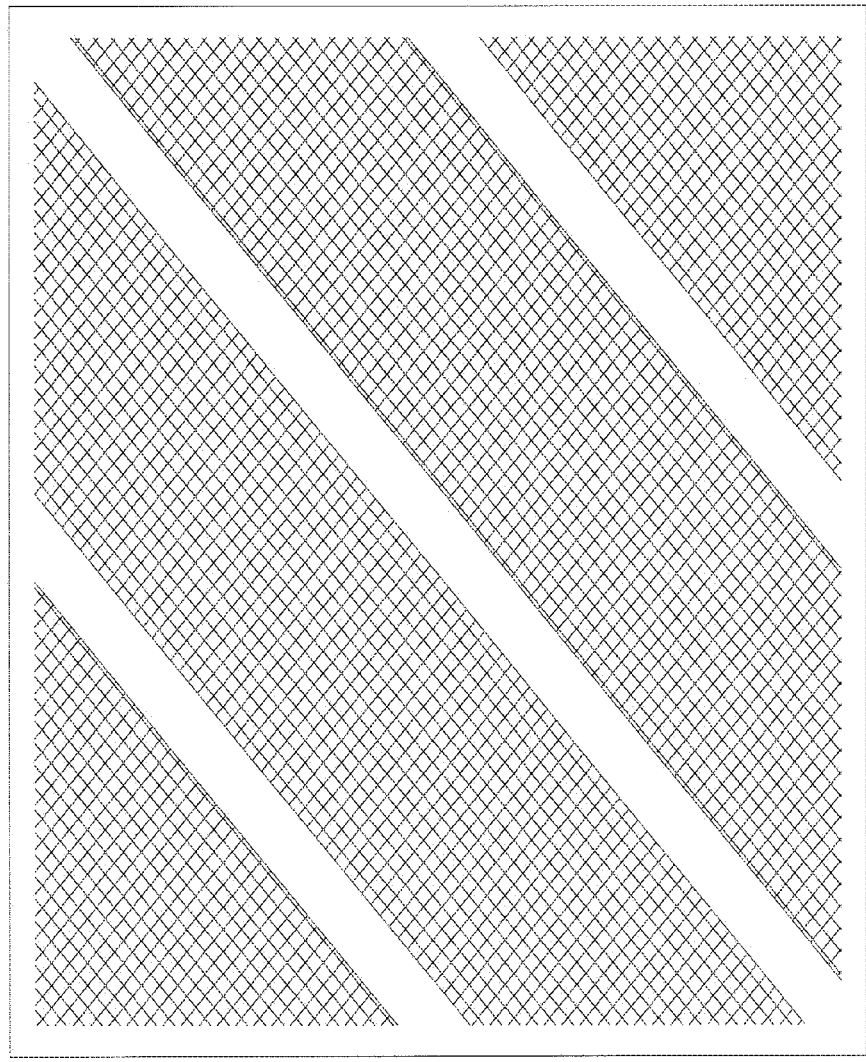

FIG. 68 illustrates the second mask used to form the electrode trenches in this embodiment. This mask is used to make a second exposure and to "trim" or "fine tune" the pattern formed in the energy-sensitive material. In particular, this mask is a series of lines having a precise and consistent width and which are oriented to run between the electrode trenches and, thereby, form a space have a precise width between the electrode trenches. The lines of this second mask are repetitive and straight. As a result, the second mask can be made more precise and uniform than conventional masks which have corners and elements that are not consistent or repetitive.

Figure 69:
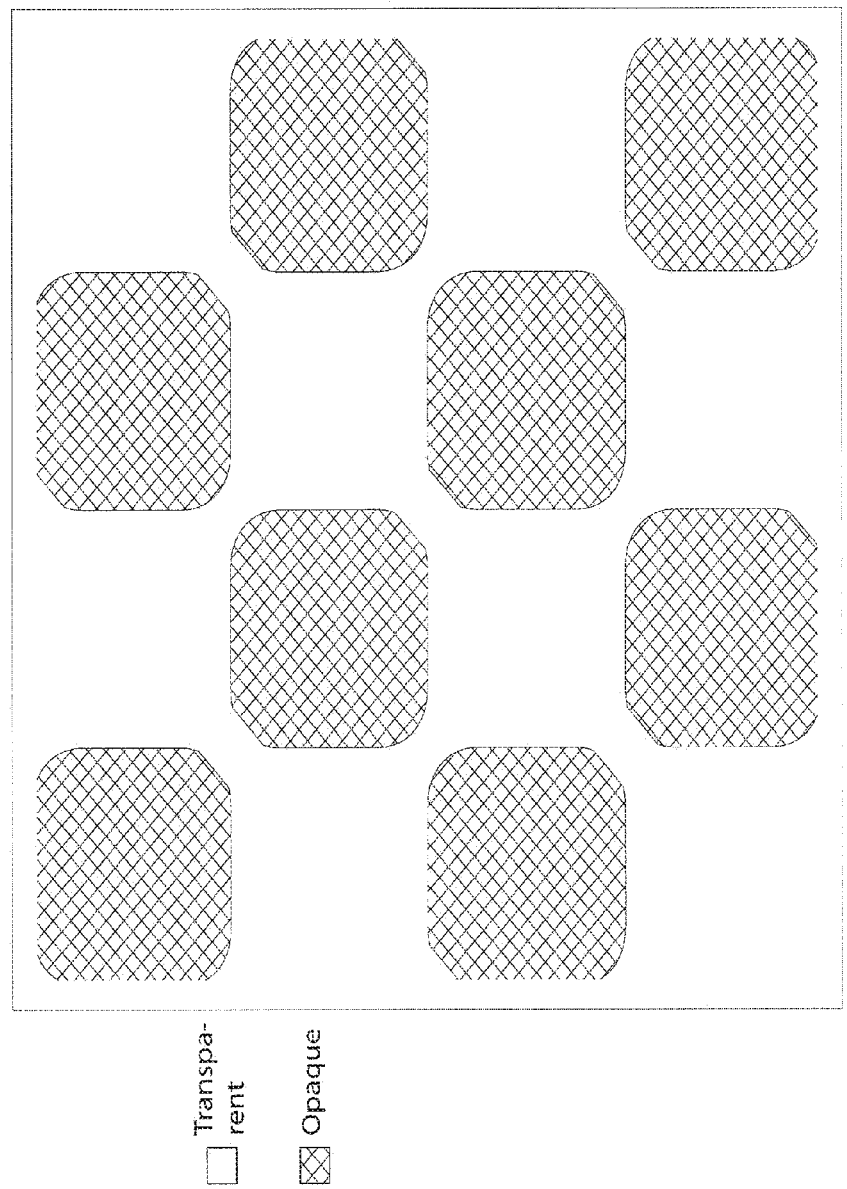

FIG. 69 illustrates the "effective" mask formed by the multiple exposure using both FIGS. 67 and 68. As can be seen in FIG. 69, the corners of the electrode trenches are "trimmed" or clipped to the precise width. As a result, the variations and inconsistencies inherent in semiconductor processes can be reduced with the two step process described herein. In particular, the variation in spacing that may occur with the fabrication process using only the first mask will be compensated with the two exposure process of the present invention. In other words, if the electrode trenches are formed too close together due to process variations, then the second step will provide the desired spacing. Similarly, if process variations cause the electrode trenches to form farther apart than planned, the effect will be compensated by intentionally forming the electrode trenches closer than needed with the first mask and forming the desired spacing with the second mask. After the desired pattern is formed in the energy-sensitive material, an etching step may be used for form the electrode trenches in the desired pattern.

Figure 70:
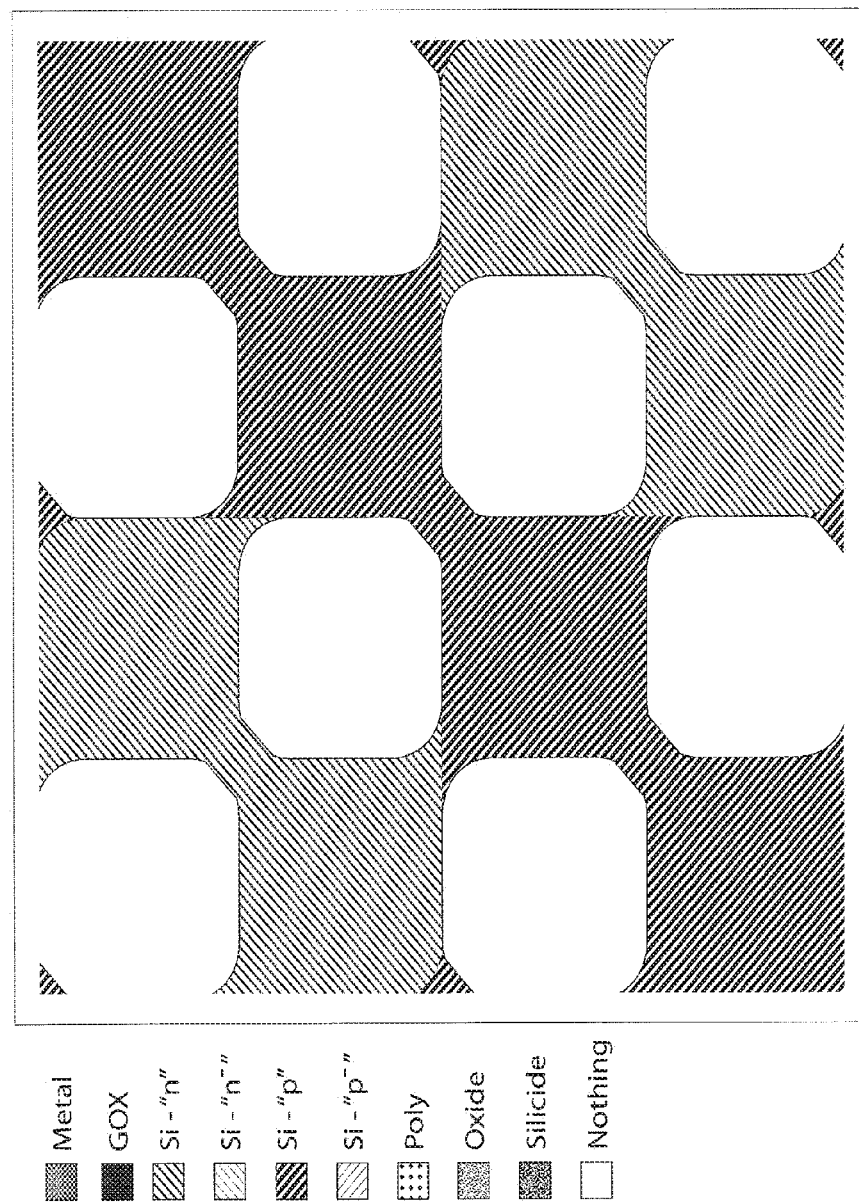

FIG. 70 illustrates a top view of the resulting structure with the electrode trenches formed in the n-wells and p-wells.

Figure 71:
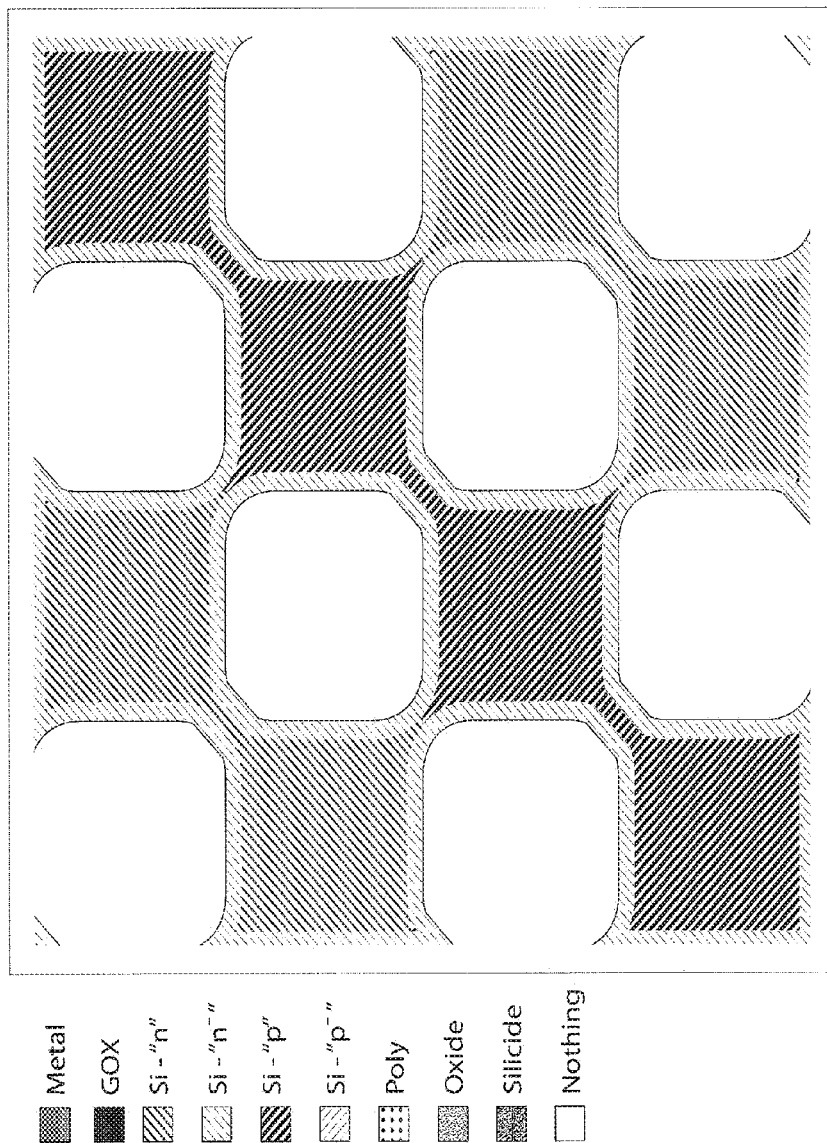

FIG. 71 illustrates a top view of the structure after the walls of the electrode trenches are doped. This doping may be done, for example, with a sequence of lithography, deposition of oxide, and outdiffusion.

One example of doping the walls of the electrode trenches is as follows. A sacrificial oxide ("SOX") layer is formed on the wall of the electrode trenches and on the top surfaces of the n-wells and p-wells. Thereafter, another lithography step is performed to form a pattern of energy-sensitive material to selectively cover and expose portions of the sacrificial oxide. The exposed portions of the sacrificial oxide are removed and then the remaining energy-sensitive material is removed, leaving sacrificial oxide on the selected portions of the structure to be protected from subsequent steps. The unprotected portions will be diffused with an n dopant. Arsenic-doped oxide is deposited over the structure and driven into the portions of the structure not protected by the sacrificial oxide layer. The Arsenic may be driven into the exposed portions of the structure, for example, by exposing the structure to elevated temperature and pressure. Thereafter, the Arsenic-doped oxide and the remaining sacrificial oxide are removed, leaving the walls of selected electrode trenches doped with Arsenic.

Another layer of sacrificial oxide may then be formed for n+ diffusion. Thereafter, another lithography step is performed to form a pattern of energy-sensitive material to selectively cover and expose portions of the sacrificial oxide. The exposed portions of the sacrificial oxide are removed and then the remaining energy-sensitive material is removed, leaving sacrificial oxide on the selected portions of the structure to be protected from subsequent steps. The unprotected portions will be provided with n+ diffusion. Arsenic-doped oxide is deposited over the structure and driven into the portions of the structure not protected by the sacrificial oxide layer. The Arsenic may be driven into the exposed portions of the structure, for example, by exposing the structure to elevated temperature and pressure. Thereafter, the Arsenic-doped oxide and the remaining sacrificial oxide are removed, leaving the walls of selected electrode trenches doped with Arsenic.

The steps described above are repeated for p and p+ diffusion. The lithographic steps expose areas for p and p+ diffusion instead of the areas for n and n+ diffusion, and Phosphorous, for example, may be used as the p and p+ dopant instead of Arsenic. At the conclusion, the walls of the electrode trenches are selectively diffused with dopants as illustrated in FIG. 71.

Figure 72:
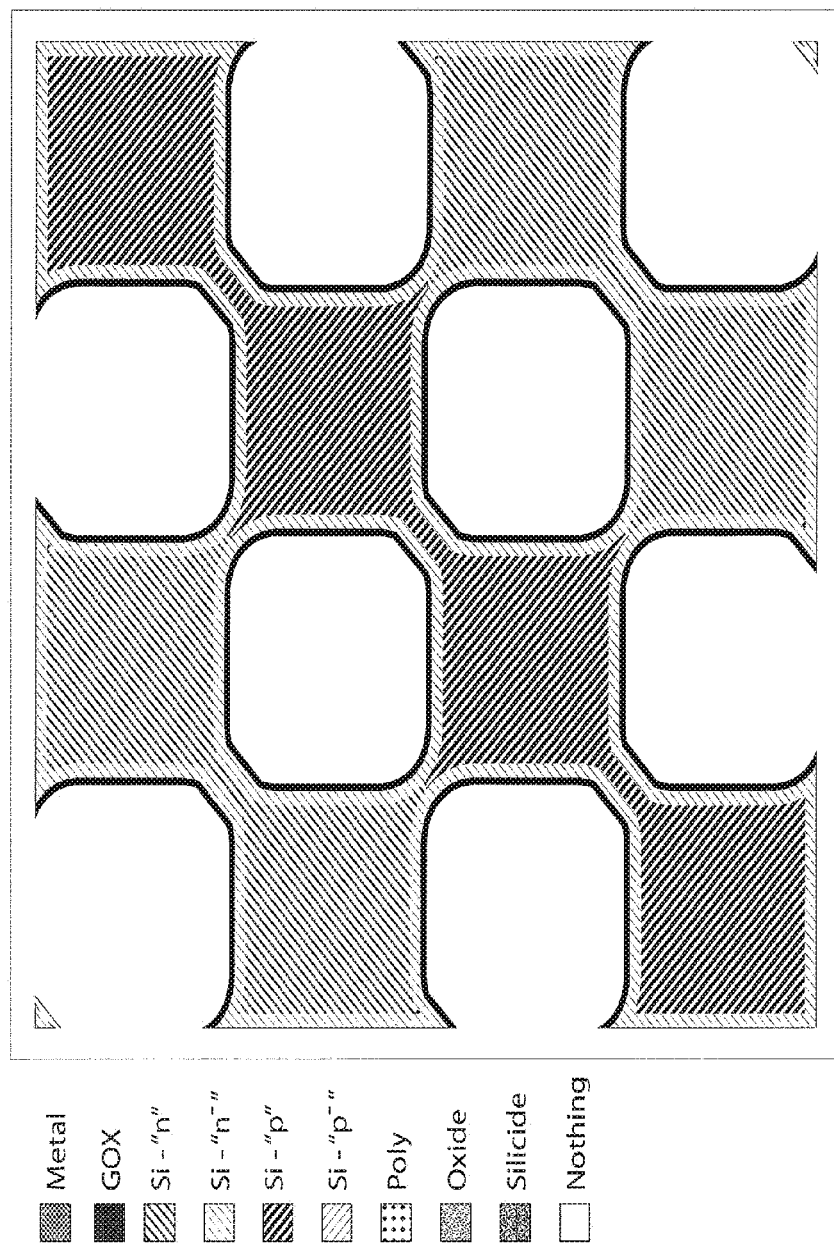

FIG. 72 illustrates a top view of the structure after the formation of gate oxide ("GOX") on the wall of the electrode trenches. The gate oxide will be used, in the present embodiment, to insulate the gates from the bulk semiconductor regions. The gate oxide may be formed, for example, by forming an oxide layer over the structure and then selectively removing it, such as with a lithographic process to selectively cover portions of the structure with energy-sensitive material and to etch the oxide away from other portions of the structure which are left uncovered.

Figure 73:
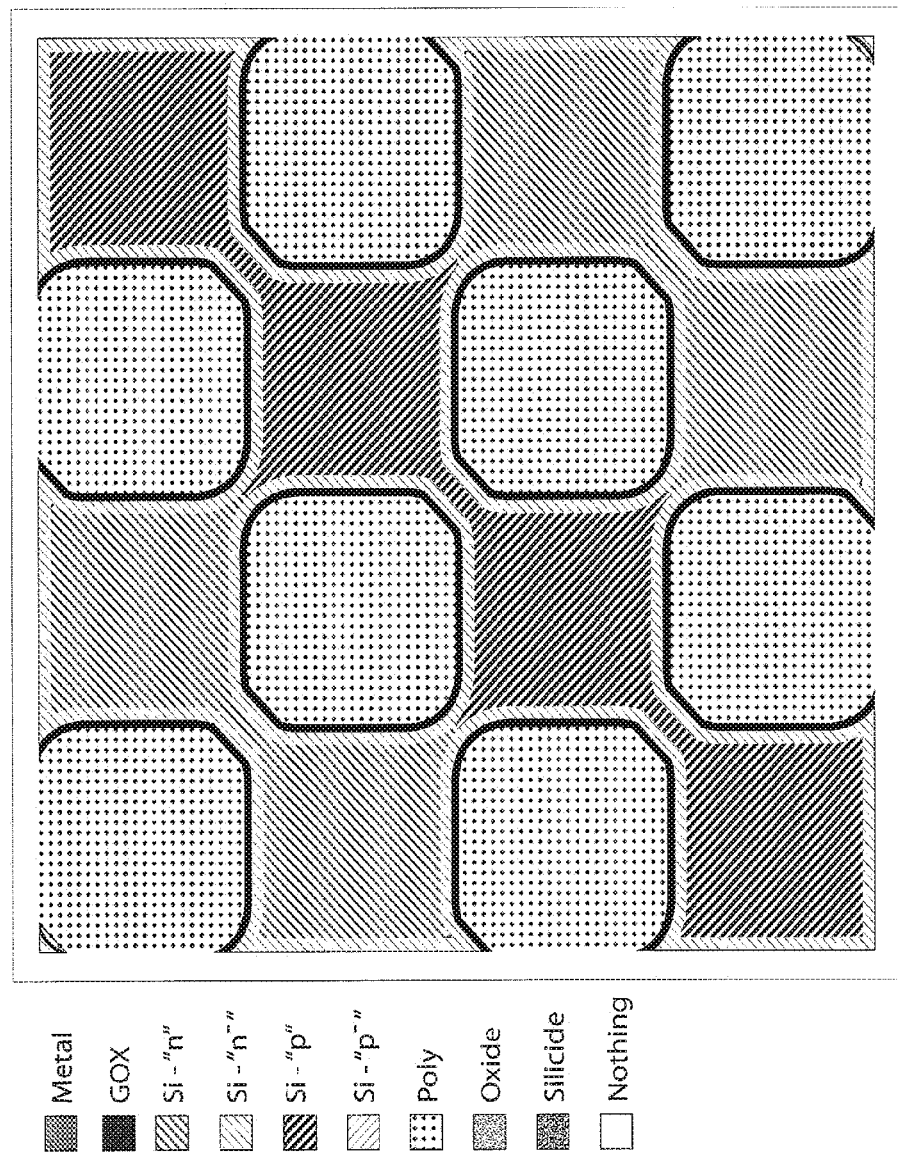

FIG. 73 illustrates a top view of the structure after the formation of polysilicon in the electrode trenches. After the formation of the polysilicon, the structure may be subject to a chemical-mechanical polish ("CMP") to form a smooth top surface for further processing. This CMP step may also be used to modify the thickness of the bulk semiconductor region of the transistors. This thickness can have a significant affect on the characteristics of devices formed according to the present invention, and this CMP process can be used to tailor the characteristics to particular ends.

Figure 74:
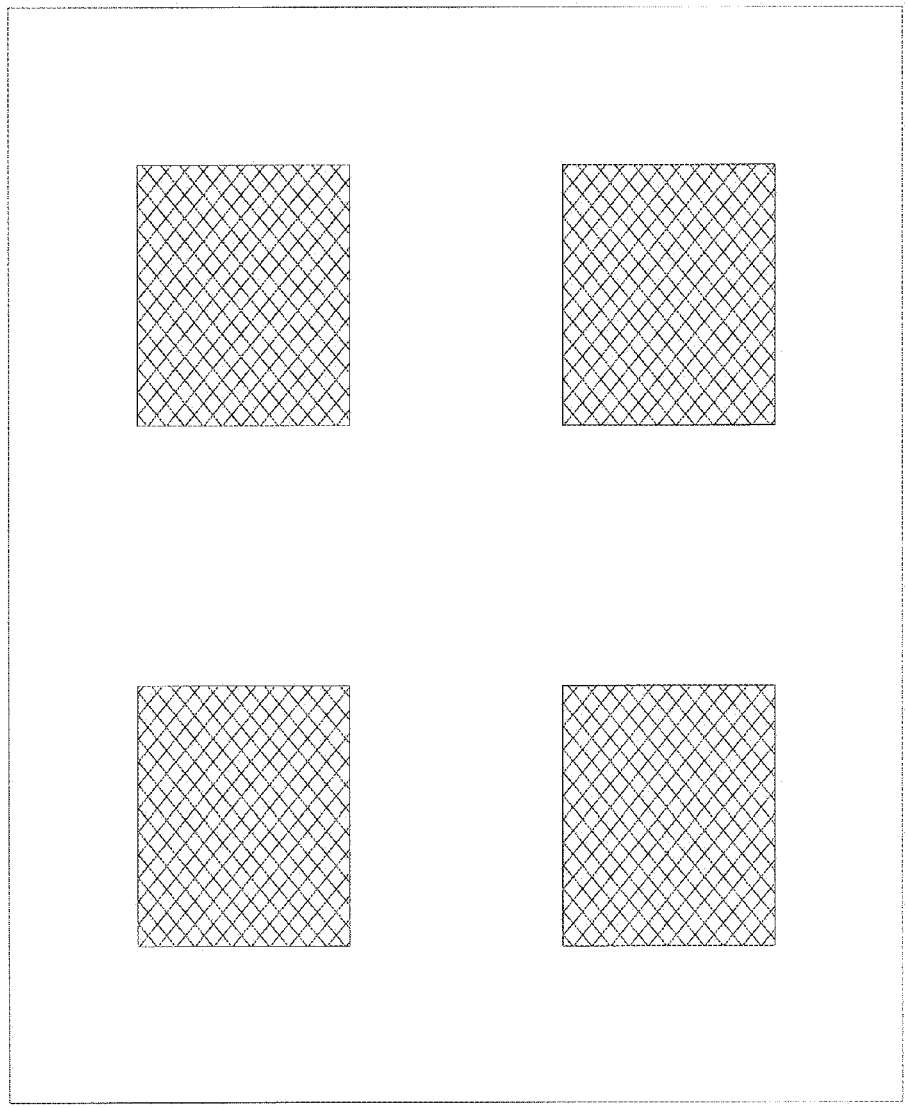
Figure 75:
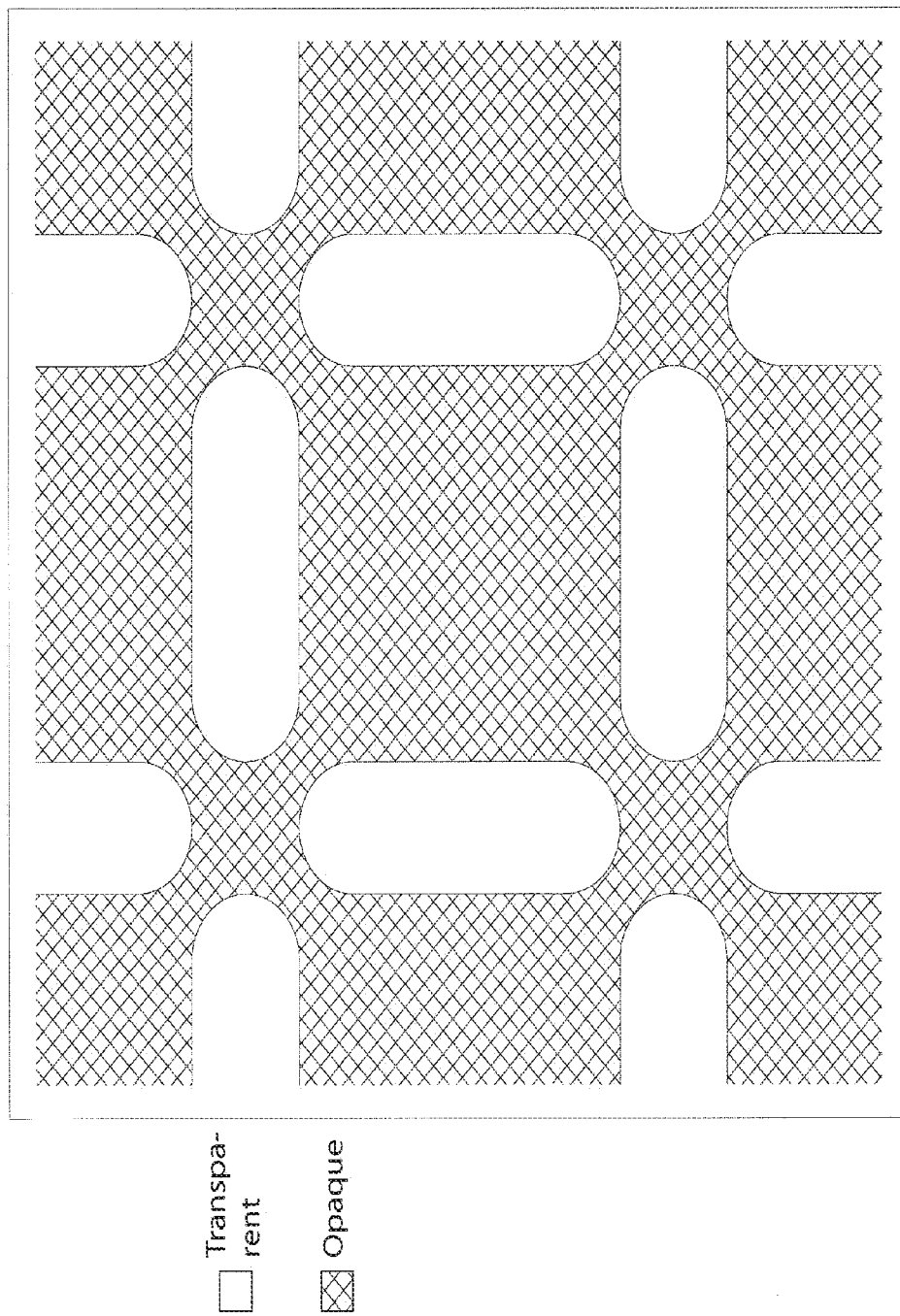

FIGS. 74 and 75 illustrate two masks used in another multiple-exposure process according to the present invention to form shallow trench isolation ("STI") around the devices. The mask illustrated in FIG. 74 roughly separates the devices, and the mask illustrated in FIG. 75 trims the pattern to provide for a desired shape of the devices. The two step process according to the present invention allows for complex patterns with highly precise dimensions. Both masks provide repetitive patterns that can be made with high precisions. Collectively, the masks provide the complicated pattern desired with higher precisions than is possible with convention processes.

Figure 76:
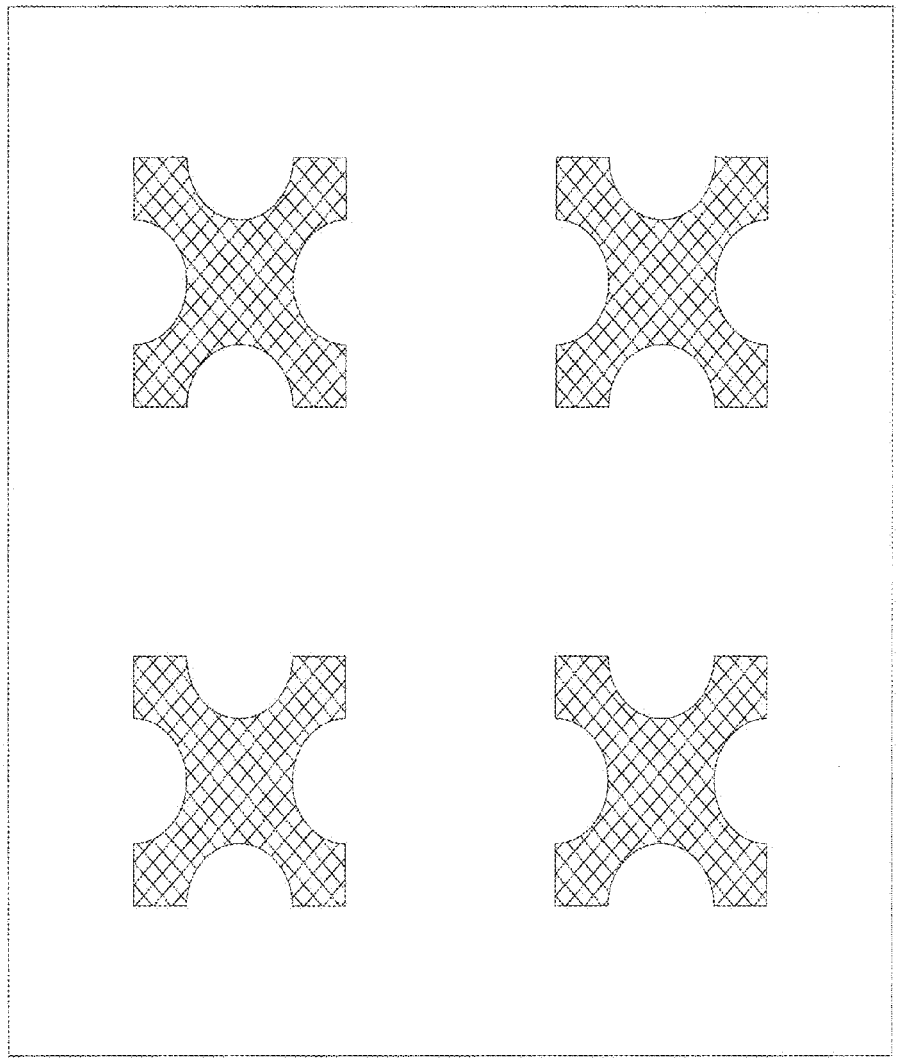

FIG. 76 illustrates the "effective" mask formed by masks from FIGS. 74 and 75. This pattern not only forms the shallow isolation trenches between the devices, but it also trims the shape of the devices. In this embodiment, the devices are trimmed to reduce the volume of the bulk semiconductor region, thereby reducing capacitive effects in the device and allowing for faster operation and lower power consumption. In other embodiments, the devices may not be trimmed, in which case a single mask, such as that illustrated in FIG. 74, may be used. In other embodiments, more than two masks may be used to form more complex or different patterns.

Figure 77:
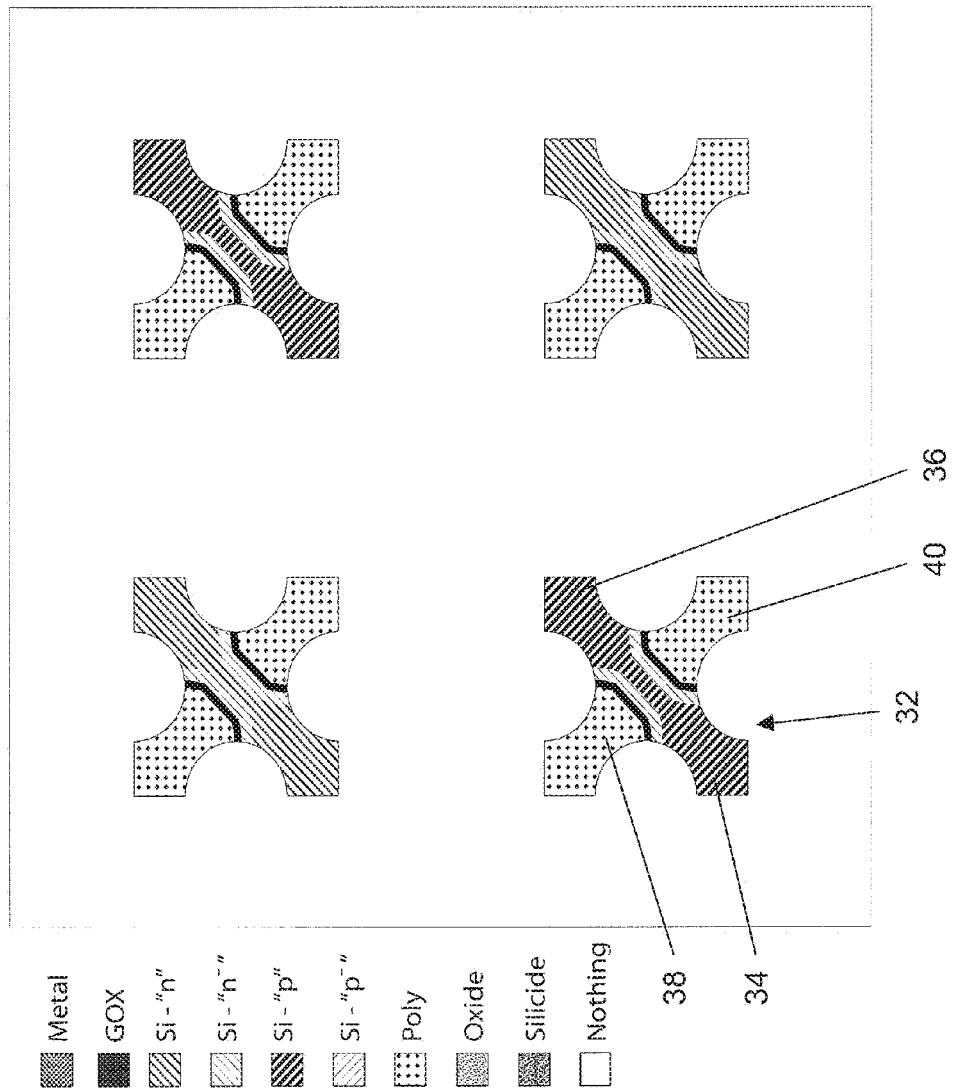

FIG. 77 illustrates the structure after etching. Shallow isolation trenches are now formed between the devices and the shape of the devices has been modified to a more desired form.

Figure 78:
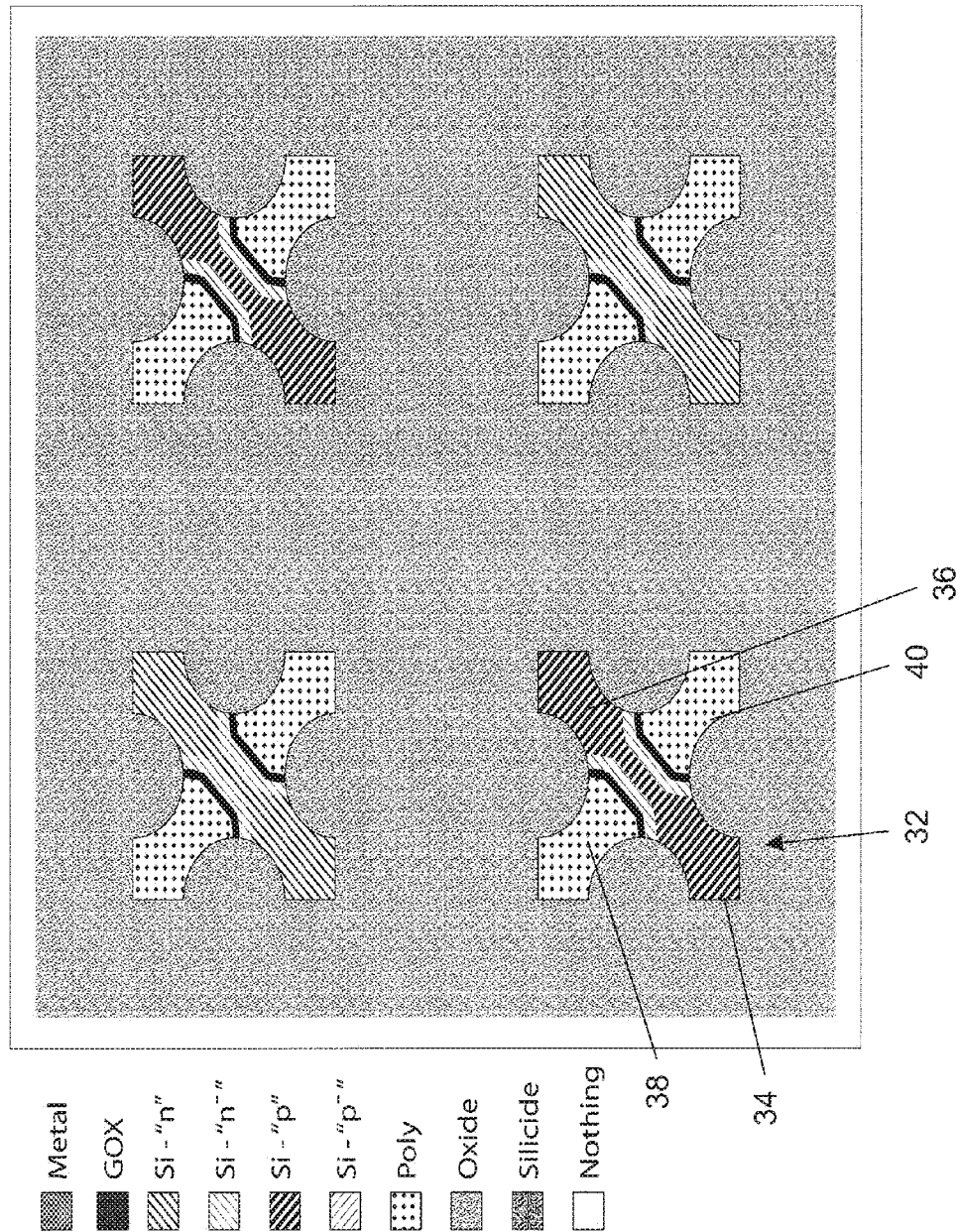

FIG. 78 illustrates a top view of the structure after further processing. High density plasma ("HDP") oxide is deposited on the structure, followed by a chemical-mechanical polish ("CMP"). The CMP, as mentioned above, may be used not only to remove excess HDP oxide and to provide a smooth surface on which to further process the structure, but may also be used to change the height of the semiconductor in order to affect its performance characteristics. After the CMP step, a further oxidation step may be performed.

Figure 79:
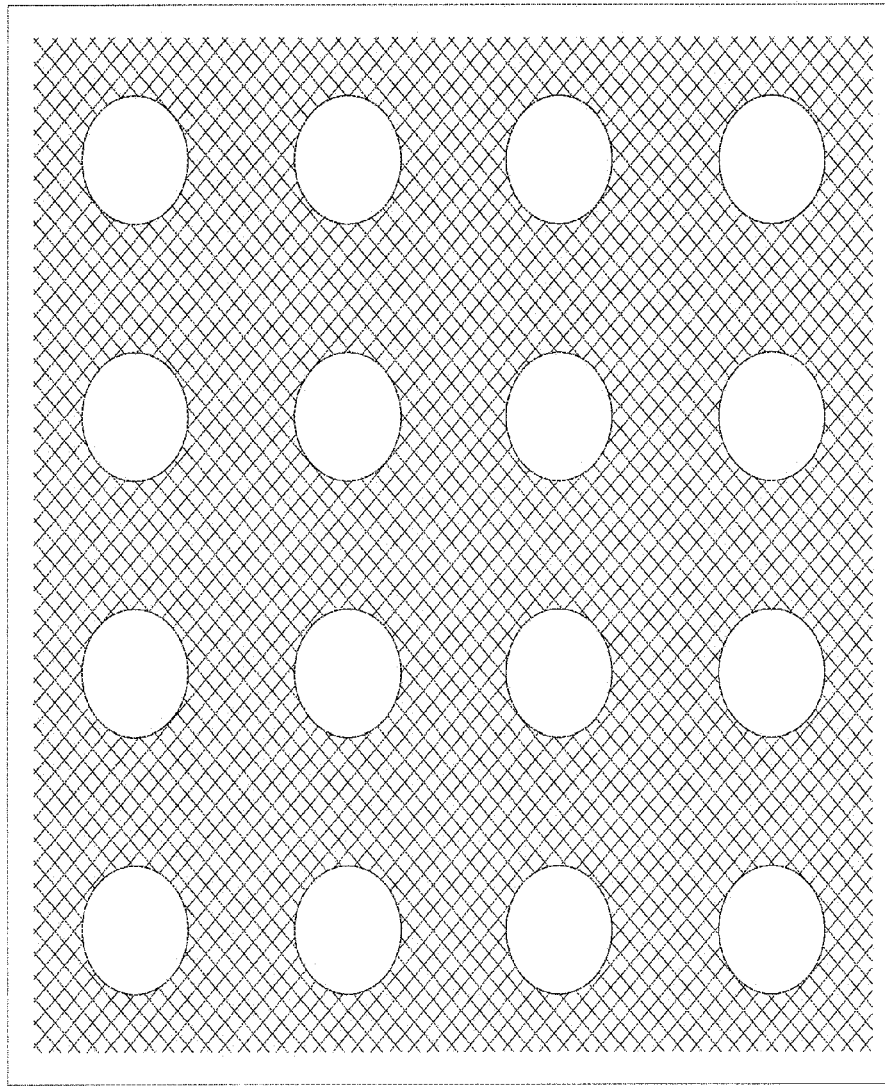

FIG. 79 illustrates a mask that can be used in the lithographic process to form contacts for the devices.

Figure 80:
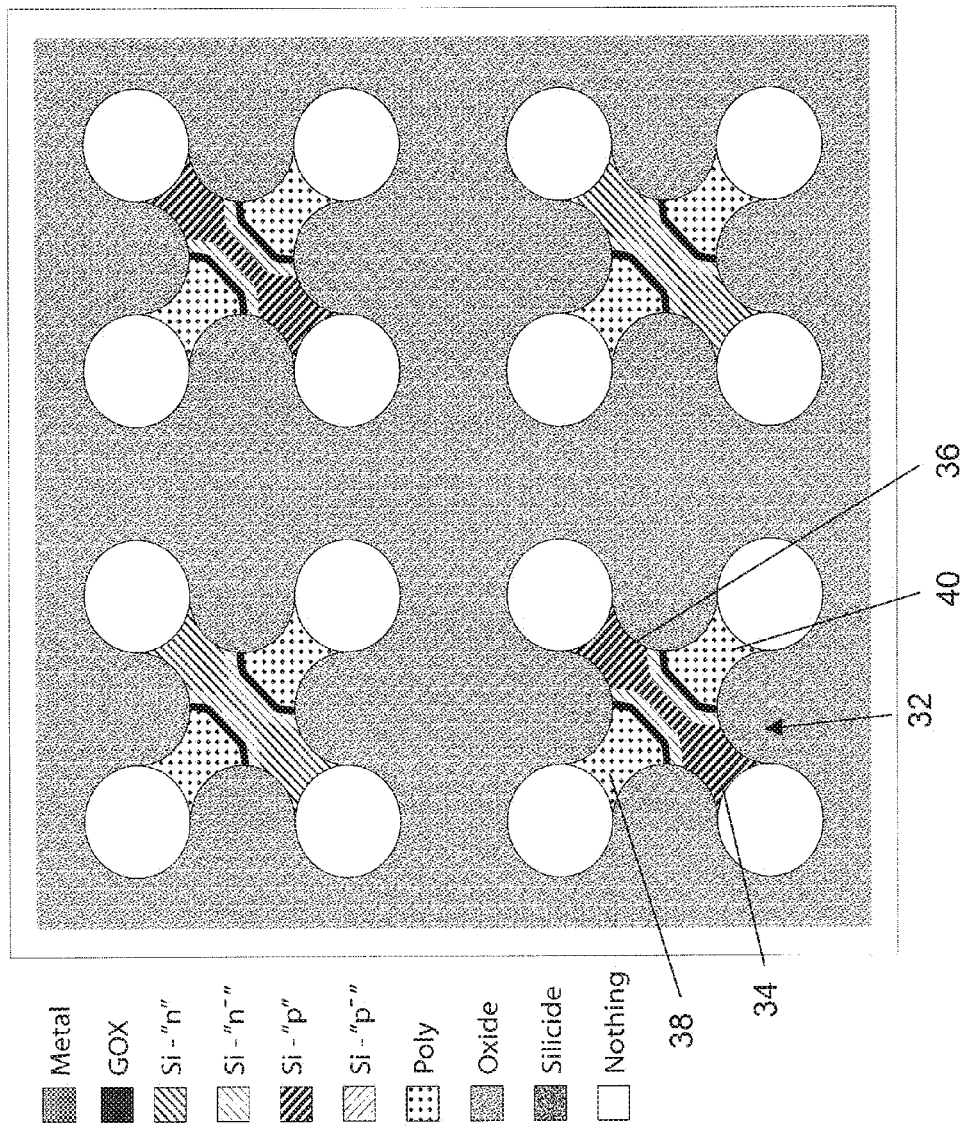

FIG. 80 illustrates a top view of the structure after the formation of openings for contacts for the devices. Using the mask illustrated in FIG. 79, a pattern of energy-sensitive material may formed on the structure and the exposed areas are etched to form openings for contacts. In this embodiment the contacts are pillar-shaped, although other shapes may also be used. Subsequent steps of silicide and barrier deposition are performed to prepare the openings for the contacts.

Figure 81:
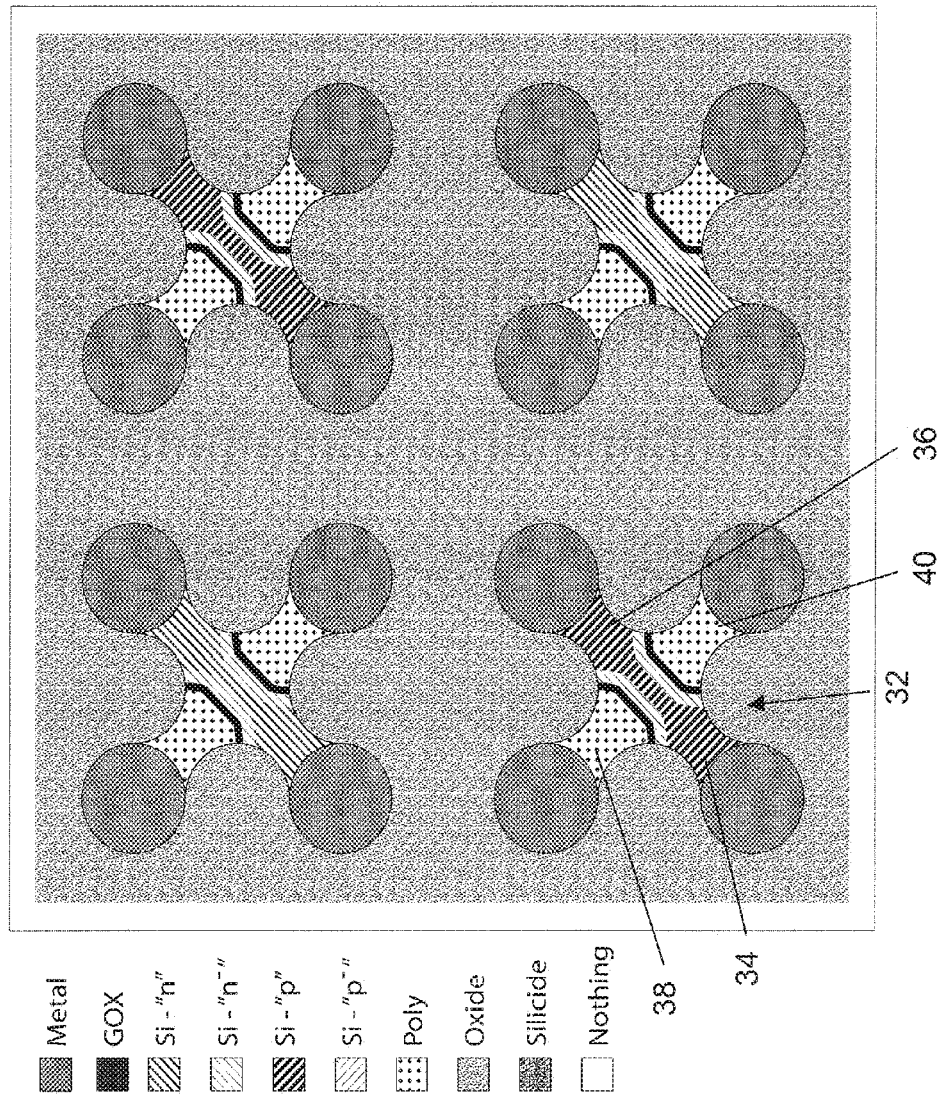

FIG. 81 illustrates a top view of the structure with contacts formed in the openings. The contacts may be formed, for example, with a chemical vapor deposition ("CVD") of tungsten. Thereafter a chemical-mechanical polish may be performed to provide a smooth surface for further processing. Thereafter, a barrier layer may be formed.

Figure 82:
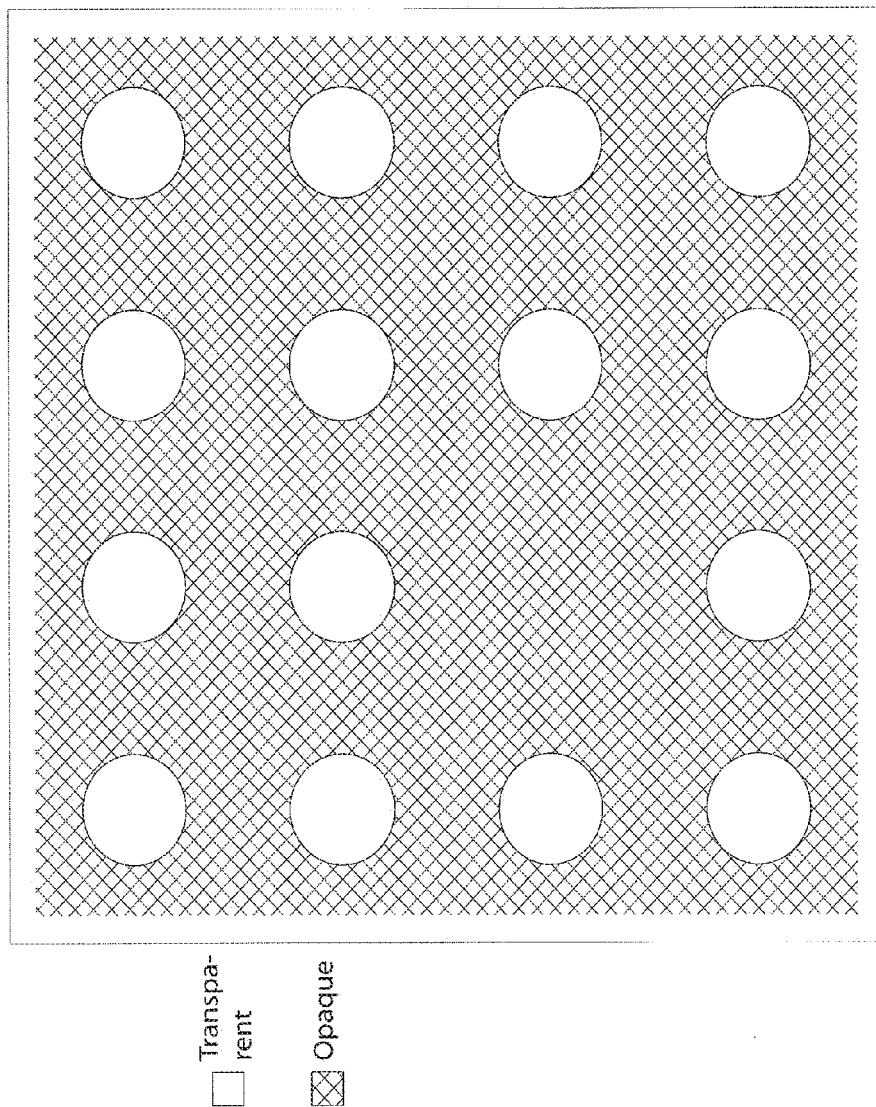

FIG. 82 illustrates a mask that is used to form contacts and interconnects.

Figure 83:
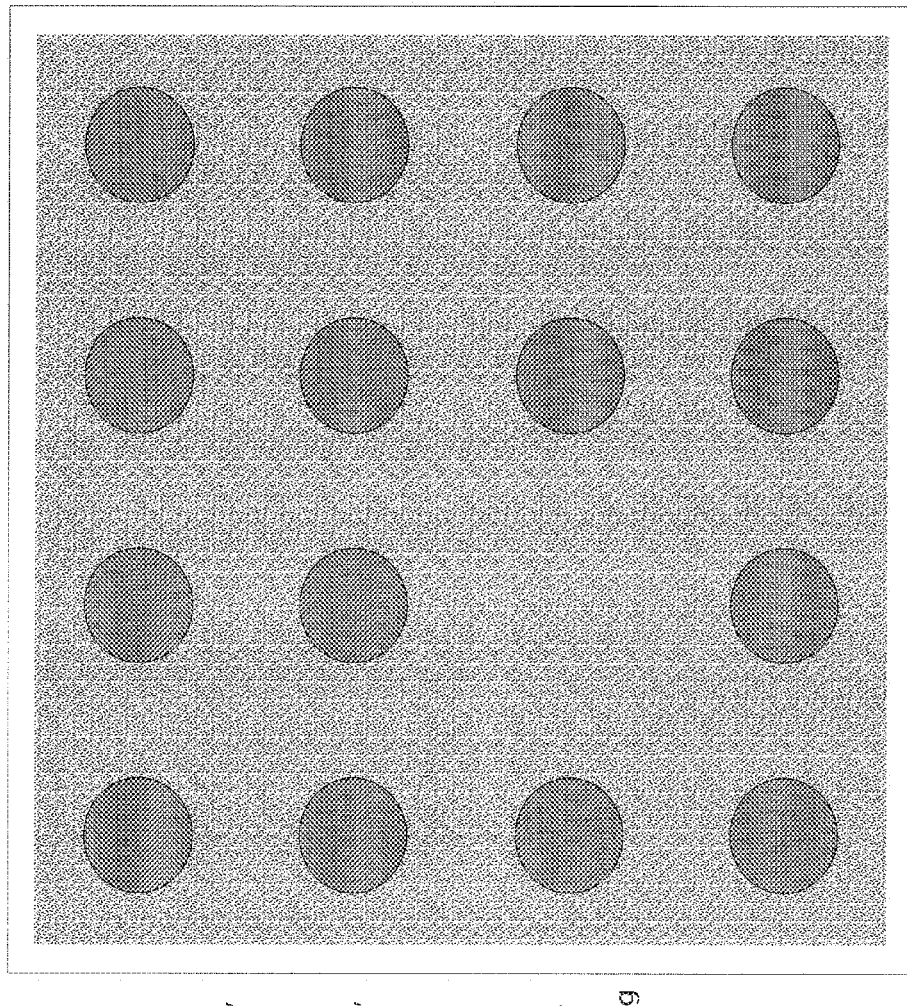

FIG. 83 illustrates a top view of the structure after the formation of openings for connection to the contacts of the devices. This is done by depositing an inter layer dielectric ("ILD"), depositing a barrier, and then depositing another ILD. Thereafter, the mask from FIG. 82 is used in a lithographic process to form a pattern in energy-sensitive material, and an etching process is used to etch the ILD, etch the barrier, and etch the other ILD. Thereafter, an opening is formed down to the contacts of the devices.

Figure 84:
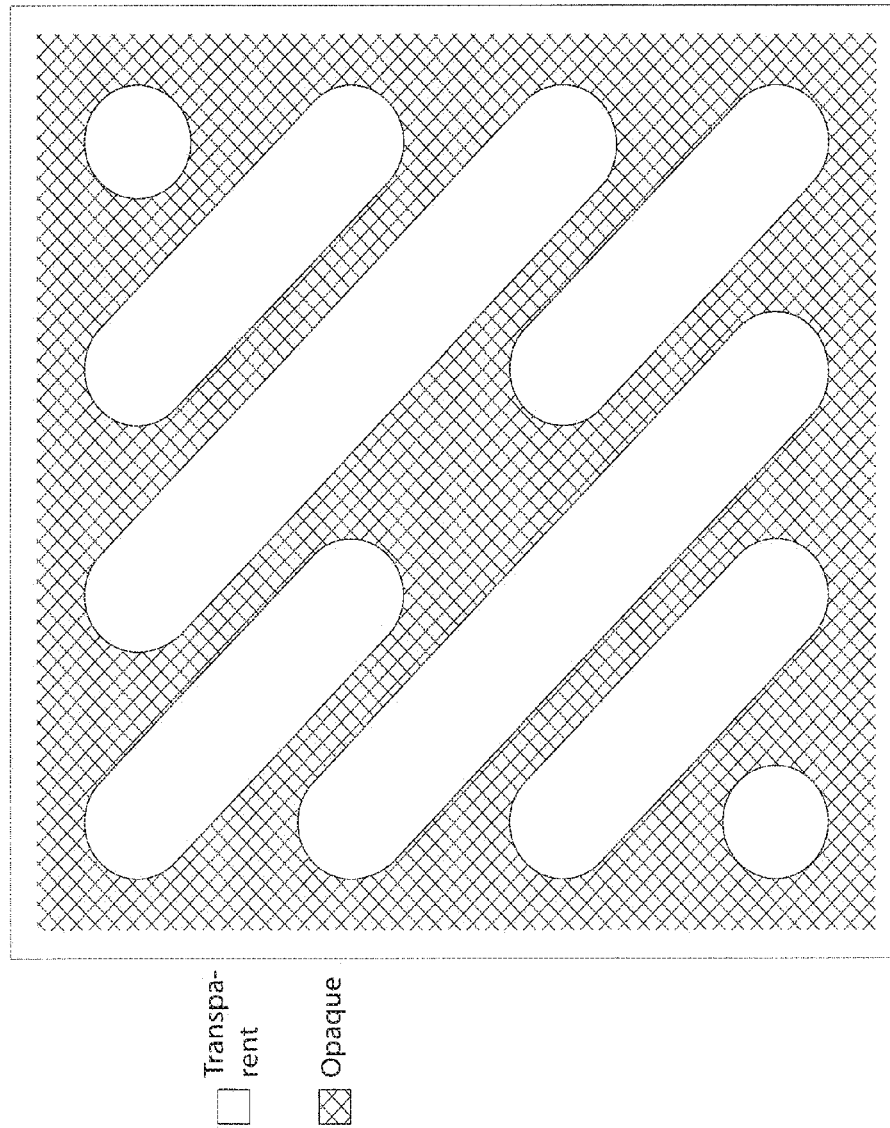

FIG. 84 illustrates a mask that is used to form local interconnects and other contacts with the devices. The particular choice of contacts and interconnects will vary with different applications. Those shown herein are illustrative and not limiting.

Figure 85:
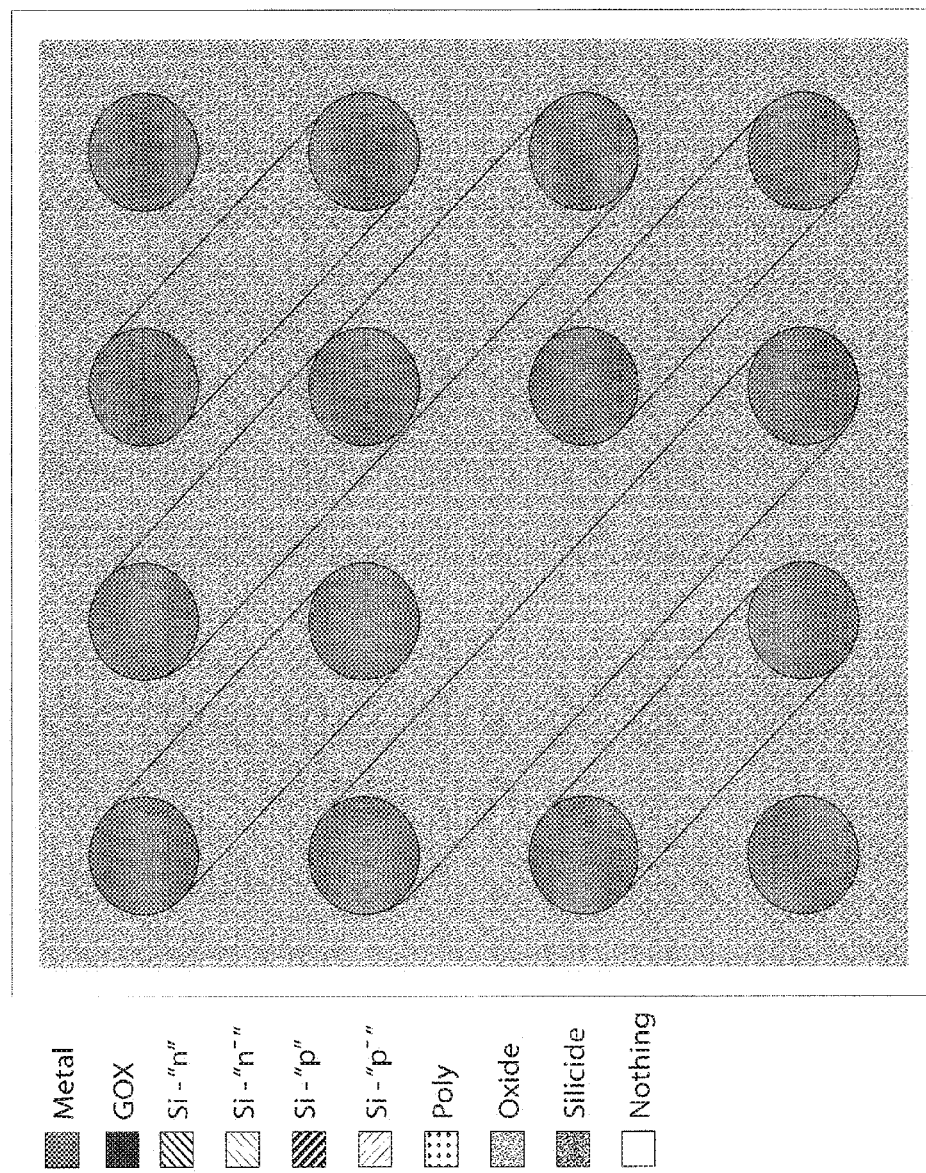
Figure 86:
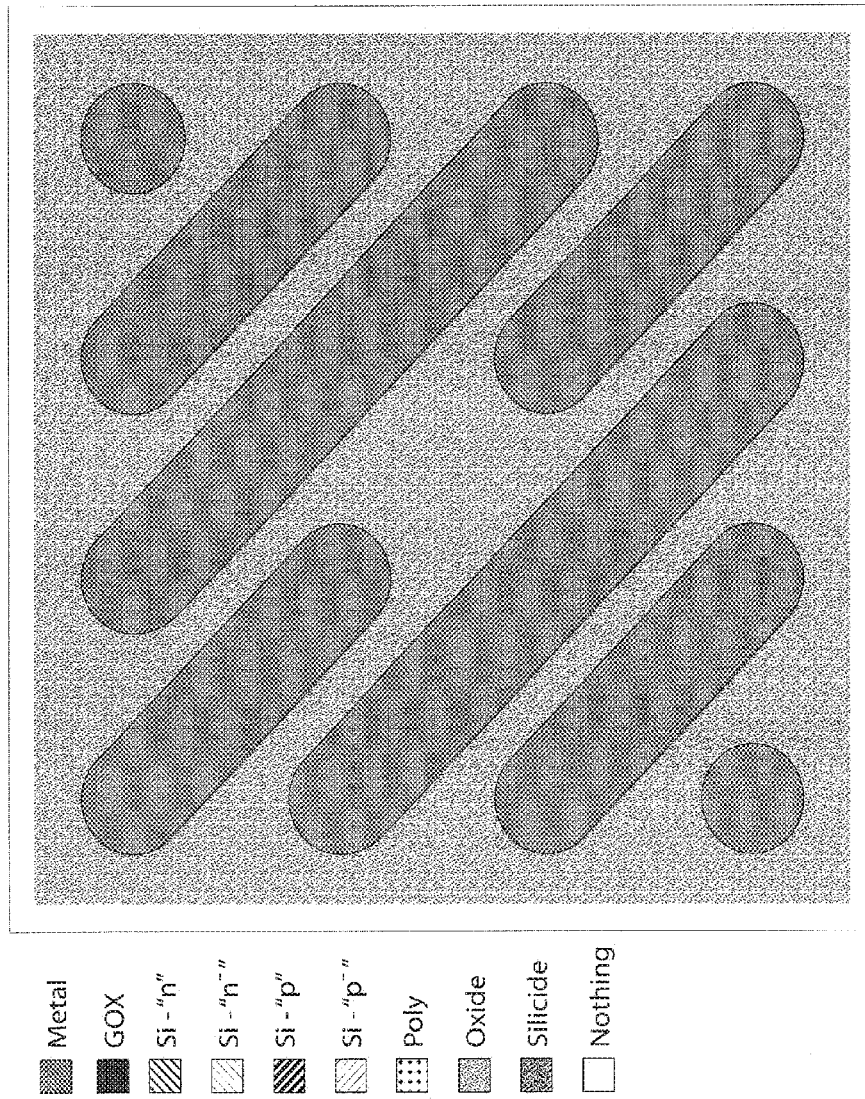

FIG. 86 illustrates a top view of the structure after the formation of openings for the contacts and interconnects. This may be formed, for example, with a lithographic process using the mask illustrated in FIG. 85. Thereafter, etching steps are used to etch the top ILD layer in the desired pattern. Then a barrier layer is formed, followed by the deposition of a metal layer in the openings and forming connections to the devices and between the devices. After the formation of the metal layer, a CMP may be performed to provide a smooth surface for further processing.

Additional metal layers may also be formed as needed. For example, the process steps described with reference to FIGS. 82-86 may be repeated one or more times to form successive layers of metal connections.

Although it is possible to practice the present invention using only metal connections on one side (e.g., the top of the structure), the present invention also includes structures and devices utilizing connections on more than one side. In this embodiment, the structure is turned upside down, or the processing equipment is rotated to the bottom of the structure, or the structure is otherwise processed from the "bottom" side. In this case, "bottom" is used to identify a different side from the "top" side described above. In some embodiments the top side can be oriented on the bottom or the top and bottom sides can both be on the "side". These terms are used to aid in the understanding of the invention and they are not limiting.

Figure 87:
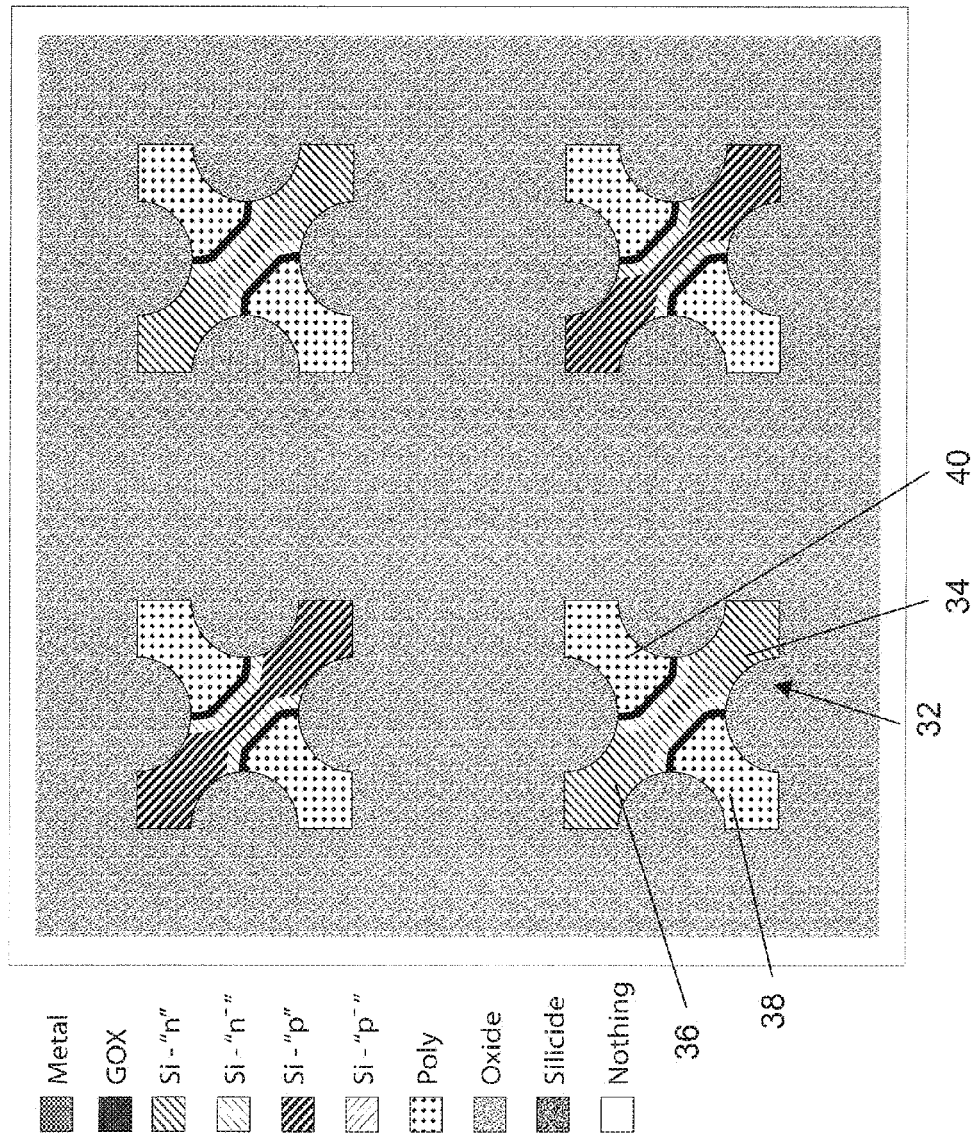

FIG. 87 illustrates a bottom view of the structure according to the present invention. The structure of the present invention is exposed, and this may be accomplished with, for example, a CMP or a combination of an etch and a CMP. Processing of the bottom of the structure may be accomplished by, for example, forming a "cupping" oxide on the top surface and attaching a top substrate or other structure to the top. Thereafter, the bottom may be processed, including the CMP and/or etch of the bottom to expose the structure.

After exposing some or all of the structure, an inter layer dielectric ("ILD") layer is formed, such as by a deposition process. Thereafter, a barrier layer is formed, such as by deposition, and another ILD layer is formed.

Figure 88:
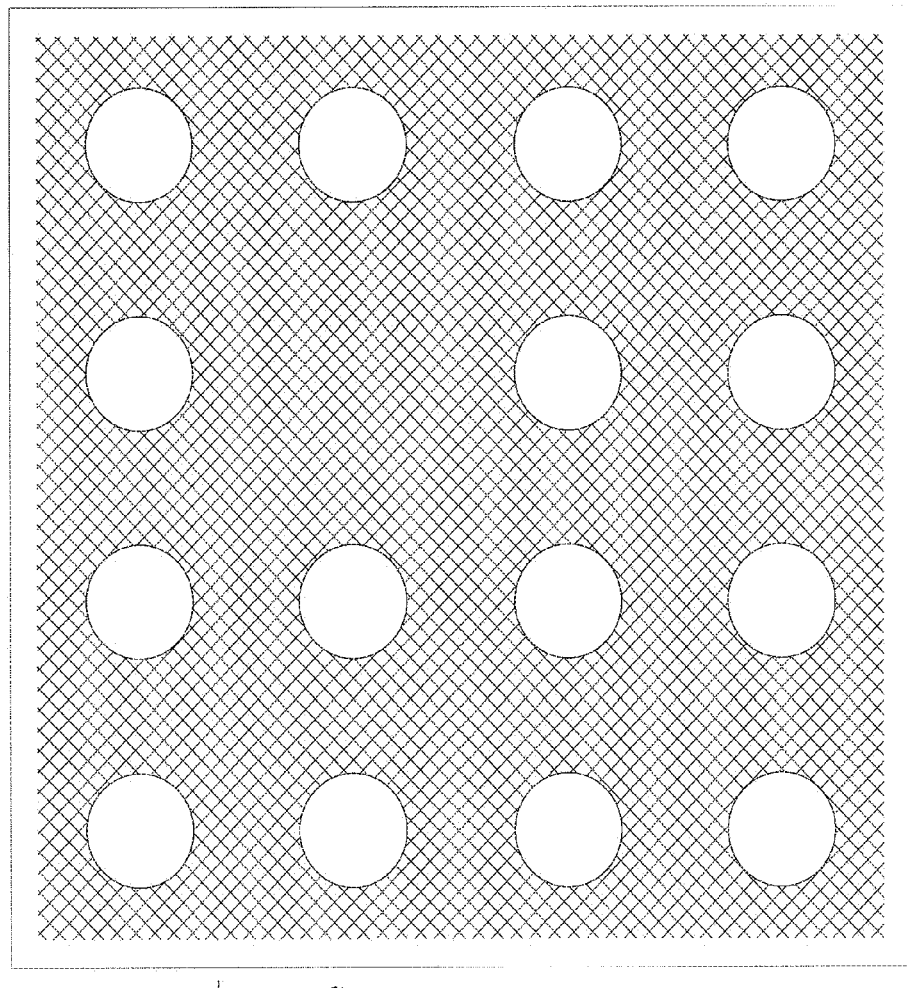

FIG. 88 illustrates a mask that is used to form contacts and interconnects.

Figure 89:
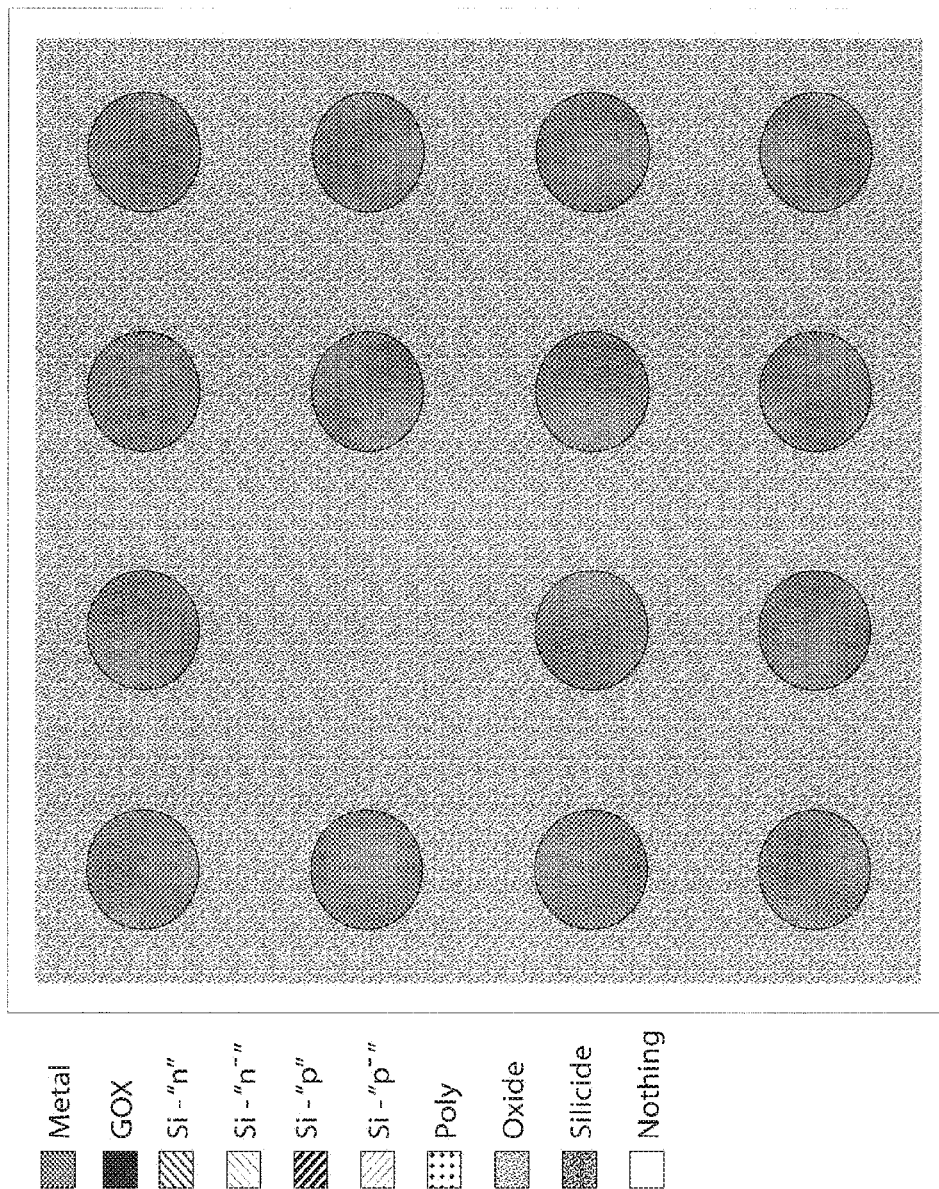

FIG. 89 illustrates a bottom view of the structure after the formation of openings for connection to the contacts of the devices. This is done by depositing an inter layer dielectric ("ILD"), depositing a barrier, and then depositing another ILD. Thereafter, the mask from FIG. 88 is used in a lithographic process to form a pattern in energy-sensitive material, and an etching process is used to etch the ILD, etch the barrier, and etch the other ILD. Thereafter, an opening is formed down to the contacts of the devices.

Figure 90:
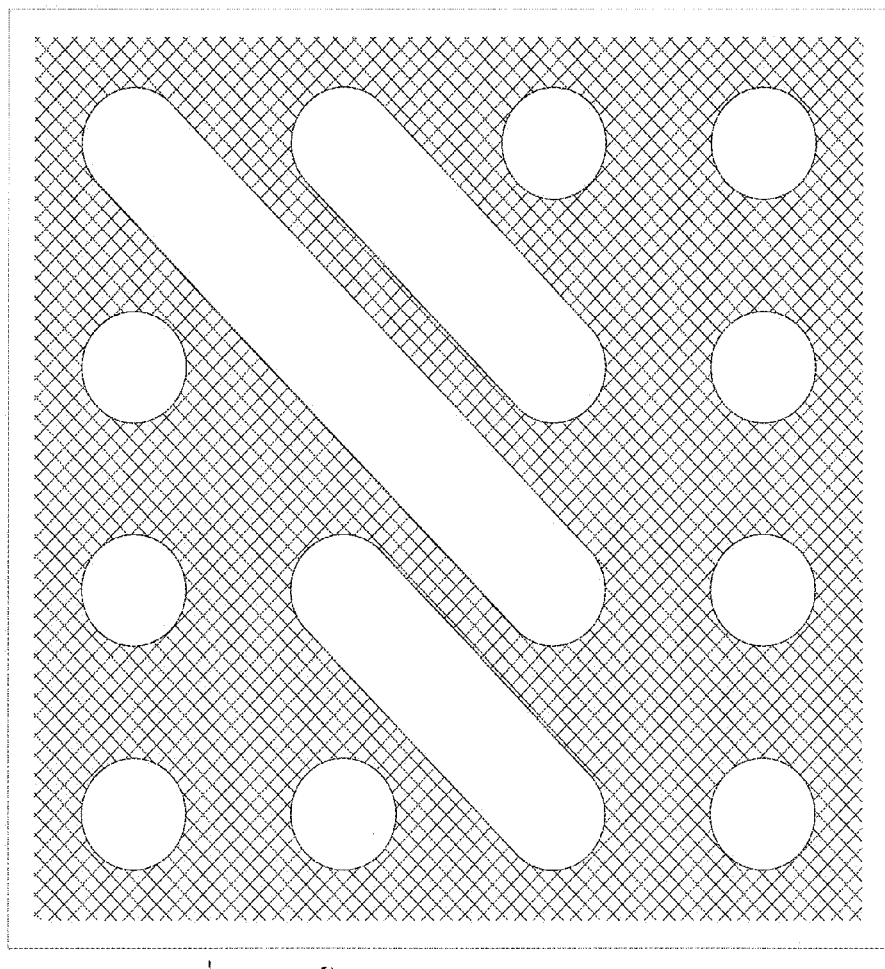

FIG. 90 illustrates a mask that is used to form local interconnects and other contacts on the bottom side of the devices. The particular choice of contacts and interconnects will vary with different applications. Those shown herein are illustrative and not limiting.

Figure 91:
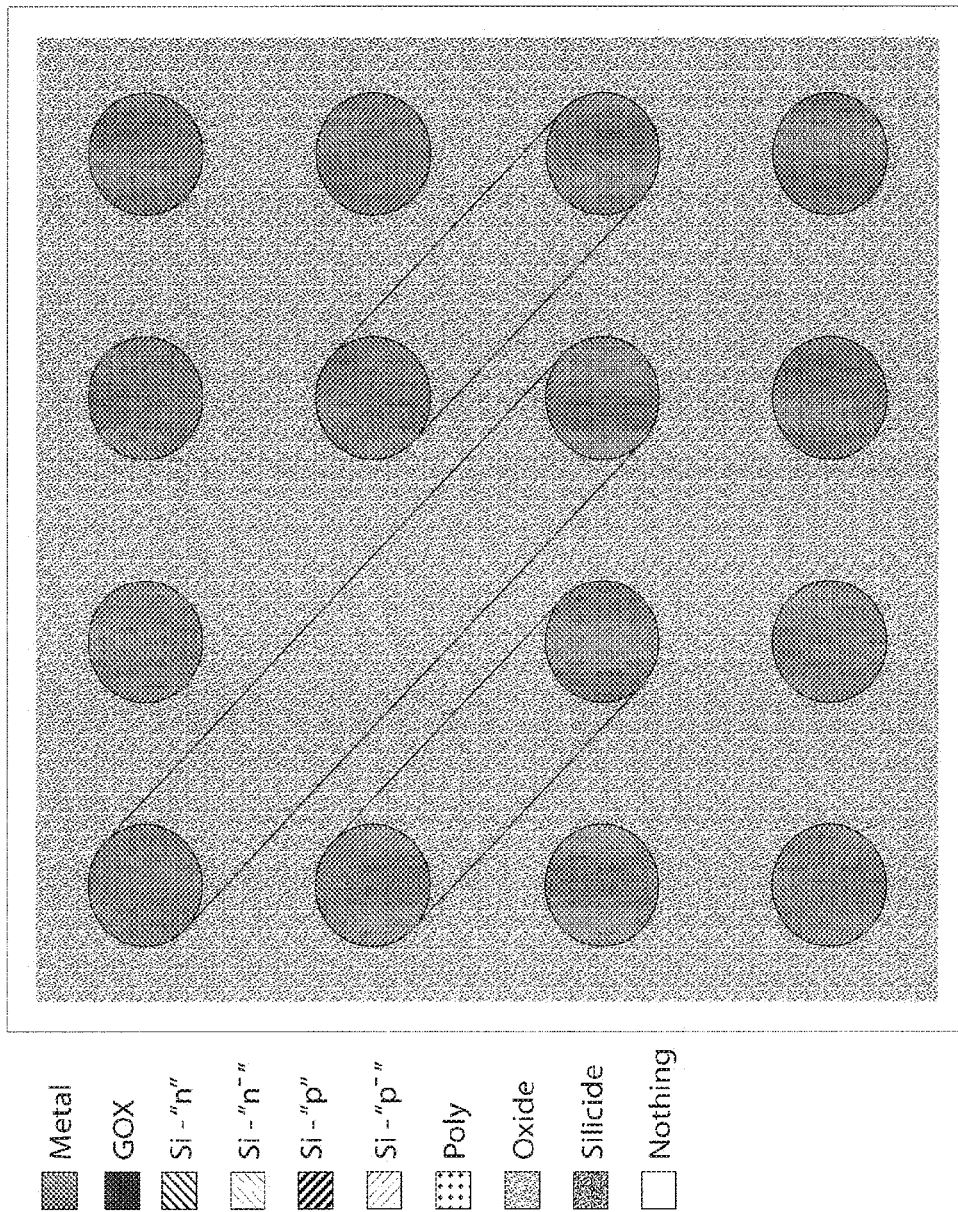
Figure 92:
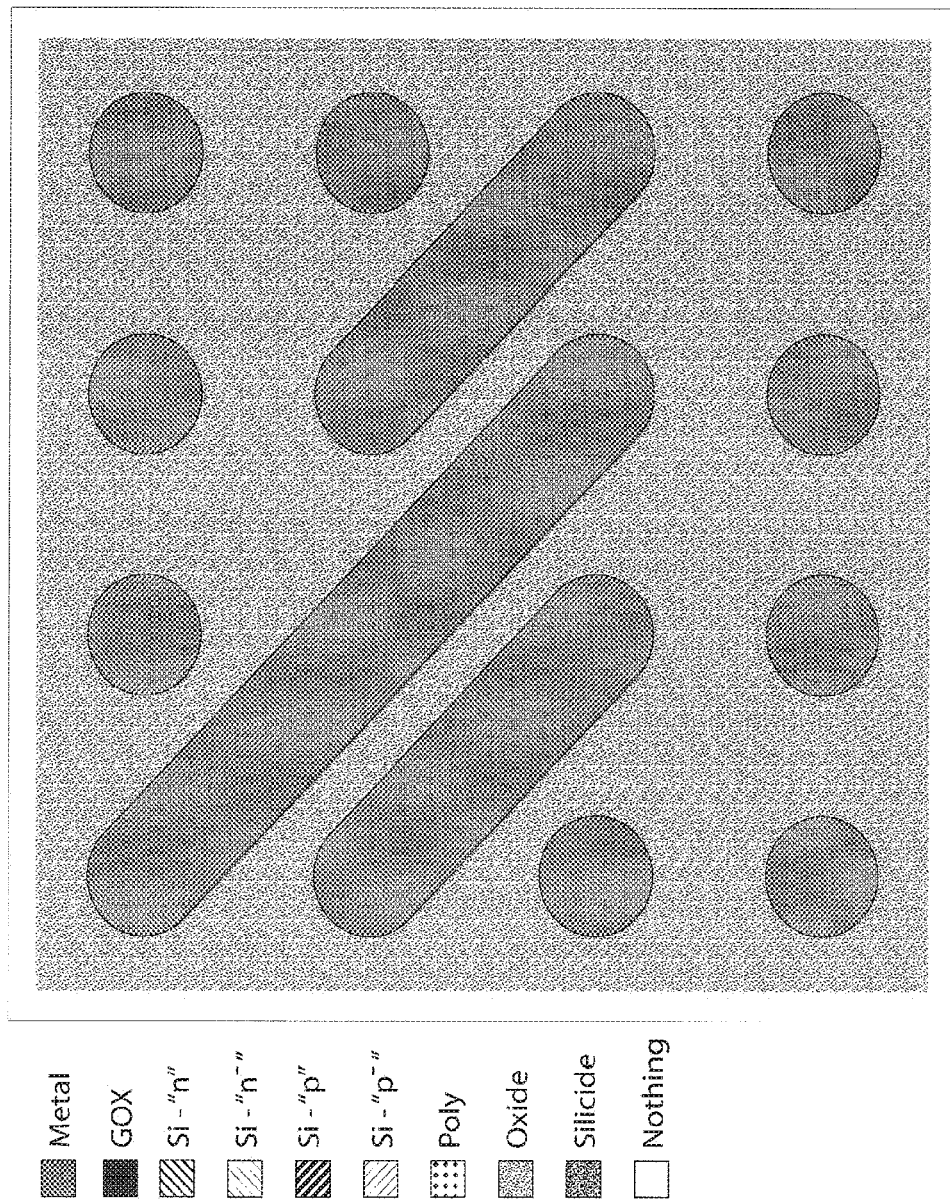

FIG. 91 illustrates a bottom view of the structure after the formation of openings for the contacts and interconnects. This may be formed, for example, with a lithographic process using the mask illustrated in FIG. 90. Thereafter, etching steps are used to etch the ILD layer in the desired pattern. Then a barrier layer is formed, followed by the deposition of a metal layer in the openings and forming connections to the devices and between the devices, as illustrated in FIG. 92. After the formation of the metal layer, a CMP may be performed to provide a smooth surface for further processing. The pattern illustrated in FIGS. 91 and 92 are different than the mask illustrated in FIG. 90 because FIGS. 91 and 92 are bottom views of the structure.

Additional metal layers may also be formed as needed. For example, the process steps described with reference to FIGS. 88-92 may be repeated one or more times to form successive layers of metal connections. Furthermore, two or more device layers may be stacked on top of each other.

Figure 93:
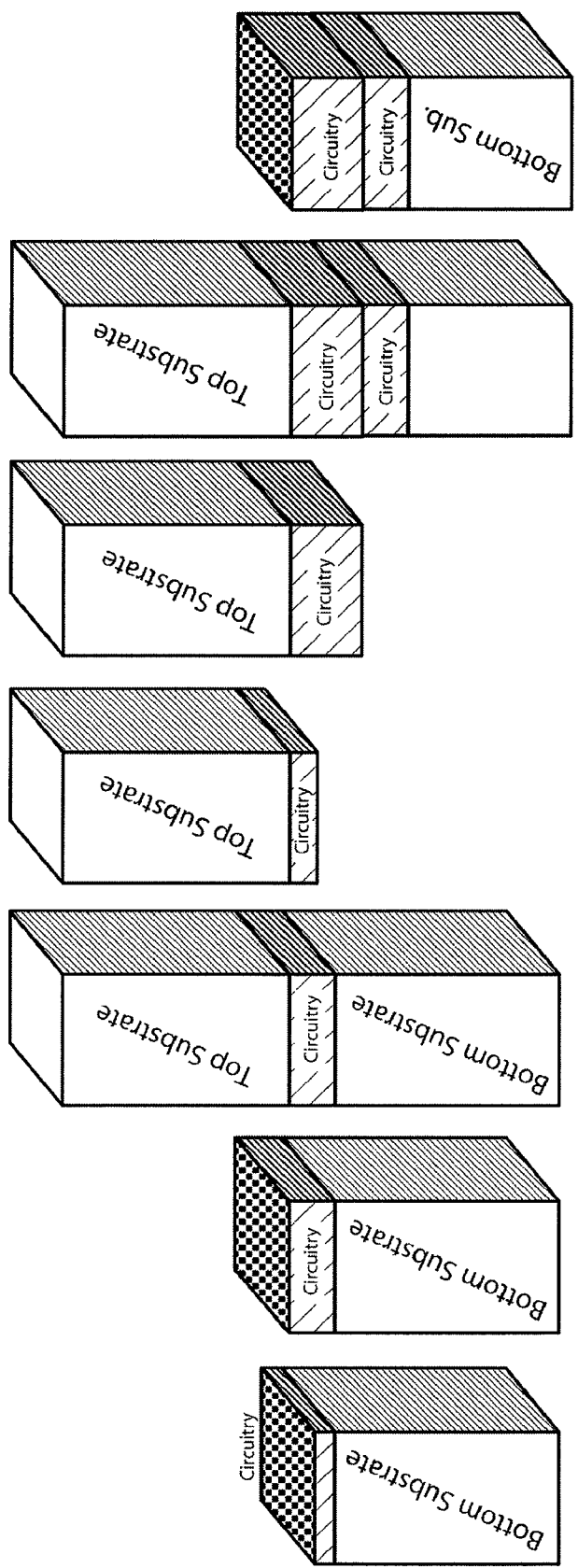
FIG. 93 illustrates a cross-sectional representation of a structure in various stages of fabrication according to one embodiment of the present invention.

FIG. 93 illustrates one embodiment of the fabrication process of the present invention. The far left illustrates circuitry being formed on top of a "bottom substrate". The next image illustrates the circuitry being further built, such as through the formation of one or more interconnect layers. The next image illustrates the formation or connection of a "top substrate" to facilitate processing of the bottom. The next image illustrates the bottom substrate removed so that the bottom may be processed. That image also illustrates the "circuitry" being reduced in thickness. This may be done, for example, to provide a particular thickness in order to achieve desired characteristics of the devices. Alternatively, the circuitry may be reduced in thickness as a precaution to ensure that the devices are properly exposed for further processing on the bottom. The next image illustrates the circuitry being further built, such as through the formation of one or more interconnect layers.

The next image illustrates a new bottom substrate and another layer of circuitry attached to the first layer. This additional circuitry layer may be built onto the first layer of circuitry, or it may be fabricated in another location and attached to the first layer of circuitry. Although two layers of circuitry are shown, more than two layers may be attached. Furthermore, the layers may be interconnected to each other, or one or more layers of circuitry may not be connected to the others. For example, one or more layer of circuitry may have external connections, such as on one or more sides of the layer of circuitry, or connections may be formed at the top or the bottom of the structure.

The final image illustrates the top substrate removed. This may be done, for example, for further processing or to attached or form additional layers of circuitry. Alternatively, the top substrate may be removed to facilitate connection from the devices.

Figure 94:
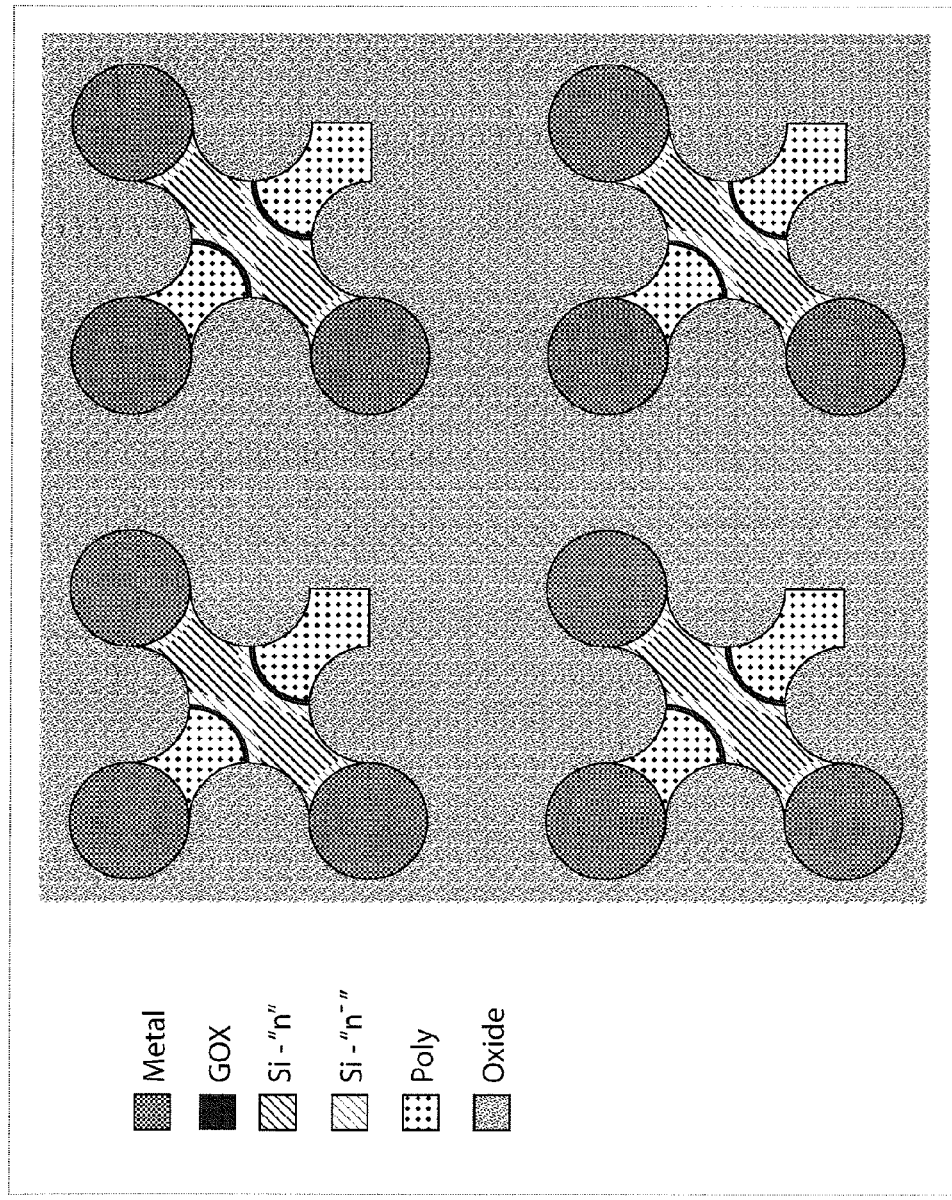
FIG. 94 illustrates one embodiment of the present invention in the form of a memory device.

FIG. 94 illustrates another embodiment of the present invention in which four devices are illustrated. These devices are similar to those illustrated in FIG. 81, except that each device has only three contacts and one of the gates is "floating" and may be used, for example, as a charge storage node. Accordingly, these devices may be used, for example, as memory devices such as flash memory. These devices may be fabricated in an analogous manner to those illustrated in FIG. 81 except that the process steps are modified to not form the "missing" contacts on the floating gates.

There are several aspects of the present invention which can provide significant control and variation in the devices fabricated according to the present invention.

One example is the thickness of the silicon layer. By "thickness" it is meant the dimension of the device into and out of the page from the perspective illustrated in FIG. 4. This thickness can be adjusted in several ways to control the operating characteristics of the device. For example, the thickness of the silicon layer may be reduced, such as through chemical-mechanical polishing ("CMP") or other processes. In addition, subsequent CMP or similar processes performed at other parts of the fabrication process may also be used to provide for the desired thickness.

In addition, the width of the channel between the gates (i.e., the spacing between the gates) in the transistors formed according to the present invention will generally affect the characteristics of those devices. For example, the ability of the device to control current, and the response time in which current can be turned on and off will depend on the spacing between gates. This spacing can also affect the resolution of memory devices fabricated according to the present invention. The process described with reference to FIG. 49 can be used to form precise channel widths.

Another feature that allows for significant variation in the characteristics in devices according to the present invention is the out-diffusion of dopants (e.g., phosphorous and boron) into the current channel, such as described with reference to FIG. 71. The density of the dopants and the extent to which they diffuse into the channel can be controlled in order to provide for desirable characteristics.

Although the control of certain features can allow for great flexibility in the performance and characteristics of the device, some other dimensions are less significant and allow for looser tolerances, less expensive fabrication processes, and higher yields. For example, features and dimensions of the transistors away from the channel width and "thickness" of the device often do not have a significant affect on performance and, therefore, tolerances can be relaxed for those aspects of the fabrication process.

Although the present invention has generally been described in terms of integrated circuits, integrated circuit fabrication, and SOI structures, the present invention is applicable to other devices, technologies, forms of fabrication, and processes. For example, the present invention is also applicable to technologies and processes related to micro-electro-mechanical systems, liquid crystal display, and other non-semiconductor and non-integrated circuit applications. Furthermore, the examples provided herein are illustrative and not limiting, and other variations and modifications of the present invention are contemplated, such as by using different processing steps and materials. For example, the present invention was often described in the context of using positive photoresist materials, although the present invention may also be used with negative photoresist materials and other materials, and different or modified processing steps may be used to achieve the same or different results. In addition, although the present invention has generally been described in the context of using two gates, the present invention may be used with only one gate or with more than two gates. In some embodiments, the present invention may include no gates, such as when used as a non-adjustable resistive element. In addition, the present invention has been described in terms of using barrier layers in conjunction with conductors. This process is often used when copper is used for conductors. In other embodiments of the invention, such as those using aluminum for conductors, the barrier layer may not be used. Furthermore, the features of the invention may be combined and varied, even if those combinations and variations are not specifically disclosed herein. Those and other variations and modifications of the present invention are within the spirit and scope of the present invention, and it is intended that the foregoing specification and the following claims cover such modifications and variations.

The invention claimed is:

1. A device defined in a semiconductor layer having a top surface, a bottom surface and a width therebetween, said device comprising:
   a semiconductor portion defining a first end, a second end, and a semiconductor slit portion between said first end and said second end, wherein said first end, said second end and said slit portion each define side walls on opposite sides of said first end, said second end and said slit portion, and further wherein said first end defines an end wall between said side walls of said first end and said second end defines an end wall between said side walls of said second end, wherein the cross sectional shape of said side walls and said end walls in a plane parallel to said top and bottom surfaces is an arc;
   a first gate connected to said semiconductor portion at one side wall of said slit portion, said first gate defining side walls on opposite sides thereof, a connecting wall where said first gate portion connects to said semiconductor portion, and a contact wall opposite said connecting wall, wherein the cross-sectional shape of said side walls, said connecting wall and said contact wall of said first gate in a plane parallel to said top and bottom surfaces is an arc;

a second gate connected to said semiconductor portion at a side wall of said slit portion opposite said first gate, said second gate defining side walls on opposite sides thereof, a connecting wall where said second gate connects to said semiconductor portion, and a contact wall opposite said connecting wall, wherein the cross-sectional shape of said side walls, said connecting wall and said contact wall of said second gate in a plane parallel to said top and bottom surfaces of said device is an arc;

a first contact connected to said end wall of said first end of said semiconductor portion, said first contact having an outer wall, wherein the cross sectional shape of said outer wall of said first contact in a plane parallel to said top and bottom surfaces is a circle; and a second contact connected to said end wall of said second end of said semiconductor portion, said second contact having an outer wall, wherein the cross sectional shape of said outer wall of said second contact in a plane parallel to said top and bottom surfaces is a circle;

wherein all walls of said semiconductor portion, said first gate, said second gate and said outer walls of said first and second contacts extend from said top surface to said bottom surface.

2. The device of claim 1 wherein said first and second gates are composed of a different material than said semiconductor portion.

3. The device of claim 2 further comprising:

a third contact connected to said first gate at said contact wall opposite said connecting wall of said first gate, said third contact having an outer wall wherein the cross sectional shape of said outer wall of said third contact in a plane parallel to said top and bottom surfaces is a circle; and a fourth contact connected to said second gate at said contact wall opposite said connecting wall of said second gate, said fourth contact having an outer wall, wherein the cross sectional shape of said outer wall of said fourth contact in a plane parallel to said top and bottom surfaces is a circle;

wherein said outer walls of said third and fourth contacts extend from said top surface to said bottom surface.

4. The device of claim 3 wherein said first, second third and fourth contacts are selected from a group consisting of:

a surface contact; and a punch through contact.

5. The semiconductor device of claim 3 wherein said outer walls of said first, second third and fourth contacts extend above said top surface and below said bottom surface.

6. The semiconductor device of claim 5, further comprising:

a top interconnect connected to the at least one of said contacts at said top surface; and a bottom interconnect connected to the at least one of said contacts at said bottom surface.

7. The device of claim 3 wherein said third and fourth contacts are cylindrical in shape.

8. The device of claim 3 wherein said side and end walls of said first end, said side and end walls of said second end and said side walls of said slit portion, said side walls, said connecting wall and said contact wall of said first gate, said side walls, said connecting wall and said contact wall of said second gate and said outer walls of said first, second, third and fourth contacts have radii of the same length.

9. The semiconductor device of claim 1, wherein:

said semiconductor portion is single crystal silicon; and said first gate and said second gate are composed of layers of polysilicon.

10. The device of claim 1 wherein said first and second contacts are cylindrical in shape.

11. The device of claim 1 further comprising a dialectric layer positioned between said slit portion and said first gate and between said slit portion and said second gate.

12. The device of claim 11 wherein said dialectric layer is composed of silicon dioxide.

13. The device of claim 1 wherein said slit portion has a resistance that is controlled by said first and second gates and further wherein said first end and said second end of said semiconductor portion have a resistance that is higher than the resistance of said slit portion.

14. A device defined in a semiconductor layer having a top surface, a bottom surface and a width therebetween, said device comprising:

a semiconductor portion defining a first end, a second end, and a semiconductor slit portion between said first end and said second end, wherein said first end, said second end and said slit portion each define side walls on opposite sides of said first end, said second end and said slit portion, and further wherein said first end defines an end wall between said side walls of said first end and said second end defines an end wall between said side walls of said second end, wherein the shape of said side walls and said end walls conform to a portion of the outer wall of a cylinder extending between said top surface and said bottom surface;

a first gate connected to said semiconductor portion at one side wall of said slit portion, said first gate defining side walls on opposite sides thereof, a connecting wall where said first gate portion connects to said semiconductor portion, and a contact wall opposite said connecting wall, wherein the shape of said side walls, said connecting wall and said contact wall of said first gate conform to a portion of the outer wall of a cylinder extending between said top surface and said bottom surface;

a second gate connected to said semiconductor portion at a side wall of said slit portion opposite said first gate, said second gate defining side walls on opposite sides thereof, a connecting wall where said second gate connects to said semiconductor portion, and a contact wall opposite said connecting wall, wherein the shape of said side walls, said connecting wall and said contact wall of said second gate conform to a portion of the outer wall of a cylinder extending between said top surface and said bottom surface;

a first contact connected to said end wall of said first end of said semiconductor portion, said first contact having an outer, wherein the shape of said outer wall of said first contact conforms to the outer wall of a cylinder extending between said top surface and said bottom surface; and a second contact connected to said end wall of said second end of said semiconductor portion, said second contact having an outer wall, wherein the shape of said outer wall of said second contact conforms to the outer wall of a cylinder extending between said top surface and said bottom surface;

wherein all walls of said semiconductor portion, said first gate, said second gate and said outer walls of said first and second contacts extend from said top surface to said bottom surface.

* * * * *